US010839883B2

(12) United States Patent
Kimura et al.

(10) Patent No.: US 10,839,883 B2
(45) Date of Patent: Nov. 17, 2020

(54) SEMICONDUCTOR DEVICE AND ELECTRONIC DEVICE

(71) Applicant: Semiconductor Energy Laboratory Co., Ltd., Atsugi (JP)

(72) Inventors: Hajime Kimura, Kanagawa (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/699,899

(22) Filed: Dec. 2, 2019

(65) Prior Publication Data

US 2020/0105330 A1 Apr. 2, 2020

Related U.S. Application Data

(63) Continuation of application No. 16/017,539, filed on Jun. 25, 2018, now Pat. No. 10,600,469.

(30) Foreign Application Priority Data

Jun. 26, 2017 (JP) ................................ 2017-124314

(51) Int. Cl.
*G11C 11/40* (2006.01)
*H01L 49/02* (2006.01)
(Continued)

(52) U.S. Cl.
CPC .......... *G11C 11/40* (2013.01); *G11C 16/3418* (2013.01); *H01L 27/1052* (2013.01); *H01L 27/1207* (2013.01); *H01L 27/1225* (2013.01); *H01L 28/60* (2013.01); *H01L 29/66969* (2013.01); *H01L 29/7869* (2013.01); *G11C 16/0483* (2013.01); *G11C 16/06* (2013.01); (Continued)

(58) Field of Classification Search
CPC . G11C 11/40; G11C 16/3418; H01L 27/1052; H01L 27/1207; H01L 27/1225; H01L 28/60
USPC .................................. 365/149, 189.04, 191
See application file for complete search history.

(56) References Cited

U.S. PATENT DOCUMENTS 8,902,663 B1 12/2014 Or-Bach et al.
9,117,749 B1 8/2015 Or-Bach et al.
(Continued)

FOREIGN PATENT DOCUMENTS

JP 2008-258458 A 10/2008

*Primary Examiner* — Connie C Yoha
(74) *Attorney, Agent, or Firm* — Fish & Richardson P.C.

(57) ABSTRACT

An object is to shorten the time for rewriting data in memory cells. A memory module includes a first memory cell, a second memory cell, a selection transistor, and a wiring WBL1. The first memory cell includes a first memory node. The second memory cell includes a second memory node. One end of the first memory cell is electrically connected to the wiring WBL1 through the selection transistor. The other end of the first memory cell is electrically connected to one end of the second memory cell. The other end of the second memory cell is electrically connected to the wiring WBL1. When the selection transistor is on, data in the first memory node is rewritten by a signal supplied through the selection transistor to the wiring WBL1. When the selection transistor is off, data in the first memory node is rewritten by a signal supplied through the second memory node to the wiring WBL1.

27 Claims, 33 Drawing Sheets

(51) Int. Cl.
    *H01L 29/66* (2006.01)
    *H01L 27/105* (2006.01)
    *H01L 29/786* (2006.01)
    *G11C 16/34* (2006.01)
    *H01L 27/12* (2006.01)
    *H01L 21/443* (2006.01)
    *H01L 27/06* (2006.01)
    *H01L 21/027* (2006.01)
    *H01L 21/4763* (2006.01)
    *H01L 29/78* (2006.01)
    *H01L 21/02* (2006.01)
    *G11C 16/08* (2006.01)
    *G11C 16/04* (2006.01)
    *G11C 16/10* (2006.01)
    *G11C 16/32* (2006.01)
    *H01L 27/11556* (2017.01)
    *G11C 16/24* (2006.01)
    *G11C 16/12* (2006.01)
    *G11C 16/26* (2006.01)
    *G11C 16/06* (2006.01)
    *G11C 16/28* (2006.01)

(52) U.S. Cl.
    CPC ............ *G11C 16/08* (2013.01); *G11C 16/10* (2013.01); *G11C 16/12* (2013.01); *G11C 16/24* (2013.01); *G11C 16/26* (2013.01); *G11C 16/28* (2013.01); *G11C 16/32* (2013.01); *H01L 21/0228* (2013.01); *H01L 21/0262* (2013.01); *H01L 21/0273* (2013.01); *H01L 21/02164* (2013.01); *H01L 21/02178* (2013.01); *H01L 21/02181* (2013.01); *H01L 21/02205* (2013.01); *H01L 21/02211* (2013.01); *H01L 21/02565* (2013.01); *H01L 21/443* (2013.01); *H01L 21/47635* (2013.01); *H01L 27/0688* (2013.01); *H01L 27/11556* (2013.01); *H01L 29/7851* (2013.01)

(56) References Cited

U.S. PATENT DOCUMENTS

| | | |
|---|---|---|
| 2004/0095364 A1 | 5/2004 | Koyama et al. |
| 2007/0133358 A1 | 6/2007 | Kubo et al. |
| 2008/0149913 A1 | 6/2008 | Tanaka et al. |
| 2008/0239799 A1 | 10/2008 | Watanabe |
| 2009/0027955 A1 | 1/2009 | Koh et al. |
| 2009/0034123 A1 | 2/2009 | Aoki et al. |
| 2009/0086528 A1 | 4/2009 | Hanafi |
| 2010/0052042 A1 | 3/2010 | Tanaka et al. |
| 2010/0142091 A1 | 6/2010 | Tsukamoto et al. |
| 2010/0142261 A1 | 6/2010 | Kubo et al. |
| 2010/0142262 A1 | 6/2010 | Tsukamoto et al. |
| 2010/0182828 A1 | 7/2010 | Shima et al. |
| 2010/0259960 A1 | 10/2010 | Samachisa |
| 2010/0296338 A1 | 11/2010 | Park et al. |
| 2011/0006277 A1 | 1/2011 | Kubo et al. |
| 2011/0026294 A1 | 2/2011 | Tsukamoto et al. |
| 2011/0031467 A1 | 2/2011 | Kubo et al. |
| 2011/0068319 A1 | 3/2011 | Tsukamoto et al. |
| 2011/0122676 A1 | 5/2011 | Murooka et al. |
| 2011/0140070 A1 | 6/2011 | Kim |
| 2011/0216575 A1 | 9/2011 | Yamaguchi et al. |
| 2011/0216582 A1 | 9/2011 | Tsukamoto et al. |
| 2011/0235408 A1 | 9/2011 | Minemura et al. |
| 2011/0273927 A1 | 11/2011 | Hanzawa et al. |
| 2011/0286256 A1 | 11/2011 | Kamata |
| 2012/0008369 A1 | 1/2012 | Shimuta et al. |
| 2012/0033484 A1 | 2/2012 | Matsuzaki et al. |
| 2012/0087178 A1 | 4/2012 | Watanabe et al. |
| 2012/0113707 A1 | 5/2012 | Takemura |
| 2012/0261722 A1 | 10/2012 | Tang et al. |
| 2012/0268980 A1 | 10/2012 | Awaya et al. |
| 2012/0287697 A1 | 11/2012 | Hanzawa et al. |
| 2013/0075684 A1 | 3/2013 | Kinoshita et al. |
| 2013/0128651 A1 | 5/2013 | Kubo |
| 2013/0141968 A1 | 6/2013 | Sasago et al. |
| 2013/0228739 A1 | 9/2013 | Sasago et al. |
| 2013/0258752 A1 | 10/2013 | Park |
| 2014/0268996 A1 | 9/2014 | Park |
| 2014/0301128 A1 | 10/2014 | Park |
| 2014/0321193 A1 | 10/2014 | Park |
| 2016/0343434 A1 | 11/2016 | Lee et al. |
| 2017/0236872 A1 | 8/2017 | Kanemura et al. |
| 2017/0309752 A1 * | 10/2017 | Yamazaki ......... H01L 29/78606 |
| 2019/0006386 A1 * | 1/2019 | Yamazaki ........... H01L 27/1157 |
| 2019/0027493 A1 * | 1/2019 | Kimura ............. H01L 29/40117 |

* cited by examiner

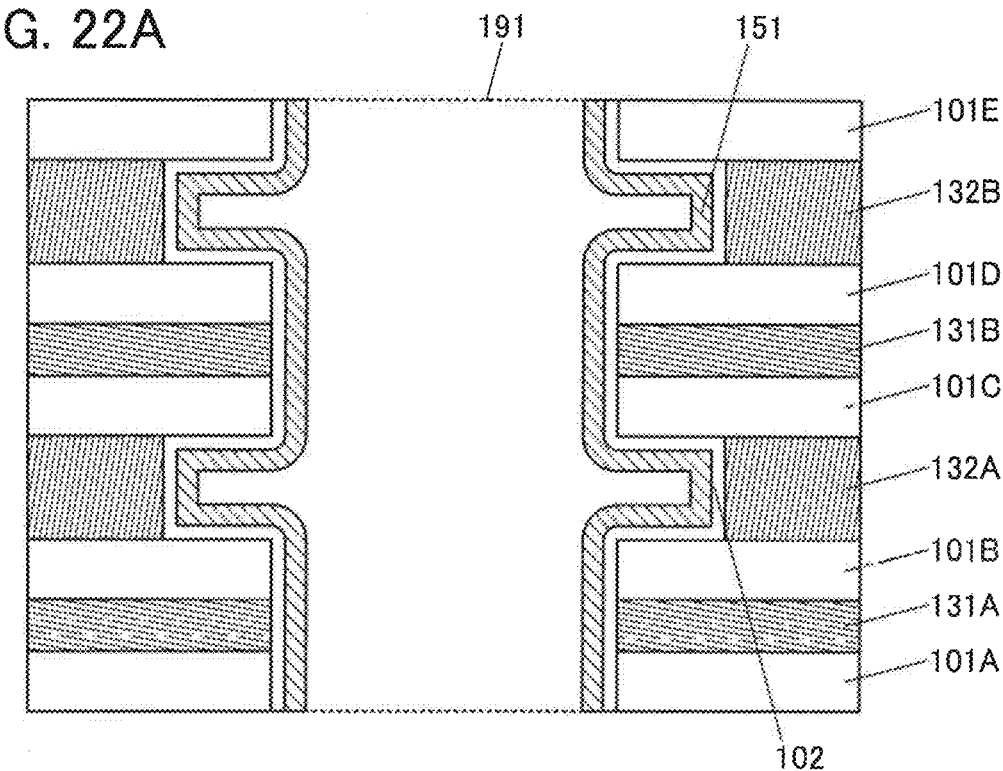
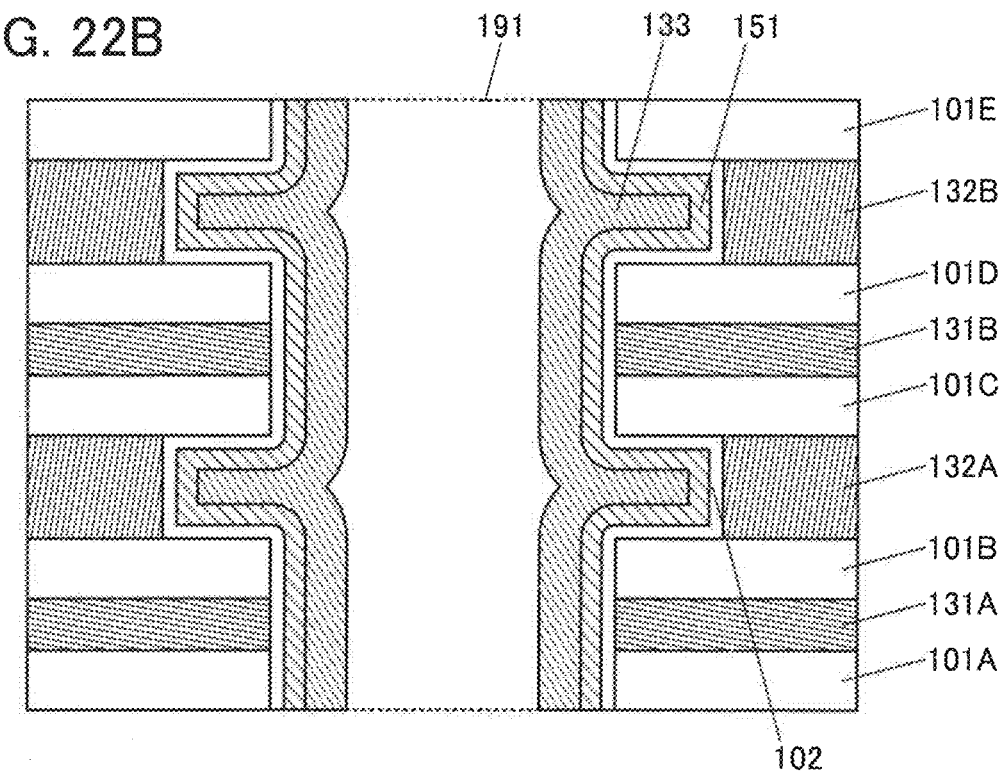

SEMICONDUCTOR DEVICE AND ELECTRONIC DEVICE

CROSS-REFERENCE TO RELATED APPLICATIONS

This application is a continuation of U.S. application Ser. No. 16/017,539, filed Jun. 25, 2018, now allowed, which claims the benefit of a foreign priority application filed in Japan as Serial No. 2017-124314 on Jun. 26, 2017, both of which are incorporated by reference.

BACKGROUND OF THE INVENTION

1. Field of the Invention

One embodiment of the present invention relates to a semiconductor device and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Electronic devices including semiconductor devices, such as mobile devices (e.g., smartphones, tablets, and e-book readers), personal computers, and servers are required to handle large volumes of data. Thus, semiconductor devices need a large memory capacity and fast processing time.

In recent years, the amount of data handled in the aforementioned electronic devices has increased with an increasing number of applications that deal with high-resolution images, moving images, sound, and the like. Semiconductor devices with a large memory capacity have been demanded accordingly. Patent Document 1 discloses a semiconductor device in which memory cells are stacked three-dimensionally. In addition, a technique for reducing the size of a circuit included in a semiconductor device has been required to achieve a semiconductor device with a large memory capacity without change in the chip size of the semiconductor device.

Patent Document

Patent Document 1: Japanese Published Patent Application No. 2008-258458

SUMMARY OF THE INVENTION

An application that operates in an electronic device is required to easily handle large volumes of data of images, sound, and the like on the Internet or a network. An electronic device featuring portability, such as a mobile device, needs to accomplish lower power consumption to achieve longer-term use. An electronic device can employ a technique for reducing power, such as power gating; however, data that is being used needs to be saved to utilize a power reduction technique such as power gating.

For example, in a NAND flash memory known as a semiconductor device, data other than data at an address specified for data rewriting needs to be updated. Thus, a NAND flash memory or the like takes much processing time to write a large amount of data, and power consumption increases in accordance with the amount of data.

In view of the above problems, an object of one embodiment of the present invention is to provide a memory device with a novel structure. Another object of one embodiment of the present invention is to provide a memory device with a short rewrite time. Another object of one embodiment of the present invention is to provide a memory device with low power consumption.

Note that the description of these objects does not preclude the existence of other objects. In one embodiment of the present invention, there is no need to achieve all these objects. Other objects will be apparent from and can be derived from the description of the specification, the drawings, the claims, and the like.

Note that the objects of one embodiment of the present invention are not limited to the above objects. The objects mentioned above do not preclude the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a memory module. The memory module includes a first memory cell, a second memory cell, a selection transistor, and a first wiring. The first memory cell includes a first memory node. The second memory cell includes a second memory node. One end of the first memory cell is electrically connected to the first wiring through the selection transistor. The other end of the first memory cell is electrically connected to one end of the second memory cell. The other end of the second memory cell is electrically connected to the first wiring. Each of the first memory node and the second memory node has a function of retaining a voltage as a signal. When the selection transistor is on, the first memory node is configured so that the retained voltage is rewritten through the selection transistor by a signal supplied to the first wiring, and the second memory node is configured so that the retained voltage is rewritten through the selection transistor and the first memory node by a signal supplied to the first wiring. When the selection transistor is off, the first memory node is configured so that the retained voltage is rewritten through the second memory node by a signal supplied to the first wiring, and the second memory node is configured so that the retained voltage is rewritten by a signal supplied to the first wiring.

The semiconductor device according to the above embodiment is preferably configured as follows. The memory module further includes a second wiring, a third wiring, and a fourth wiring. The first memory cell further includes a first transistor and a first capacitor. The second memory cell further includes a second transistor and a second capacitor. The first memory node is formed by electrical connection between one of a source and a drain of the first transistor and one electrode of the first capacitor. The second memory node is formed by electrical connection between one of a source and a drain of the second transistor and one electrode of the second capacitor. One of a source and a drain of the selection transistor is electrically connected to the first wiring. The other of the source and the drain of the selection transistor is electrically connected to the first memory node. A gate of the selection transistor is electrically connected to the fourth wiring. The other of the source and the drain of the first transistor is electrically connected to the second memory node. A gate of the first transistor is electrically connected to the second wiring. The other of the source and the drain of the second transistor is electrically connected to the first wiring. A gate of the second transistor is electrically connected to the third wiring.

The semiconductor device according to either of the above embodiments is preferably configured as follows. The memory module further includes a fifth wiring. The one end of the first memory cell is electrically connected to the fifth wiring through the selection transistor. When the selection transistor is on, the first memory node is configured so that the retained voltage is rewritten through the selection transistor by a signal supplied to the fifth wiring, and the second memory node is configured so that the retained voltage is rewritten by a signal supplied to the first wiring.

In the semiconductor device according to the above embodiment, the first transistor, the second transistor, or the selection transistor preferably includes a semiconductor layer containing a metal oxide.

In the semiconductor device according to the above embodiment, the semiconductor layer of the first transistor and the semiconductor layer of the second transistor are preferably formed in one opening.

In the semiconductor device according to either of the above embodiments, the transistor including the semiconductor layer containing the metal oxide preferably has a backgate.

An electronic device including any of the above semiconductor devices and a housing is preferable.

One embodiment of the present invention can provide a memory device with a novel structure. One embodiment of the present invention can provide a memory device with a short rewrite time. One embodiment of the present invention can provide a memory device with low power consumption.

Note that the effects of one embodiment of the present invention are not limited to the above effects. The effects mentioned above do not preclude the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Therefore, one embodiment of the present invention does not have the effects described above in some cases.

BRIEF DESCRIPTION OF THE DRAWINGS

In the accompanying drawings:

FIGS. 22A and 22B are cross-sectional views illustrating an example of manufacturing a semiconductor device;

DETAILED DESCRIPTION OF THE INVENTION

Embodiment 1

In this embodiment, a semiconductor device in which the time for rewriting data in memory cells is short will be described with reference to FIGS. 1A to 1C and FIGS. 2 to 7.

Figure 1A:
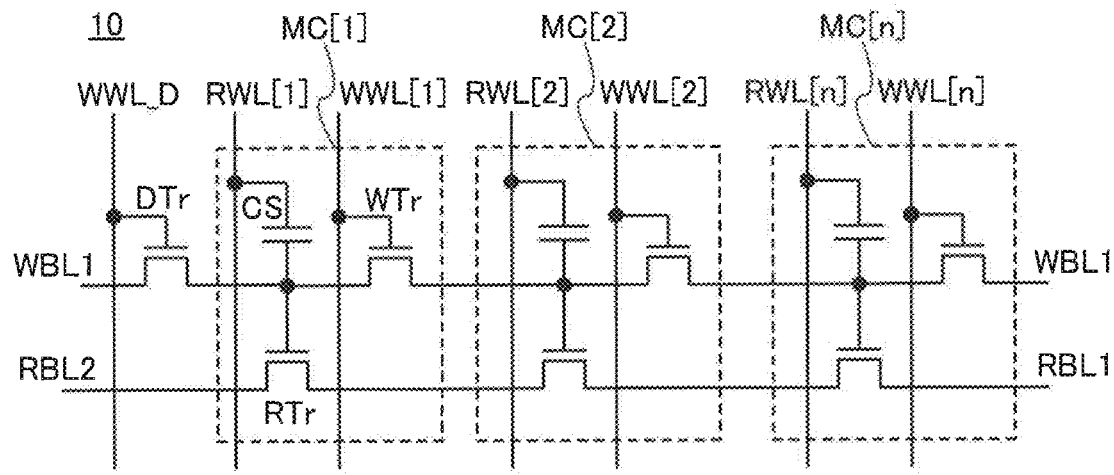
FIGS. 1A to 1C are circuit diagrams illustrating configuration examples of a semiconductor device.

First, the circuit configuration of the semiconductor device will be described with reference to FIG. 1A. The semiconductor device illustrated in FIG. 1A is a memory module 10 including n memory cells. The memory module 10 includes memory cells MC[1] to MC[n], a selection transistor DTr, a wiring WWL_D, wirings WWL[1] to WWL[n], wirings RWL[1] to RWL[n], a wiring WBL1, a wiring RBL1, and a wiring RBL2. The wirings WWL (wirings WWL[1] to WWL[n]) functions as rewrite word lines, the wirings RWL (wirings RWL[1] to RWL[n]) functions as read word lines, the wiring WBL1 functions as a rewrite bit line, and the wiring RBL1 and the wiring RBL2 function as read bit lines. Note that n is an integer of 2 or more.

FIG. 1A illustrates an example where the memory cells MC[1] to MC[n] are connected in series. The selection transistor DTr is preferably connected to one end of the memory cells MC[1] to MC[n] connected in series. FIG. 1A shows an example where the selection transistor DTr is connected to the memory cell MC[1].

Each of the memory cells includes a transistor WTr, a transistor RTr, a capacitor CS, and a memory node. The transistor WTr functions as a rewrite transistor, and the transistor RTr functions as a read transistor.

The memory node is formed by electrical connection between one of a source and a drain of the transistor WTr, a gate of the transistor RTr, and one electrode of the capacitor CS. A gate of the transistor WTr is electrically connected to the wiring WWL. The other electrode of the capacitor CS is electrically connected to the wiring RWL. The other of the source and the drain of the transistor WTr in the memory cell MC[1] is electrically connected to the memory node of the memory cell MC[2], which is connected in series with the memory cell MC[1].

One of a source and a drain of the selection transistor DTr is electrically connected to the wiring WBL1. The other of the source and the drain of the selection transistor DTr is electrically connected to the memory node of the memory cell MC[1]. A gate of the selection transistor DTr is electrically connected to the wiring WWL_D. The other of the source and the drain of the transistor WTr in the memory cell MC[n] is electrically connected to the wiring WBL1. That is, one end of the memory cells connected in series is electrically connected to the other end of the series of the memory cells through the selection transistor DTr and the wiring WBL1.

One of a source and a drain of the transistor RTr in the memory cell MC[1] is electrically connected to the wiring RBL2. The other of the source and the drain of the transistor RTr in the memory cell MC[1] is electrically connected to one of the source and the drain of the transistor RTr in the memory cell MC[2], which is connected in series with the memory cell MC[1]. The other of the source and the drain of the transistor RTr in the memory cell MC[n] is electrically connected to the wiring RBL1. That is, the wiring RBL1 is electrically connected to the wiring RBL2 through the transistors RTr included in the memory cells connected in series.

In the memory module 10 with the above configuration, data in one of the memory cells MC[1] to MC[n] can be rewritten through the transistors WTr and the memory nodes that are connected in series. Note that to rewrite data in the memory cell MC[j] that is closer to the memory cell MC[1], data is preferably supplied from the wiring WBL1 through the selection transistor DTr; whereas to rewrite data in the memory cell MC[j] that is closer to the memory cell MC[n], data is preferably supplied from the wiring WBL1 connected to the memory cell MC[n]. Note that j is an integer of 1 to n.

Figure 1B:
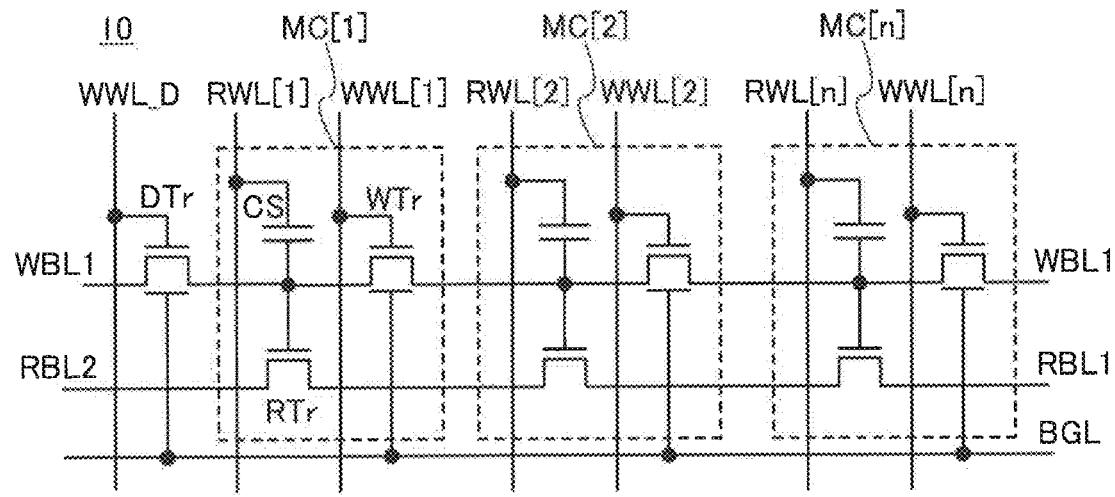

The memory module 10 with a circuit configuration different from that in FIG. 1A will be described with reference to FIG. 1B. The transistor WTr illustrated in FIG. 1B is preferably a transistor with low off-state current. The use of transistors exhibiting low off-state current as the transistors WTr can ensure independence of data stored in the adjacent memory nodes. Moreover, the transistor WTr may have a backgate. Application of voltage to the backgate enables control of the threshold voltage of the transistor WTr. A wiring BGL illustrated in FIG. 1B is electrically connected to the backgates of the transistors WTr in the memory cells MC[1] to MC[n]. Like the transistor WTr, the selection transistor DTr preferably has a backgate.

Unlike in the example of FIG. 1B, the wirings BGL may be electrically connected to the backgates of the transistors WTr in the memory cells MC[1] to MC[n] independently and supply different potentials to the respective backgates.

A channel formation region of the transistor WTr preferably contains a metal oxide that will be described in Embodiment 3. Specifically, a metal oxide that contains at least one of indium, an element M (e.g., aluminum, gallium, yttrium, or tin), and zinc functions as a wide gap semiconductor; thus, a transistor containing the metal oxide in its channel formation region exhibits ultralow off-state current. When a transistor with low off-state current characteristics is used as the transistor WTr for controlling data retention, the memory cell MC can retain data for a long time. As a result, the number of refreshing retained data can be reduced, leading to lower power consumption of the semiconductor device.

For a channel formation region of the transistor RTr, a material achieving high field-effect mobility of the transistor is preferably used. Using such a transistor allows the semiconductor device to operate faster. Examples of the material contained in the channel formation region of the transistor RTr include the metal oxide described in Embodiment 3 and a semiconductor material such as silicon.

Figure 1C:
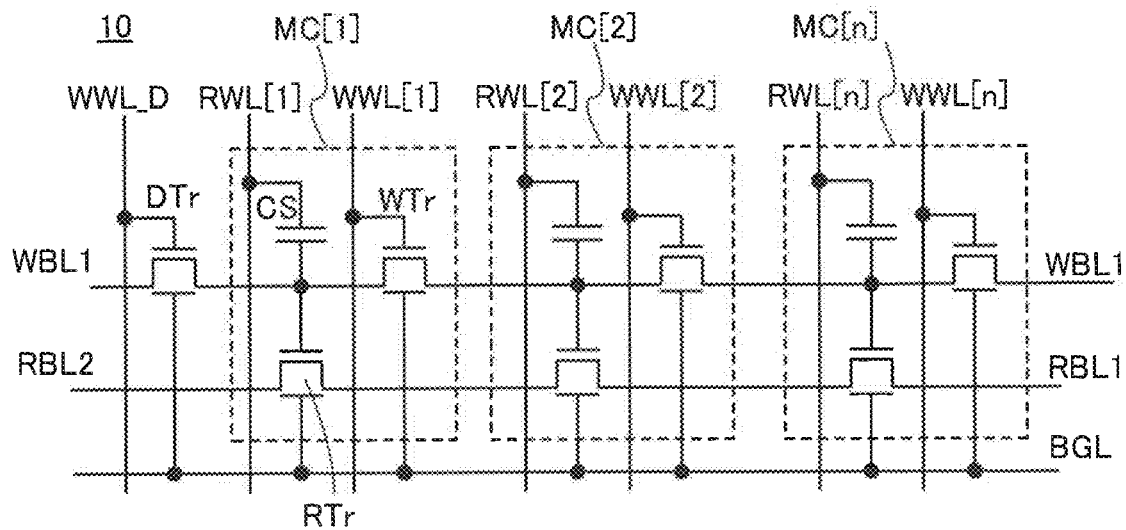

The memory module 10 with a circuit configuration different from that in FIG. 1B will be described with reference to FIG. 1C. In FIG. 1C, the transistor RTr also has a backgate; application of voltage to the backgate enables control of the threshold voltage of the transistor RTr. As an example, the wiring BGL in FIG. 1C is electrically connected to the backgates of the transistors RTr and the transistors WTr in the memory cells MC[1] to MC[n].

When a metal oxide is used for the channel formation regions of the transistor RTr and the transistor WTr, the memory module 10 can be formed above the transistor formed on a silicon substrate. Thus, the semiconductor device can have high data density per unit area.

Unlike in the example of FIG. 1C, the wirings BGL may be electrically connected to the backgates of the transistors RTr and the transistors WTr in the memory cells MC[1] to MC[n] independently and supply different potentials to the respective backgates. Although not illustrated in FIG. 1A, the transistor RTr may have a backgate.

Figure 2:
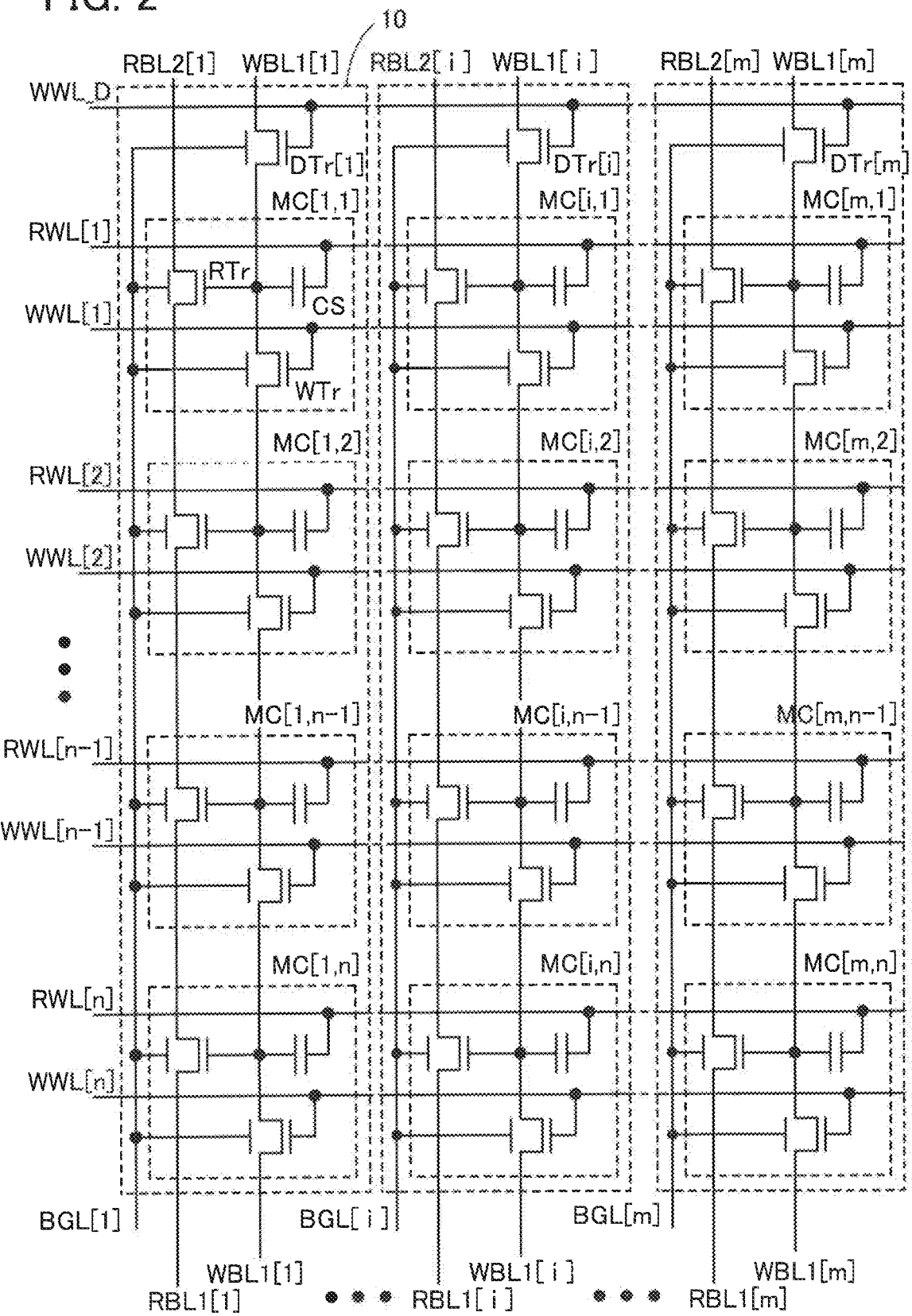
FIG. 2 is a circuit diagram illustrating a configuration example of a semiconductor device.

In a semiconductor device illustrated in FIG. 2, the memory modules 10 in FIG. 1C are arranged in m columns, and the wiring RWL and the wiring WWL are electrically connected to and shared between the memory cells MC in the same row. That is, the semiconductor device in FIG. 2 is represented in two dimensions with n rows and m columns and includes memory cells MC[1,1] to MC[m,n]. Although not shown in FIG. 2 for simplicity, giving depth d enables the semiconductor device to include three-dimensional memory cells MC[1,1,1] to MC[m,n,d]. In Embodiment 2, an example of the semiconductor device including the three-dimensional memory cells MC[1,1,1] to MC[m,n,d] will be described in detail. Note that m, n, and d are each an integer of 2 or more.

The semiconductor device illustrated in FIG. 2 includes a wiring WWL_D, the wirings RWL[1] to RWL[n], the wirings WWL[1] to WWL[n], wirings RBL1[1] to RBL1[m], wirings RBL2[1] to RBL2[m], wirings WBL1[1] to WBL1[m], and wirings BGL[1] to BGL[m].

Specifically, the other electrode of the capacitor CS in the memory cell MC[i,j] (not illustrated) is electrically connected to the wiring RWL[j], and the gate of the transistor WTr in the memory cell MC[i,j] is electrically connected to the wiring WWL[j]. The wiring WBL1[i] is electrically connected to one of the source and the drain of the selection transistor DTr[i] and the other of the source and the drain of the transistor WTr in the memory cell MC[i,n]. The wiring RBL1[i] is electrically connected to the other of the source and the drain of the transistor RTr in the memory cell MC[i,n]. The wiring RBL2[i] is electrically connected to one of the source and the drain of the transistor RTr in the memory cell MC[i,1]. Note that i is an integer of 1 to m, and j is an integer of 1 to n.

In the structure of data stored in the memory module included in the semiconductor device of FIG. 2, the data width is preferably represented in bits (the smallest unit of data). As an example, operation for rewriting data in the first row, the second row, the (n−1)th row, and the n-th row will be described with reference to a timing chart in FIG. 3.

At T11, selection transistors DTr[1] to DTr[m] are turned on by supply of "H" to the wiring WWL_D. The transistors WTr in the memory cells MC[1,1] to MC[m,1] are turned on by supply of "H" to the wiring WWL[1]. The wirings WBL1[1] to WBL1[m] can supply data D[2] to the memory nodes of the memory cells MC[1,2] to MC[m,2] through the selection transistors DTr[1] to DTr[m]. At this time, the data D[2] is also supplied to the memory nodes of the memory cells MC[1,1] to MC[m,1]. The data D is preferably digital data with an m-bit data width. Alternatively, the data D may be analog data. Analog data is preferably controlled with voltage. When each bit can have different analog data, the amount of data stored in the semiconductor device can be drastically increased.

At T12, the transistors WTr in the memory cells MC[1,1] to MC[m,1] are turned off by supply of "L" to the wiring WWL[1]. Thus, the data D[2] is retained in the memory nodes of the memory cells MC[1,2] to MC[m,2]. Furthermore, by data D[1] supplied to the wirings WBL1[1] to WBL1[m], the data in the memory nodes of the memory cells MC[1,1] to MC[m,1] can be rewritten through the selection transistors DTr[1] to DTr[m].

At T13, the selection transistors DTr[1] to DTr[m] are turned off by supply of "L" to the wiring WWL_D. Thus, the data D[1] is retained in the memory nodes of the memory cells MC[1,1] to MC[m,1].

At T14, the transistors WTr in the memory cells MC[1, n−1] to MC[m,n−1] are turned on by supply of "H" to the wiring WWL[n−1]. The transistors WTr in the memory cells MC[1,n] to MC[m,n] are turned on by supply of "H" to the wiring WWL[n]. By data D[n−1] supplied to the wirings WBL1[1] to WBL1[m], data in the memory nodes of the memory cells MC[1,n−1] to MC[m,n−1] can be rewritten through the memory nodes of the memory cells MC[1,n] to MC[m,n].

At T15, the transistors WTr in the memory cells MC[1, n−1] to MC[m,n−1] are turned off by supply of "L" to the wiring WWL[n−1]. Thus, the data D[n−1] is retained in the memory nodes of the memory cells MC[1,n−1] to MC[m, n−1]. Moreover, the wirings WBL1[1] to WBL1[m] can supply data D[n] to the memory nodes of the memory cells MC[1,n] to MC[m,n].

At T16, the transistors WTr in the memory cells MC[1,n] to MC[m,n] are turned off by supply of "L" to the wiring WWL[n]. Thus, the data D[n] is retained in the memory nodes of the memory cells MC[1,n] to MC[m,n].

In a NAND flash memory, to update data in one of memory cells connected in series in a memory module, data in all the rows of the memory module needs to be updated. In contrast, with the configuration shown in this embodiment, data in a given row of the memory module can be rewritten, resulting in fast data rewriting.

Figure 4:
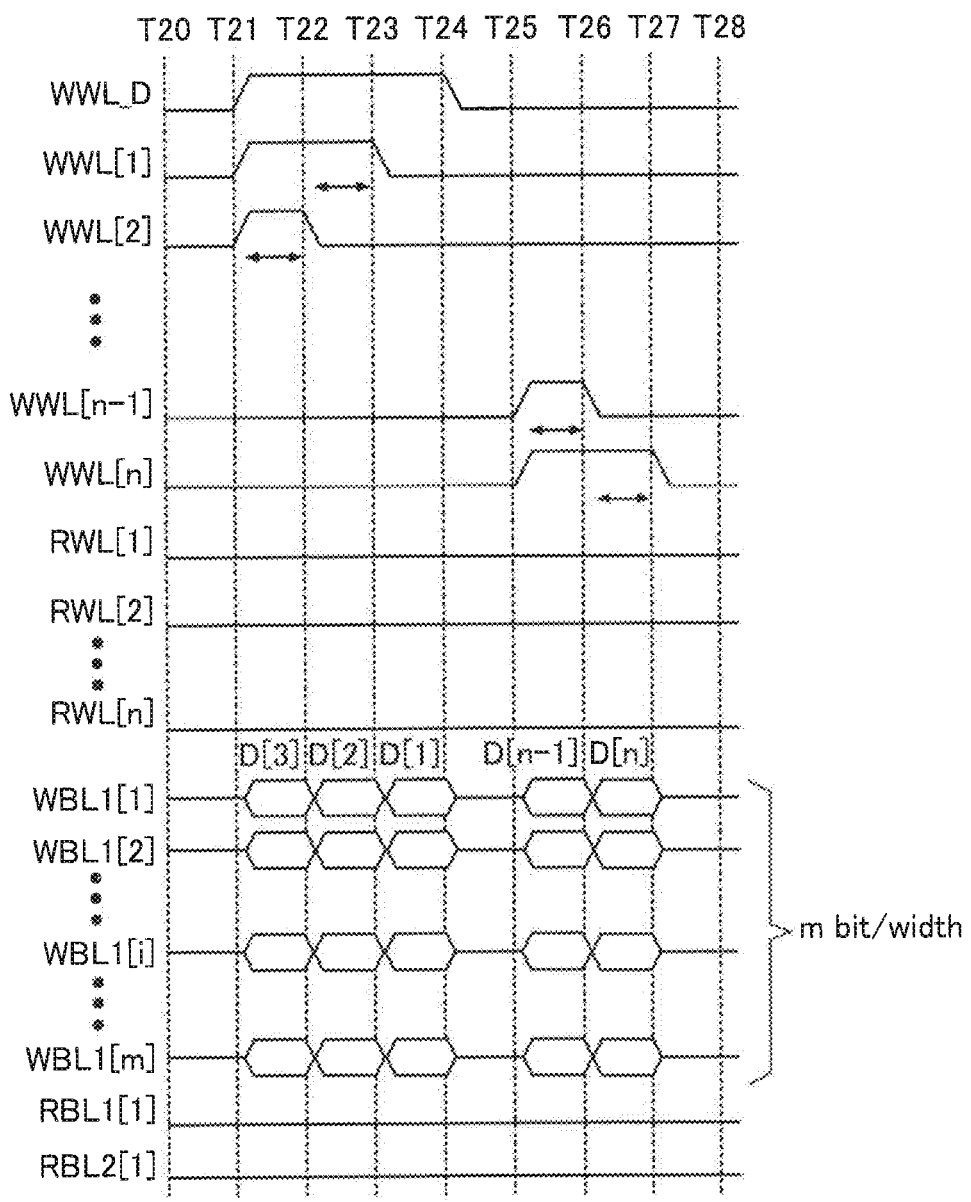
FIG. 4 is a timing chart illustrating an operation example of a semiconductor device.

Using FIG. 4, the description is made on an example where a plurality of memory modules included in the semiconductor device are connected through the wirings WWL, the wirings RWL, and the wiring WWL_D and data to be stored has a width of m columns. As an example, operation for rewriting data in the first row, the second row, the third row, the (n−1)th row, and the n-th row is described with reference to a timing chart in FIG. 4.

Figure 3:
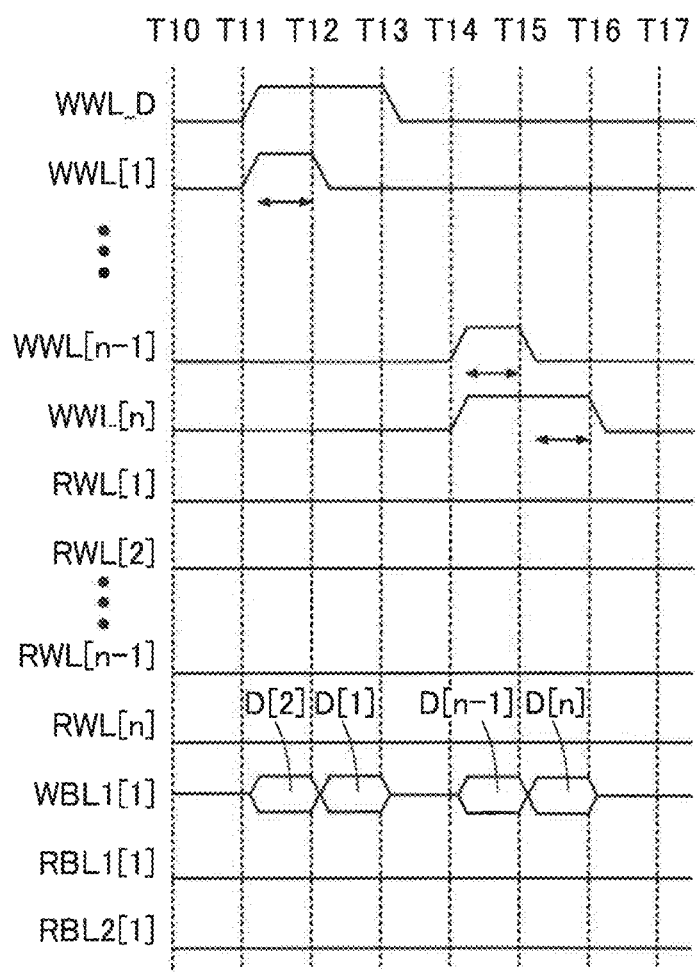
FIG. 3 is a timing chart illustrating an operation example of a semiconductor device.

Basic operation is the same as the operation described with FIG. 3, and therefore the description thereof is not repeated; differences from FIG. 3 are described below using FIG. 4. As an example, data rewriting in the third row is described with FIG. 4. In the memory module having a plurality of rows, a given row subjected to data rewriting is preferably accessed through the closer of the two memory cells MC at the opposite ends (i.e., either through the first-row memory cell MC to which the selection transistor DTr is connected, or through the n-th-row memory cell MC). The time for rewriting data in a memory cell depends on the number of rows from one end to the given row subjected to data rewriting. Accordingly, access from the end closer to the given row subjected to data rewriting leads to a shorter rewrite time.

Since a plurality of memory cells are arranged in m columns in the example of FIG. 4, retained data is concurrently rewritten by data supplied to the wirings WBL1[1] to WBL1[m]. That is, the semiconductor device with the configuration shown in this embodiment is regarded as a memory device having an m-bit data width for a given address.

Figure 5:
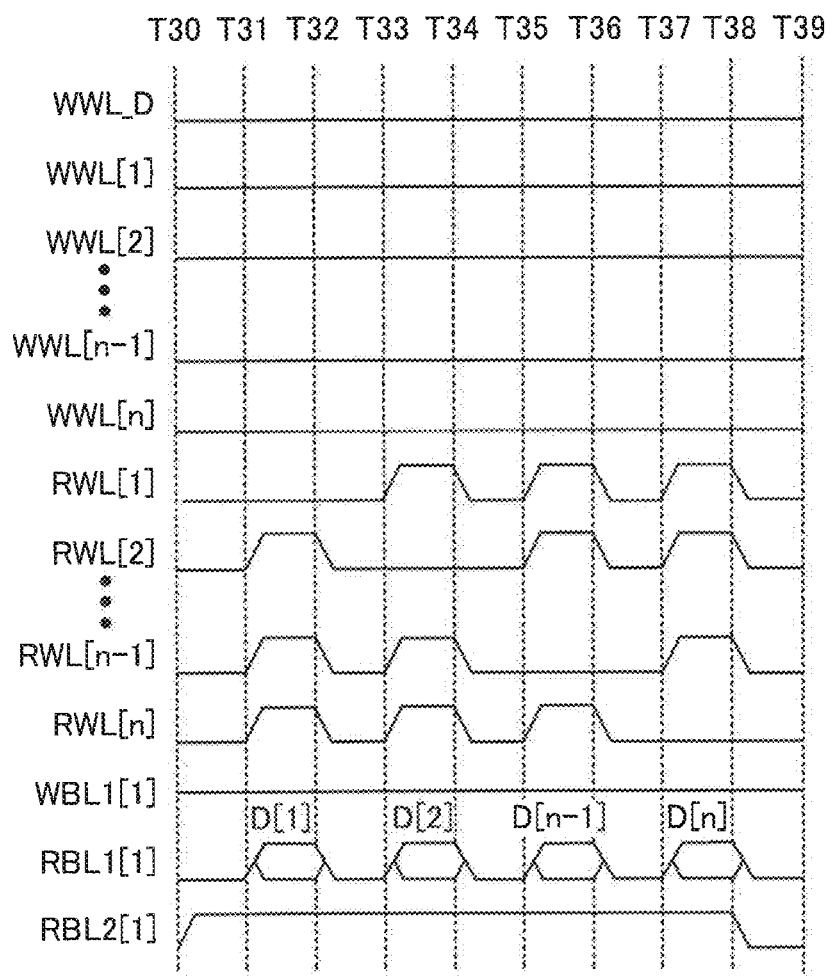
FIG. 5 is a timing chart illustrating an operation example of a semiconductor device.

Operation for reading data that is rewritten according to FIG. 3 will be described with reference to a timing chart in FIG. 5.

At T30, the wirings RBL1[1] to RBL1[m] can be initialized with a given potential. The wirings RBL2[1] to RBL2 [m] are supplied with a reference potential for confirming that the memory cell stores given data. The given potential for initialization is preferably the same potential as "L" of data or a potential lower than "L" of data.

At T31, data stored in the memory cells MC[1,1] to MC[m,1] connected to the wiring RWL[1] can be read out. The wiring RWL[1] is supplied with "L" and the other wirings RWL[2] to RWL[n] are supplied with "H." Since the transistors RTr are connected in series, when "H" data is retained in any of the memory cells MC[1,1] to MC[m,1], a signal with the reference potential is output to the wiring RBL1 in the row to which the memory cell MC retaining "H" data belongs.

When "H" is supplied from the wirings RWL[2] to RWL[n] to the memory cells MC connected to the wirings RWL[2] to RWL[n], the capacitor CS can make the gate of the transistor RTr in a state of being supplied with "H" according to the charge conservation law. Thus, among the transistors RTr connected in series, all the transistors RTr except the one subjected to data reading are turned on. Accordingly, when data in the memory cell subjected to data reading is "L," the reference potential supplied to the wiring RBL2 cannot be output to the wiring RBL1. On the other hand, when data in the memory cell subjected to data reading is "H," the reference potential supplied to the wiring RBL2 is output to the wiring RBL1. As a result, data stored in the memory cells MC[1,1] to MC[m,1] is output to the wirings RBL1[1] to RBL1[m].

At T32, the wirings RWL[1] to RWL[n] are supplied with "L," and the wirings RBL1[1] to RBL1[m] are initialized with a given potential. At this time, the wirings RBL2[1] to RBL2[m] are preferably supplied with "H" but may be supplied with "L."

At T33, data stored in the memory cells MC[1,2] to MC[m,2] connected to the wiring RWL[2] can be read out. The wiring RWL[2] is supplied with "L," and the other wirings RWL[1] and RWL[3] to RWL[n] are supplied with "H." The subsequent operation is the same as the operation for reading data from the wiring RWL[1]; therefore, the description is omitted here.

The operation at T34 is the same as that at T32, and the description is therefore omitted. Subsequently, data stored in the memory cells MC connected to the wirings RWL[3] to RWL[n] can be read out. As a result, data in the memory cells MC can be read out sequentially in the row direction of the memory cells.

A semiconductor device different from that in FIG. 2 will be described with reference to FIG. 6. The semiconductor device in FIG. 6 differs from that in FIG. 2 in including wirings WBL2. For simplicity, the description is made using the memory module 10 as an example.

The wiring WBL2 is electrically connected to one of the source and the drain of the selection transistor DTr. Accordingly, in the memory module 10, data in the memory cell MC can be rewritten through one or both of the wiring WBL1 and the wiring WBL2.

That is, by supply of "H" to the wiring WWL_D, the wiring WBL2[1] can rewrite data in the memory node of the memory cell MC[1,1] through the selection transistor DTr. By supply of "H" to the wiring WWL[n], the wiring WBL1[1] can rewrite data in the memory node of the memory cell MC[1,n]. Moreover, by simultaneous supply of "H" to the wiring WWL[1] and the wiring WWL[n], data in the memory nodes of the memory cell MC[1,1] and the memory cell MC[1,n] can be rewritten at the same time.

Operation for rewriting data in the first row, the second row, the (n−1)th row, and the n-th row by a method different from that in FIG. 3 will be described with reference to a timing chart in FIG. 7.

At T41, the selection transistors DTr[1] to DTr[m] are turned on by supply of "H" to the wiring WWL_D. The transistors WTr in the memory cells MC[1,1] to MC[m,1] are turned on by supply of "H" to the wiring WWL[1]. Thus, by the data D[2] supplied to the wirings WBL2[1] to WBL2[m], data in the memory cells MC[1,2] to MC[m,2] can be rewritten through the selection transistors DTr[1] to DTr[m]. At this time, the data D[2] is also supplied to the memory cells MC[1,1] to MC[m,1].

In addition, the transistors WTr in the memory cells MC[1,n] to MC[m,n] are turned on by supply of "H" to the wiring WWL[n]. The transistors WTr in the memory cells MC[1,n−1] to MC[m,n−1] are turned on by supply of "H" to the wiring WWL[n−1]. Thus, by the data D[n−1] supplied to the wirings WBL1[1] to WBL1[m], data in the memory nodes of the memory cells MC[1,n−1] to MC[m,n−1] can be rewritten. At this time, the data D[n−1] is supplied to the memory cells MC[1,n] to MC[m,n].

Consequently, data in the memory nodes of the memory cells MC[1,2] to MC[m,2] and the memory cells MC[1,n−1] to MC[m,n−1] is rewritten at the same time.

At T42, the transistors WTr in the memory cells MC[1,1] to MC[m,1] are turned off by supply of "L" to the wiring WWL[1], and the transistors WTr in the memory cells MC[1,n−1] to MC[m,n−1] are turned off by supply of "L" to the wiring WWL[n−1]. Hence, the data D[2] is stored in the memory nodes of the memory cells MC[1,2] to MC[m,2], and the data D[n−1] is stored in the memory nodes of the memory cells MC[1,n−1] to MC[m,n−1].

By the data D[1] supplied to the wirings WBL2[1] to WBL2[m], the data in the memory cells MC[1,1] to MC[m,1] can be rewritten through the selection transistors DTr[1] to DTr[m]. Moreover, by the data D[n] supplied to the wirings WBL2[1] to WBL2[m], the data in the memory cells MC[1,n] to MC[m,n] can be rewritten through the selection transistors DTr[1] to DTr[m].

Figure 8:
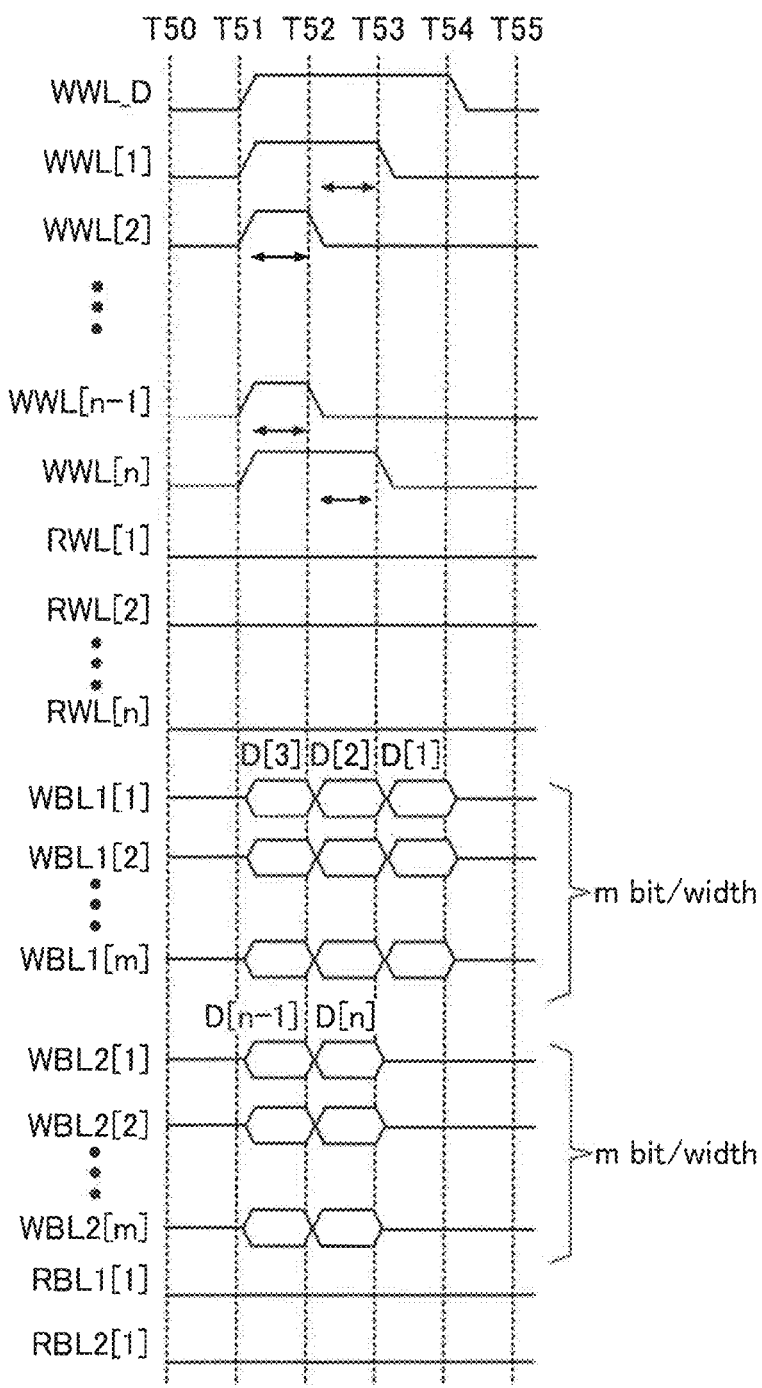
FIG. 8 is a timing chart illustrating an operation example of a semiconductor device.

Using FIG. 8, the description is made on an example where a plurality of memory modules included in the semiconductor device are connected through the wirings WWL, the wirings RWL, and the wiring WWL_D and data to be stored has a width of m columns. As an example, operation for rewriting data in the first row, the second row, the third row, the (n−1)th row, and the n-th row is described with reference to a timing chart in FIG. 8.

Figure 7:
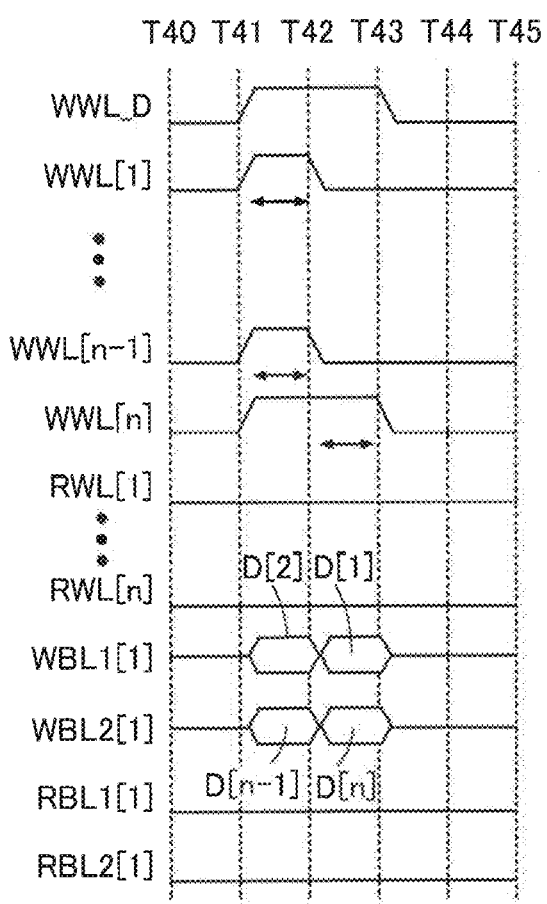
FIG. 7 is a timing chart illustrating an operation example of a semiconductor device.

Basic operation is the same as the operation described with FIG. 7, and therefore the description thereof is not repeated; differences from FIG. 7 are described below using FIG. 8. For example, at T51, data in the second row and data in the (n−1)th row are rewritten at the same time. At T52, data in the first row and data in the n-th row are rewritten at the same time.

When two different rows, for example, are subjected to data rewriting in the memory module having n rows, it is preferred that each of the rows subjected to data rewriting be concurrently accessed through the closer of the two memory cells MC at the opposite ends (i.e., either through the first-row memory cell MC to which the selection transistor DTr is connected, or through the n-th-row memory cell MC). Data in two different rows can be rewritten at the same time, so that the time for rewriting data in the memory cells can be further shortened. Accordingly, access from the end closer to the given row subjected to data rewriting leads to a shorter rewrite time.

Since a plurality of memory cells are arranged in m columns in the example of FIG. 8, retained data is concurrently rewritten by data supplied to the wirings WBL1[1] to WBL1[m] and data supplied to the wirings WBL2[1] to WBL2[m]. That is, the semiconductor device with the configuration shown in this embodiment is regarded as a memory device having an m-bit data width for a given address.

Figure 6:
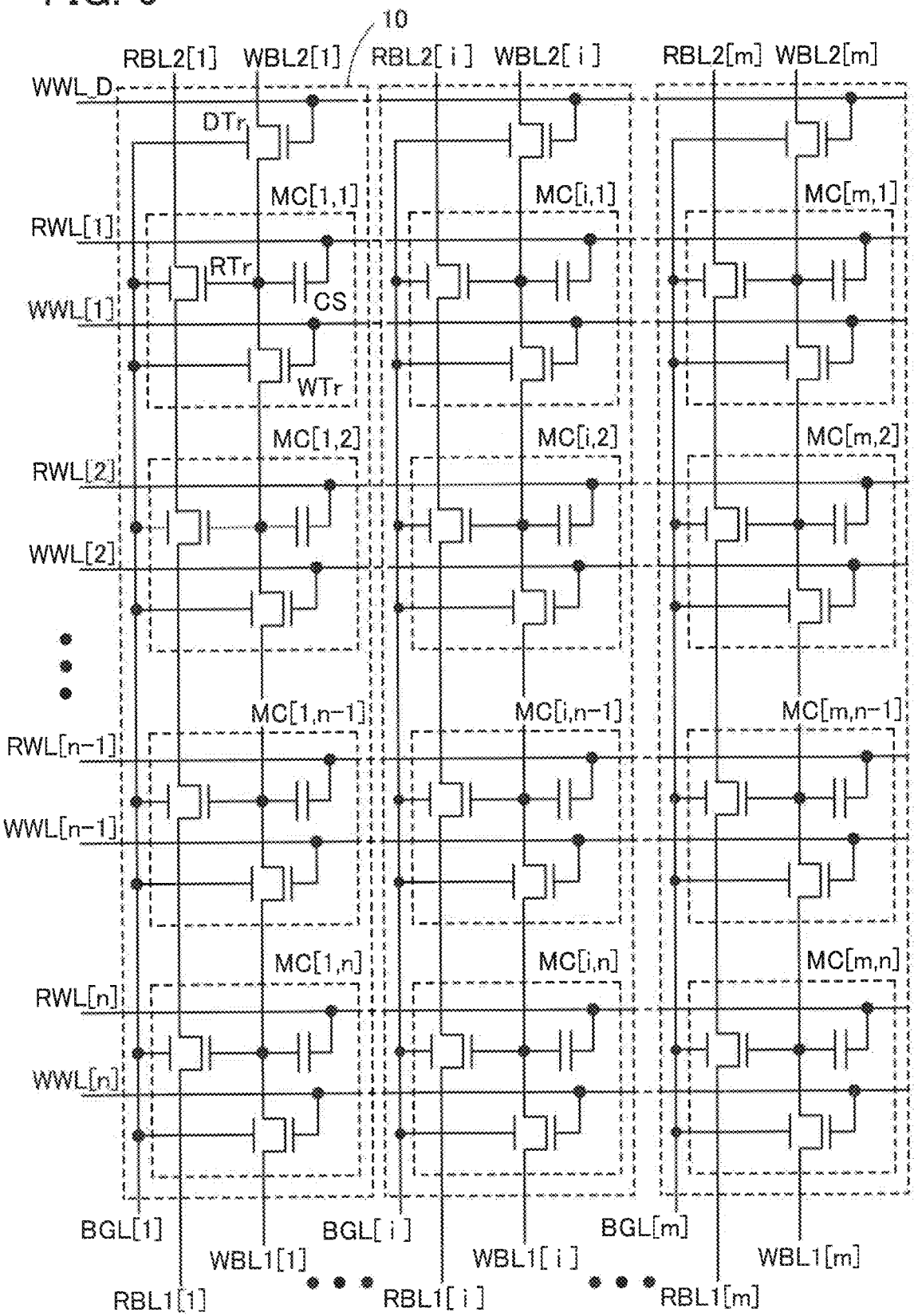
FIG. 6 is a circuit diagram illustrating a configuration example of a semiconductor device.

According to FIGS. 6 to 8, data in given rows of the memory module can be concurrently rewritten from different directions, and thus data rewriting can be even faster than that with the circuit configuration in FIG. 2.

The structure and method described in this embodiment can be implemented by being combined as appropriate with any of structures and methods described in the other embodiments.

Embodiment 2

In this embodiment, a memory device including the semiconductor device described in the foregoing embodiment will be described.

Figure 9A:
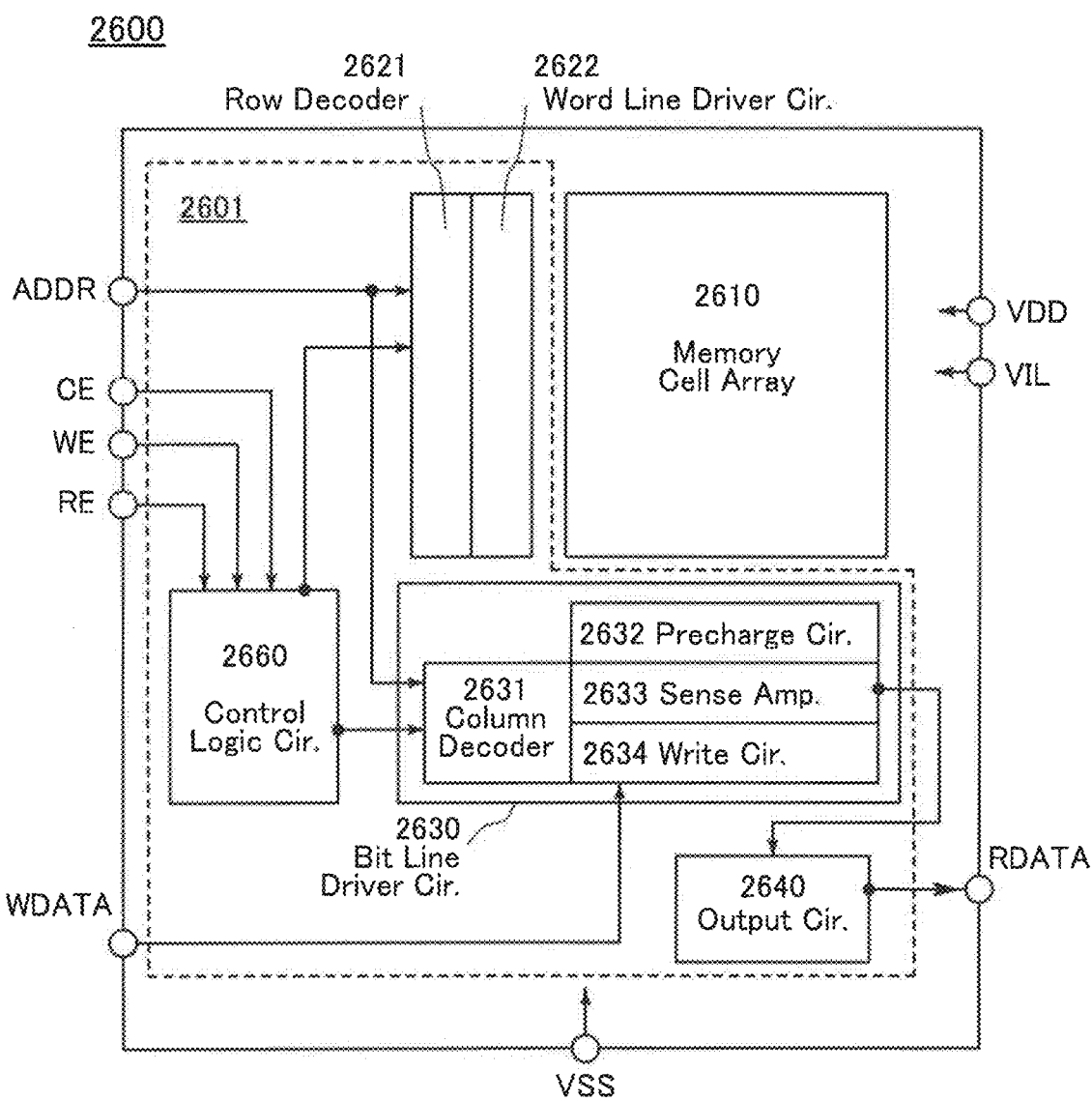
FIGS. 9A and 9B are block diagrams illustrating an example of a memory device.

FIG. 9A illustrates a structure example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The semiconductor device illustrated in any of FIGS. 1A to 1C in Embodiment 1 can be used for the memory cell array 2610.

The bit line driver circuit 2630 includes a column decoder 2631, a precharge circuit 2632, a sense amplifier 2633, and a write circuit 2634. The precharge circuit 2632 has a function of precharging the wirings RBL2, which are described in Embodiment 1, to a predetermined potential. The sense amplifier 2633 has a function of obtaining a potential output from the memory cell MC to the wiring RBL1 as a data signal and amplifying the data signal. The amplified data signal is output as a digital data signal RDATA from the memory device 2600 through the output circuit 2640.

As power supply voltages, a low power supply voltage (VSS), a high power supply voltage (VDD) for the peripheral circuit 2601, and a high power supply voltage (VIL) for the memory cell array 2610 are supplied to the memory device 2600 from the outside.

Control signals (CE, WE, RE), an address signal ADDR, and a data signal WDATA are input to the memory device 2600 from the outside. The address signal ADDR is input to the row decoder 2621 and the column decoder 2631. The data signal WDATA is input to the write circuit 2634.

The control logic circuit 2660 processes the signals (CE, WE, RE) input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether the circuits and signals described above are provided or not can be determined as appropriate when needed.

Figure 9B:
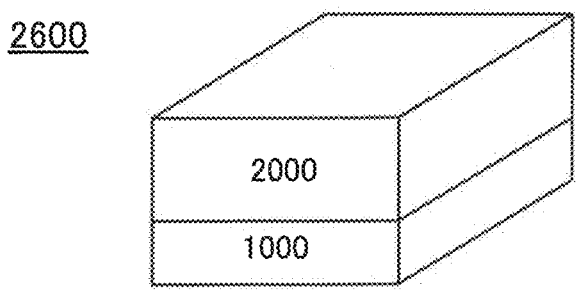

FIG. 9B illustrates an example where the memory device 2600 is configured with a p-channel Si transistor and a transistor whose channel formation region contains an oxide semiconductor described in Embodiment 3 (preferably an oxide containing In, Ga, and Zn). As an example, the memory device 2600 in FIG. 9B includes a logic layer 1000 where the peripheral circuit is constituted by Si transistors, and a memory layer 2000. Specifically, the memory layer 2000 formed with transistors that contain an oxide semiconductor in their channel formation regions is provided above the logic layer 1000.

Accordingly, providing the sense amplifier 2633 below the memory layer 2000 can shorten the wiring RBL1 that connects the sense amplifier 2633 and the memory cells MC. Thus, the wiring RBL1 is less affected by its time constant, so that the speed of reading data from the memory cell MC can be increased. The use of the transistor containing an oxide semiconductor for the memory cell MC results in lower off-state current of the memory cell MC. Data leakage between adjacent memory cells MC can be suppressed; hence, data can be retained for a long time. Moreover, the refresh interval for the memory cells can be lengthened, reducing power consumption of the memory device 2600. When the Si transistors are only p-channel ones, manufacturing cost can be reduced. Alternatively, only n-channel Si transistors may be employed.

Figure 10:
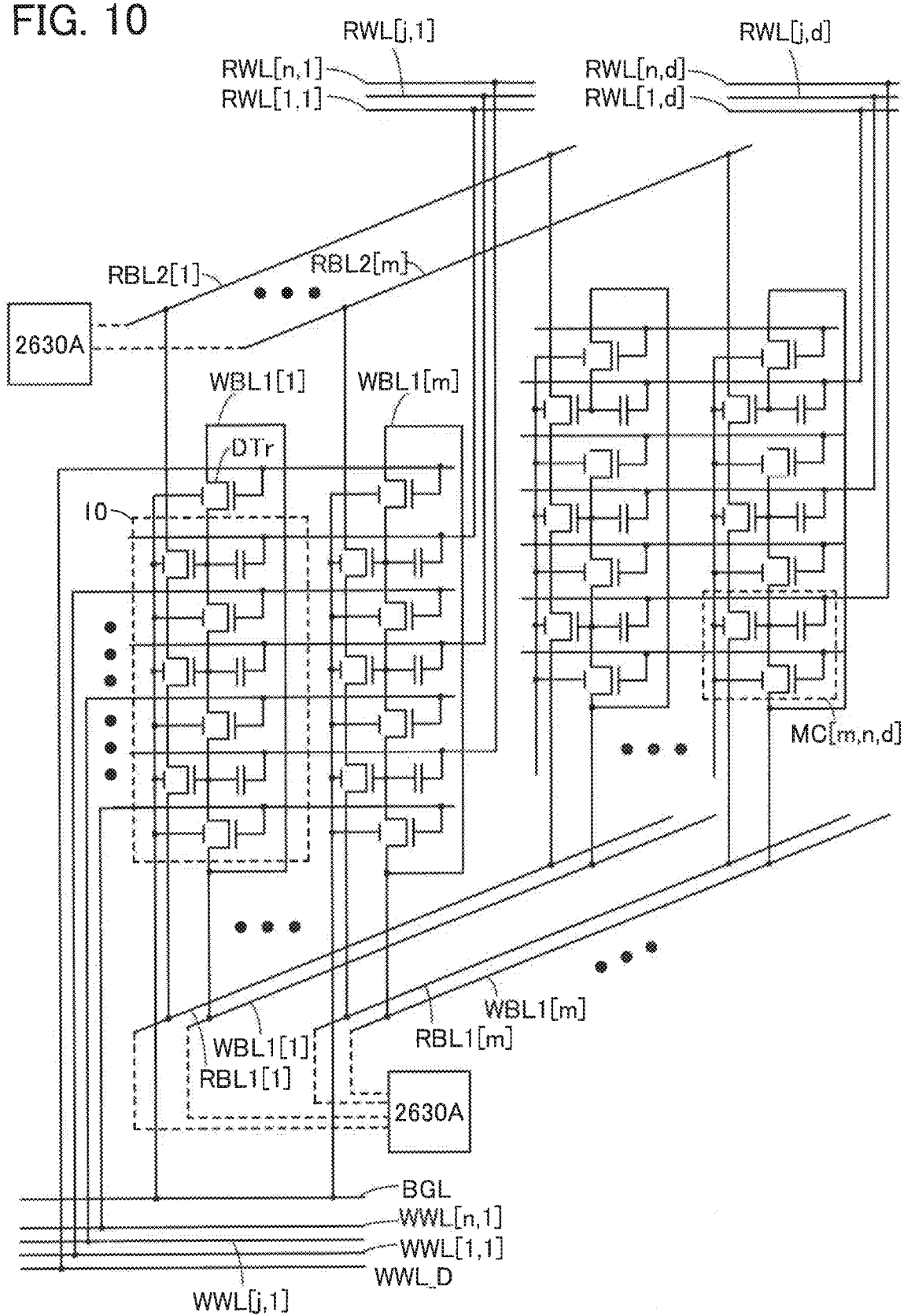
FIG. 10 is a circuit diagram illustrating a configuration example of a semiconductor device.
Figure 11:
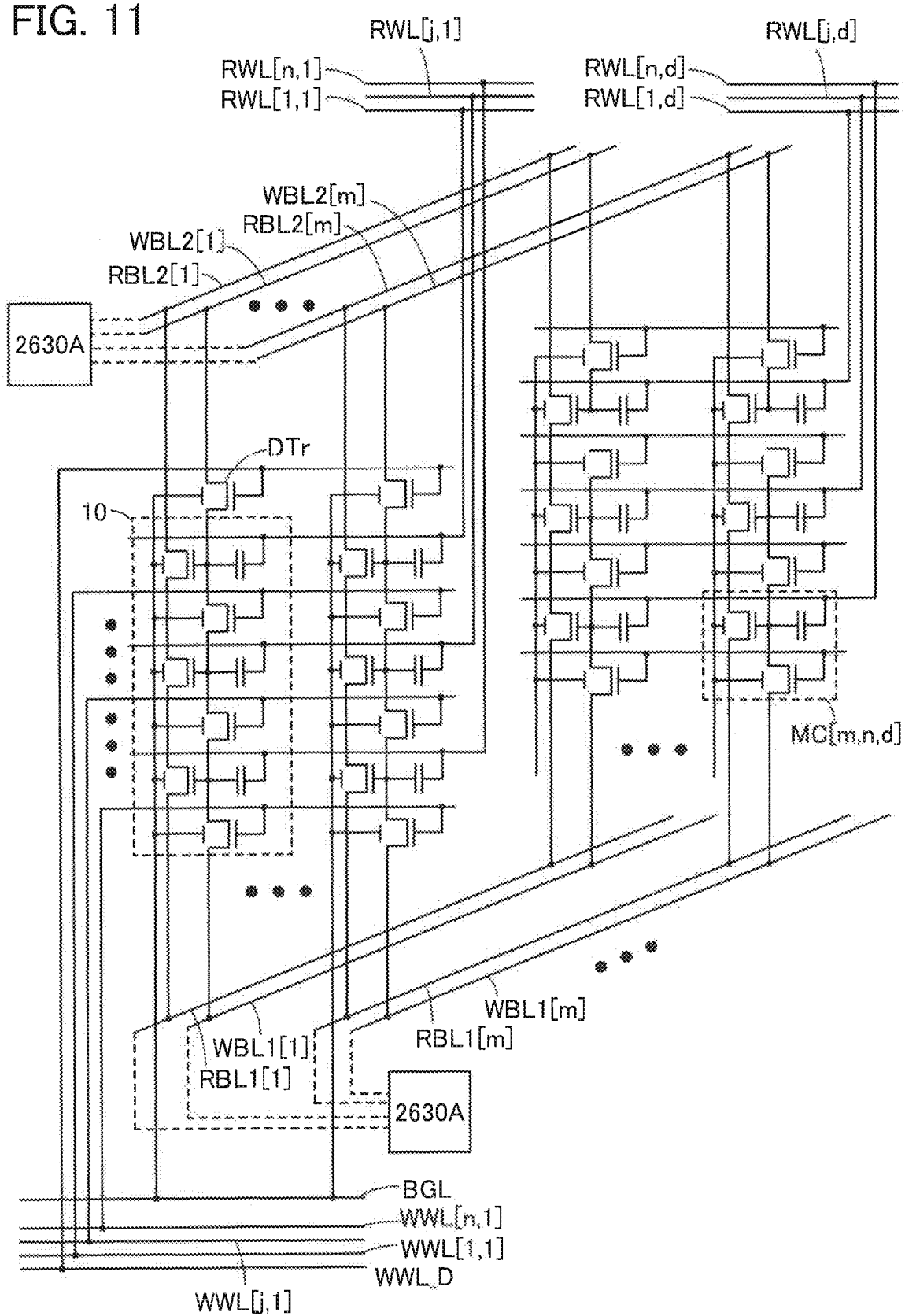
FIG. 11 is a circuit diagram illustrating a configuration example of a semiconductor device.
Figure 12:
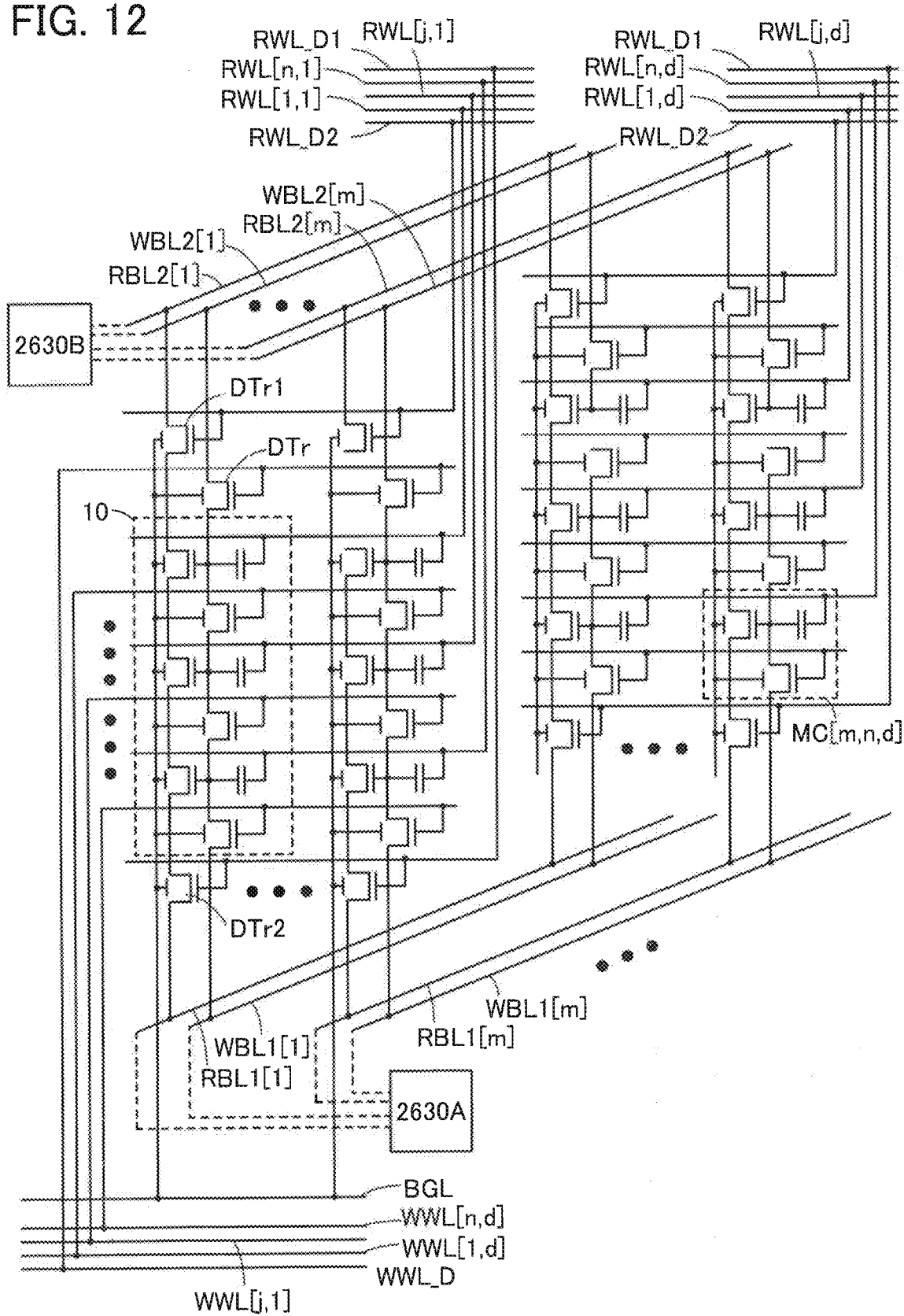
FIG. 12 is a circuit diagram illustrating a configuration example of a semiconductor device.

FIGS. 10, 11, and 12 illustrate configurations of the memory cell array 2610 in FIGS. 9A and 9B. For simplicity, some components are not shown in FIGS. 10 to 12.

In FIG. 10, the wiring RBL1[m], the wiring WBL1[m], the wiring WWL[n,d], and the wiring RWL[n,d] are connected to the memory cell MC[m,n,d]. That is, the semiconductor device in FIG. 10 includes the memory cells MC[1,1,1] to MC[m,n,d] that are arranged in three dimensions with the depth direction d.

Preferably, the wiring RBL1, the wiring RBL2, and the wiring WBL1 are provided every column in the depth direction d and connected to a bit line driver circuit 2630A. In other words, the memory cells MC[1,1] to MC[m,n] are treated as a unit of data access; i.e., the data width is m bits. The semiconductor device of this embodiment can be readily used not only for a general-purpose memory but also for a frame memory of a display device.

Note that the wiring RBL2 may be fixed at a given high potential. FIG. 10 illustrates an example where one end and the other end of the memory module 10 are connected to each other through the selection transistor DTr and the wiring WBL1. Shortening the wirings WBL1 can reduce variations of the memory modules 10 due to wiring resistance; thus, the data rewrite time can be shortened.

FIG. 11 illustrates a configuration of the memory cell array 2610 different from that in FIG. 10. In FIG. 11, wirings WBL2 electrically connected to the memory module 10 through the selection transistors DTr are further provided. In FIG. 10, the wirings WBL1 are connected in the vicinity of the memory modules 10, and the memory modules 10 are connected to the bit line driver circuit 2630A commonly through the wiring WBL1. FIG. 11 shows an example where the memory module 10 is connected to the bit line driver circuit 2630A through the wiring WBL1 or the wiring WBL2. The wirings WBL1 and/or the wirings WBL2 illustrated in FIG. 11 are preferably connected to the bit line driver circuit 2630A outside the memory cell array 2610. With such a configuration, the memory cell array 2610 can increase the data density of the semiconductor device, compared to the case using the configuration in FIG. 10.

FIG. 12 illustrates a configuration of the memory cell array 2610 different from that in FIG. 11. The memory cell array 2610 in FIG. 12 further includes selection transistors DTr1 and DTr2, a wiring RWL_D1, and a wiring RWL_D2. The wiring RBL2 is connected to the memory module 10 through the selection transistor DTr1. The wiring RBL1 is connected to the memory module 10 through the selection transistor DTr2. The wiring RWL_D2 is electrically connected to a gate of the selection transistor DTr1. The wiring RWL_D1 is electrically connected to a gate of the selection transistor DTr2. The selection transistor DTr1 can precharge the memory module 10 with a predetermined potential used for data reading. The selection transistors DTr2 can select the memory module 10 to be subjected to data reading. The wiring RBL1 through which data is read out can turn off the selection transistor DTr2 connected to an unselected memory module 10. Thus, the unselected memory module 10 can be isolated, resulting in higher signal quality of data that is read from the selected memory cell to the wiring RBL1. The selection transistor DTr2 is preferably provided particularly when data retained in the memory module 10 is analog data. As another example, the selection transistor DTr1 may be controlled to read data through the wiring RBL2. Note that the selection transistor DTr1 or the selection transistor DTr2 is provided as necessary.

In FIG. 12, one end of the memory module 10 is connected to the wiring WBL2 through the selection transistor DTr. The wiring WBL1 and the wiring RBL1 are connected to the bit line driver circuit 2630A. The wiring WBL2 and the wiring RBL2 are connected to a bit line driver circuit 2630B. Accordingly, data in the memory module 10 can be rewritten with a signal supplied from the bit line driver circuit 2630A to the wiring WBL1 and a signal supplied from the bit line driver circuit 2630B to the wiring WBL2.

<Examples of Structure and Manufacturing Method>

For easy understanding of the structure of the semiconductor device in this embodiment, a method for manufacturing the semiconductor device will be described below.

Figure 13A:
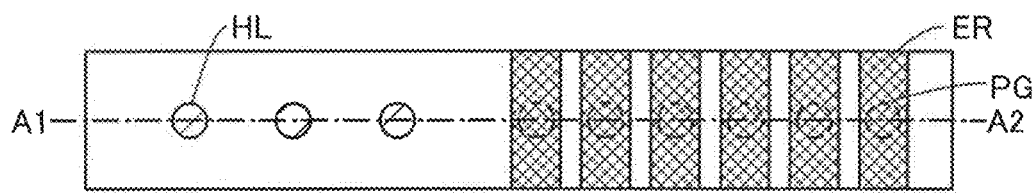
FIGS. 13A and 13B are a top view and a cross-sectional view illustrating a structure example of a semiconductor device.
Figure 13B:
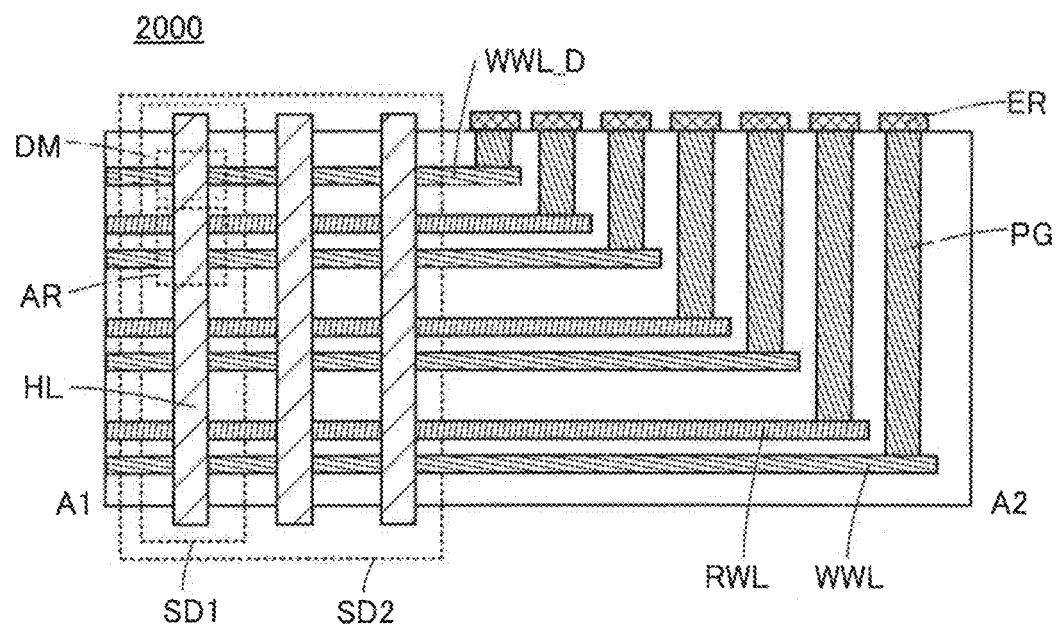

FIGS. 13A and 13B are schematic diagrams illustrating the semiconductor device shown in any of FIGS. 1A to 1C. FIG. 13A is a top view of the semiconductor device, and FIG. 13B is a cross-sectional view along the dash-dotted line A1-A2 in FIG. 13A.

The semiconductor device includes a structure body in which the wirings RWL, the wirings WWL, and insulators (regions without a hatching pattern in FIGS. 13A and 13B) are stacked; openings are provided in the structure body, and conductors PG are formed to fill the openings. Wirings ER are formed over the conductors PG, whereby each of the wirings ER is electrically connected to the wiring RWL or the wiring WWL.

Moreover, openings are formed in the structure body to penetrate the wirings RWL and the wirings WWL altogether. Insulators, conductors, and semiconductors are formed in each of the openings so that the selection transistor DTr and the memory cell MC are provided in a region DM and a region AR, respectively; the region DM penetrates the wiring WWL_D, and the region AR penetrates the wiring WWL and the wiring RWL. The conductor functions as the wiring WBL or the wiring RBL. The semiconductor functions as a channel formation region of the selection transistor DTr, the transistor WTr, or the transistor RTr. The region where the insulators, the conductors, and the semiconductors are formed in the opening is shown as a region HL in FIGS. 13A and 13B. Note that when the transistor included in the memory cell MC has a backgate, the conductor included in the region HL may function as the wiring BGL electrically connected to the backgate.

In other words, FIGS. 13A and 13B illustrate that the semiconductor device shown in any of FIGS. 1A to 1C is formed in a region SD1, and the semiconductor device shown in FIG. 2 or FIG. 6 is formed in a region SD2.

In the following Manufacturing method examples 1 and 2, methods for forming the memory cell MC in the region AR will be described.

«Manufacturing Method Example 1»

FIGS. 14A to 18B are cross-sectional views for illustrating an example of manufacturing the semiconductor device in FIG. 1C, and are specifically cross-sectional views of the transistor WTr and the transistor RTr in the channel length direction. In the cross-sectional views of FIGS. 14A to 18B, some components are not illustrated for simplification.

Figure 14A:
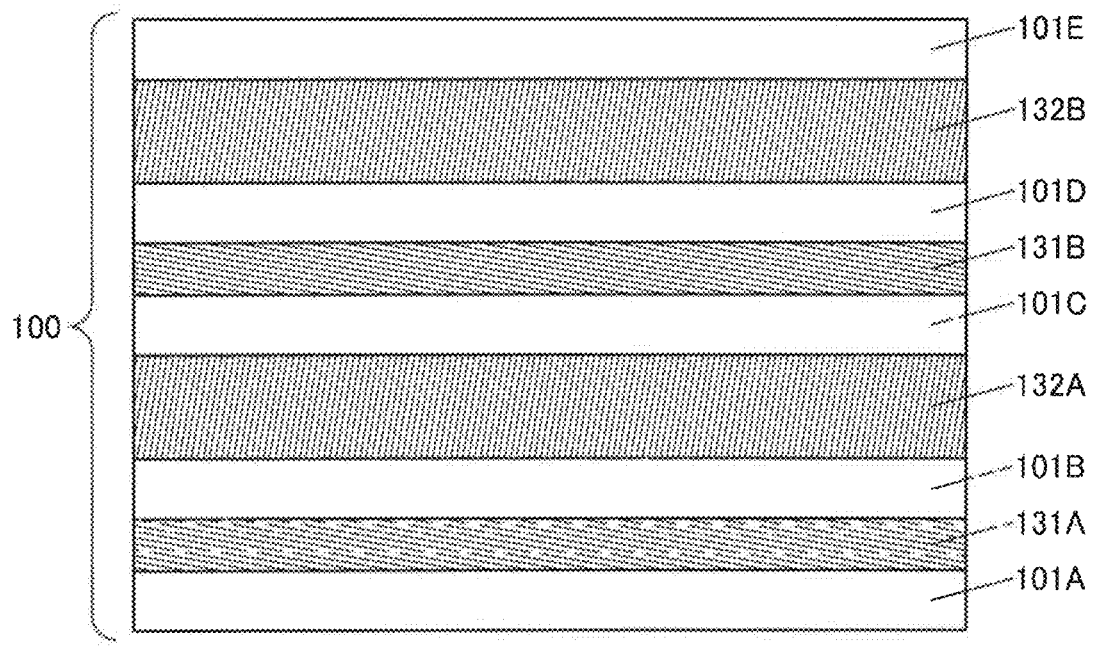
FIGS. 14A and 14B are cross-sectional views illustrating an example of manufacturing a semiconductor device.

As illustrated in FIG. 14A, the semiconductor device in FIG. 1C includes an insulator 101A over a substrate (not shown), a conductor 131A over the insulator 101A, an insulator 101B over the conductor 131A, a conductor 132A over the insulator 101B, an insulator 101C over the conductor 132A, a conductor 131B over the insulator 101C, an insulator 101D over the conductor 131B, a conductor 132B over the insulator 101D, and an insulator 101E over the conductor 132B. Note that a stack including these conductors and insulators is hereinafter referred to as a stack 100.

As the substrate, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Another example is a silicon on insulator (SOI) substrate in which an insulator region is provided in the above semiconductor substrate. Examples of the conductor substrate include a graphite substrate, a metal substrate, an alloy substrate, and a conductive resin substrate. Other examples are a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. As a method for providing a transistor over a flexible substrate, there is a method in which the transistor is formed over a non-flexible substrate and then the transistor is separated and transferred to the flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped; alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Thus, an impact applied to the semiconductor device over the substrate due to dropping or the like can be reduced. That is, a durable semiconductor device can be provided.

For the flexible substrate, a metal, an alloy, a resin, glass, or a fiber thereof can be used, for example. The flexible substrate preferably has a lower coefficient of linear expansion, in which case deformation due to an environment is suppressed. The flexible substrate is formed using, for example, a material with a coefficient of linear expansion of lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

In the manufacture example described in this embodiment, heat treatment is performed in the process; therefore, a material having high heat resistance and a low coefficient of thermal expansion is preferably used for the substrate.

The conductor 131A (the conductor 131B) functions as the wiring WWL in FIG. 1C. The conductor 132A (the conductor 132B) functions as the wiring RWL in FIG. 1C.

For the conductors 131A, 131B, 132A, and 132B, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium can be used, for example. Alternatively, a semiconductor having high electric conductivity, typified by polycrystalline silicon including an impurity element such as phosphorus, or silicide such as nickel silicide may be used.

For the above conductors, especially for the conductors 131A and 131B, a conductive material containing oxygen and a metal element included in a metal oxide usable for after-mentioned semiconductors 151, 152, 153a, and 153b may be used. A conductive material containing the metal element mentioned above and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. Using such a material sometimes allows capture of hydrogen entering from an insulator or the like around the conductor.

For the above conductors, especially for the conductors 132A and 132B, it is preferable to use a conductive material having a function of preventing the passage of impurities such as water or hydrogen. For example, tantalum, tantalum nitride, titanium, titanium nitride, ruthenium, ruthenium oxide, or the like is preferably used, and a single layer or stacked layers can be used.

A stack including a plurality of conductors formed with any of the above materials may be used. For example, a layered structure using a combination of a material including any of the metal elements listed above and a conductive material including oxygen may be used. A layered structure using a combination of a material including any of the metal elements listed above and a conductive material including nitrogen may be used. A layered structure using a combination of a material including any of the above metal elements, a conductive material including oxygen, and a conductive material including nitrogen may be used. When an insulator including an excess-oxygen region is used as the insulator in contact with the conductor, oxygen sometimes diffuses into a region of the conductor in contact with the insulator. Thus, a layered structure using a combination of a material including the metal element and a conductive material including oxygen can be formed. Similarly, when an insulator including an excess-nitrogen region is used as the insulator in contact with the conductor, nitrogen sometimes diffuses into a region of the conductor in contact with the insulator. Thus, a layered structure using a combination of a material including the metal element and a conductive material including nitrogen can be formed.

The conductors 131A, 131B, 132A, and 132B may be the same material or different materials. That is, materials for the conductors 131A, 131B, 132A, and 132B included in the semiconductor device of one embodiment of the present invention can be selected as appropriate.

Each of the insulators 101A to 101E is preferably a material with a low concentration of impurities such as water or hydrogen. The amount of hydrogen released from the insulators 101A to 101E, which is converted into hydrogen molecules per unit area of one of the insulators 101A to 101E, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) with a film surface temperature ranging from 50° C. to 500° C., for example. The insulators 101A to 101E may be formed using an insulator from which oxygen is released by heating. In that case, the conductors 131A, 131B, 132A, and 132B can have a layered structure using a combination of a material including the metal element and a conductive material including oxygen, as described above.

Each of the insulators 101A to 101E can have a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum, for instance. For example, a material containing silicon oxide or silicon oxynitride can be used.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

Figure 14B:
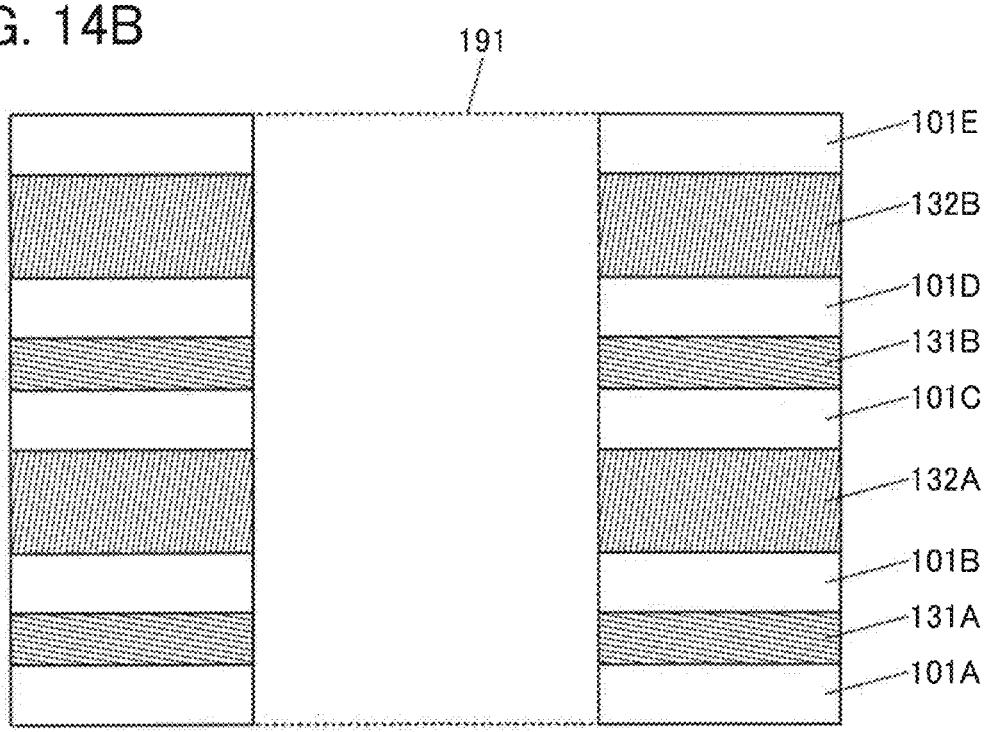

In the next step, as illustrated in FIG. 14B, an opening 191 is formed in the stack 100 of FIG. 14A through resist mask formation and etching treatment, or the like.

The resist mask can be formed by a lithography method, a printing method, an inkjet method, or the like as appropriate. Formation of the resist mask by an inkjet method needs no photomask; thus, manufacturing cost can be reduced. For the etching treatment, either a dry etching method or a wet etching method or both of them may be used.

Figure 15A:
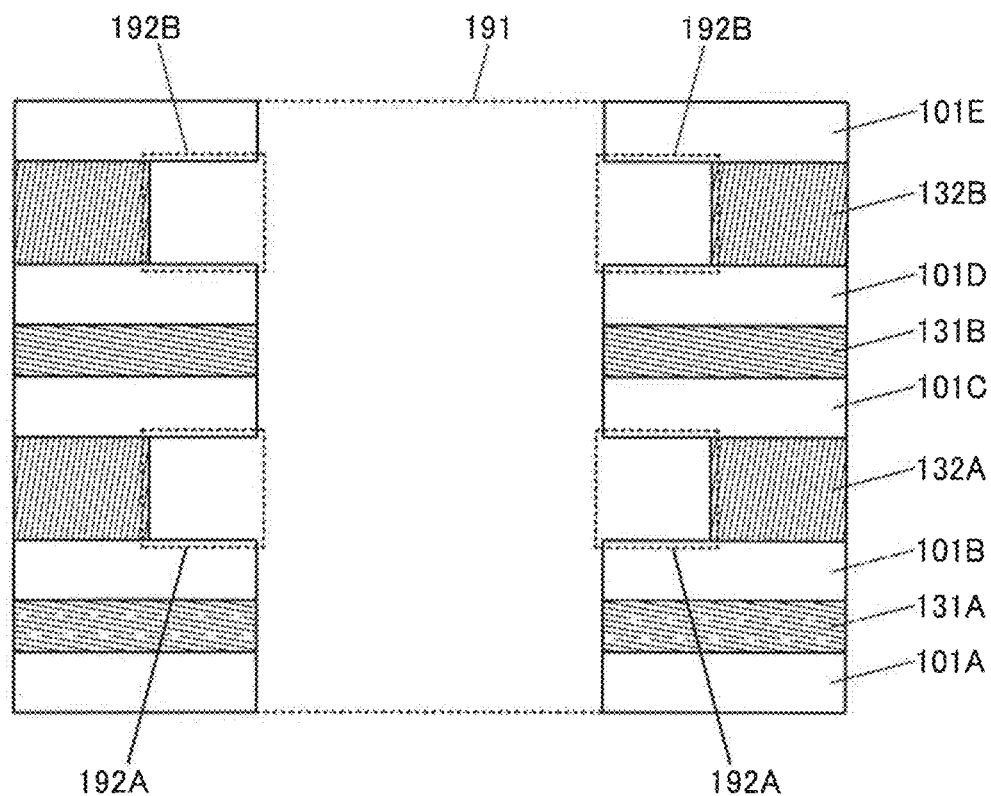
FIGS. 15A and 15B are cross-sectional views illustrating an example of manufacturing a semiconductor device.

Then, as illustrated in FIG. 15A, the conductor 132A (the conductor 132B) on a side surface of the opening 191 is removed by etching treatment or the like, and a recess portion 192A (a recess portion 192B) is formed on the side surface of the opening 191. Here, a material for the conductor 132A (the conductor 132B) is selected such that the conductor 132A (the conductor 132B) is selectively removed in the stack 100, i.e., such that the conductor 132A (the conductor 132B) has a higher etching rate than the insulators 101A to 101E and the conductor 131A (the conductor 131B).

Alternatively, the recess portion 192A (the recess portion 192B) may be formed as follows: in the step of manufacturing the semiconductor device in FIG. 14A, a sacrificial layer is provided in a region where the opening 191 and the recess portion 192A (the recess portion 192B) are to be formed, and then the opening 191 and the recess portion 192A (the recess portion 192B) are formed together in the step of manufacturing the semiconductor device in FIG. 14B. Alternatively, the recess portion 192A (the recess portion 192B) may be formed by itself when the opening 191 is formed without a sacrificial layer.

Figure 15B:
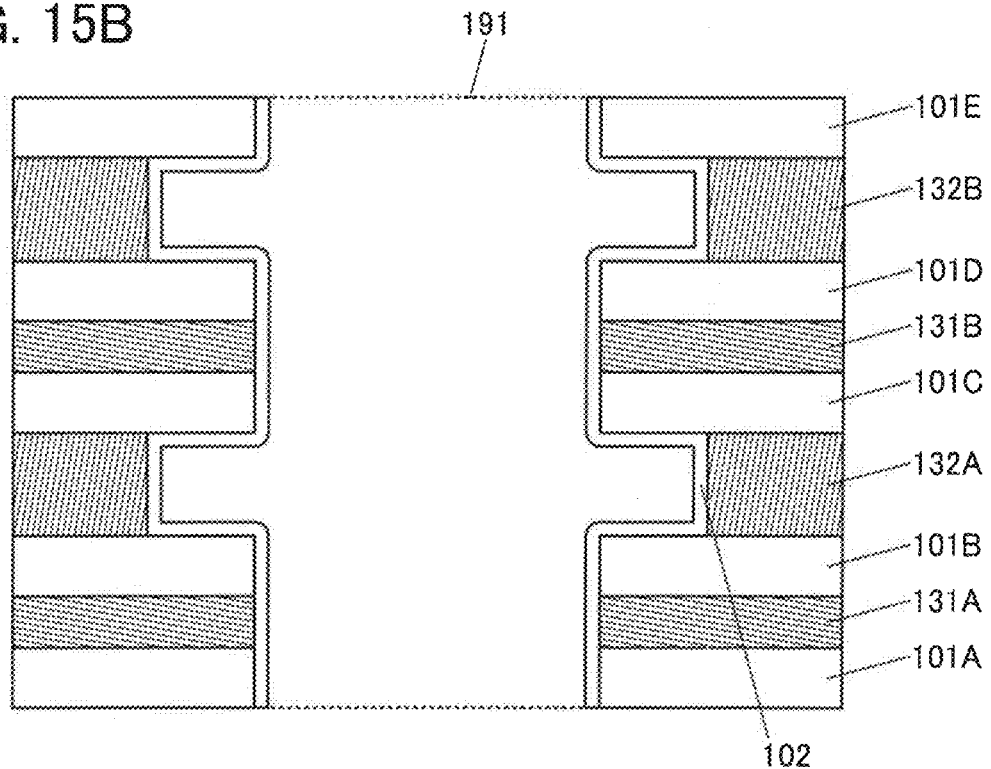

In the subsequent step, as illustrated in FIG. 15B, an insulator 102 is deposited in the recess portions and on the side surface of the opening 191 shown in FIG. 15A.

For the insulator 102, it is preferable to use an insulating material having a function of inhibiting the passage of oxygen. For example, silicon nitride, silicon nitride oxide, silicon oxynitride, aluminum nitride, or aluminum nitride oxide is preferably used for the insulator 102. The formation of such an insulator 102 can prevent a reduction in conductivity of a conductor 133 (described later) due to oxidation of the conductor 133 caused when oxygen enters the conductor 133 through the insulator 102.

Figure 16A:
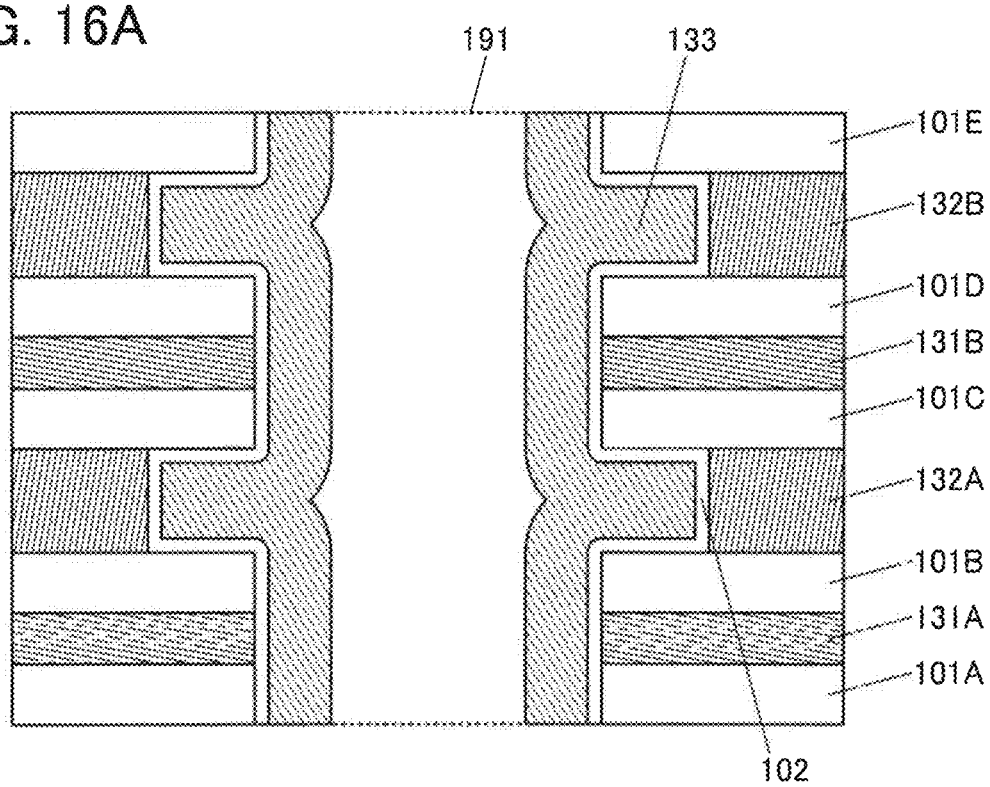
FIGS. 16A and 16B are cross-sectional views illustrating an example of manufacturing a semiconductor device.

In the next step, as illustrated in FIG. 16A, the conductor 133 is deposited in the recess portions and on the side surface of the opening 191 shown in FIG. 15B. That is, the conductor 133 is formed on the insulator 102.

For the conductor 133, any of the above materials usable for the conductors 131A, 131B, 132A, and 132B can be used. In particular, a material with high conductivity among the above materials is preferably used for the conductor 133.

Figure 16B:
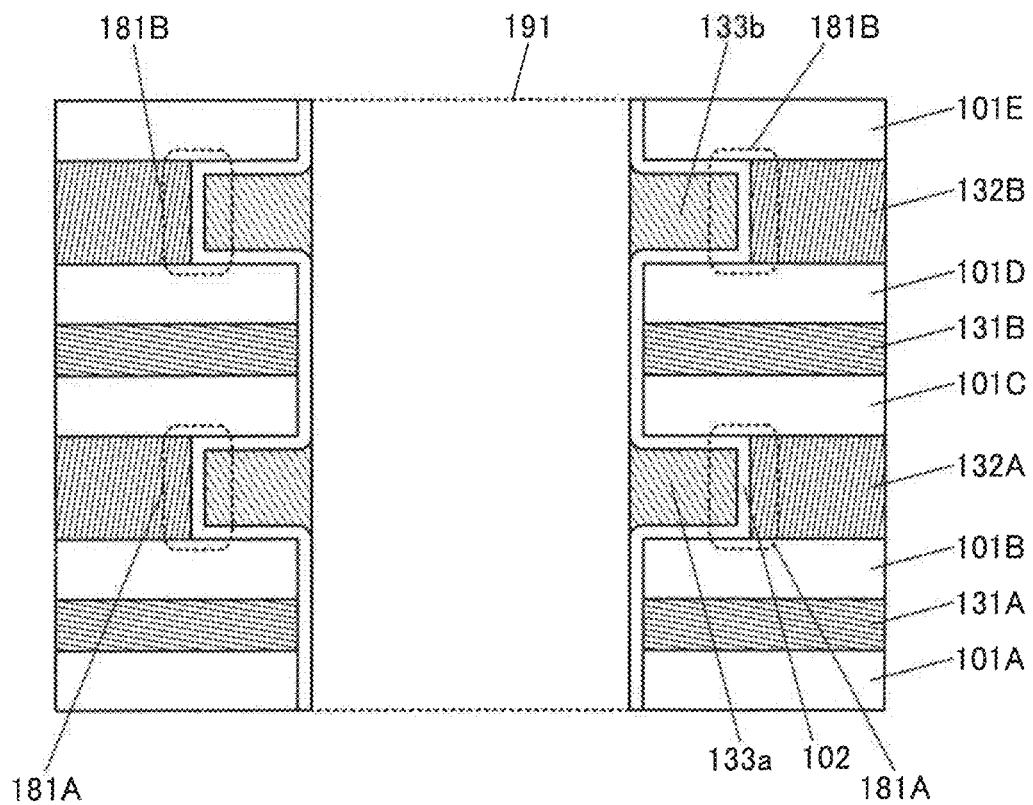

In the subsequent step, as illustrated in FIG. 16B, the conductor 133 positioned in the opening 191 is removed by resist mask formation and etching treatment or the like so that only the conductor 133 in the recess portions remains. Thus, a conductor 133a and a conductor 133b are formed. Note that at this time, part of the insulator 102 may be removed as long as the insulators 101A to 101E and the conductors 131A and 131B are not exposed at the opening 191.

Note that the description of FIG. 14B is referred to for the resist mask formation and etching treatment.

The conductor 133a (the conductor 133b) functions as the other electrode of the capacitor CS in FIG. 1C. That is, the capacitor CS is formed in a region 181A (a region 181B) illustrated in FIG. 16B.

Figure 17A:
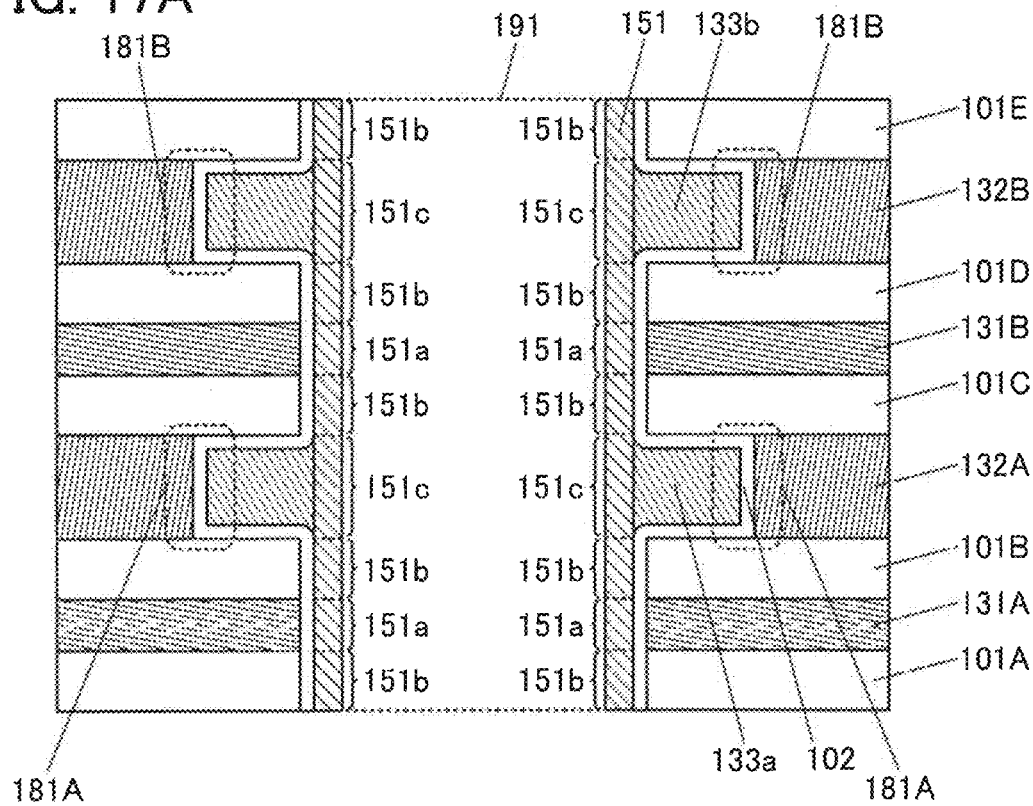
FIGS. 17A and 17B are cross-sectional views illustrating an example of manufacturing a semiconductor device.

In the next step, as illustrated in FIG. 17A, a semiconductor 151 is deposited on the insulator 102, the conductor 133a, and the conductor 133b that are positioned on the side surface of the opening 191.

For the semiconductor 151, a material containing a metal oxide described in Embodiment 3 is preferably used.

When the semiconductor 151 contains a metal oxide, the insulator 102 in contact with the semiconductor 151 is preferably an insulating material having a function of inhibiting the passage of impurities such as water or hydrogen in addition to oxygen. The formation of such an insulator 102 can prevent impurities such as water or hydrogen from entering the semiconductor 151 through the insulator 102 and becoming water by reaction with oxygen included in the semiconductor 151. If water is produced in the semiconductor 151, an oxygen vacancy may be formed in the semiconductor 151. When impurities such as hydrogen enter the oxygen vacancy, an electron serving as a carrier may be generated. Consequently, if the semiconductor 151 has a region containing a large amount of hydrogen, a transistor including the region in its channel formation region is likely to have normally-on characteristics. To prevent this, the insulator 102 is preferably an insulating material with a function of inhibiting the passage of impurities such as water or hydrogen as well as oxygen.

The conductivity of the semiconductor 151 containing a metal oxide may vary depending on regions where the semiconductor 151 is formed. In FIG. 17A, among the regions where the semiconductor 151 is formed, regions in contact with the insulator 102 are shown as a region 151a and a region 151b, and a region in contact with the conductor 133a (the conductor 133b) is shown as a region 151c. Specifically, the region 151a overlaps the side surface of the conductor 131A (the conductor 131B), and the region 151b overlaps the side surface of the insulator 101A (the insulators 101B to 101E). Since the region 151c is in contact with the conductor 133a (the conductor 133b), impurities such as hydrogen or water included in the conductor 133a (the conductor 133b) may diffuse into the region 151c. As described above, an electron serving as a carrier may be generated when impurities such as water or hydrogen diffuse into the semiconductor 151; hence, the resistance of the region 151c may be lowered. For that reason, the region 151c has higher conductivity than the regions 151a and 151b.

The region 151a serves as a channel formation region of the transistor. Thus, the resistance of the region 151a is lowered when the transistor is on; therefore, the region 151a has higher conductivity than the region 151b.

Figure 17B:
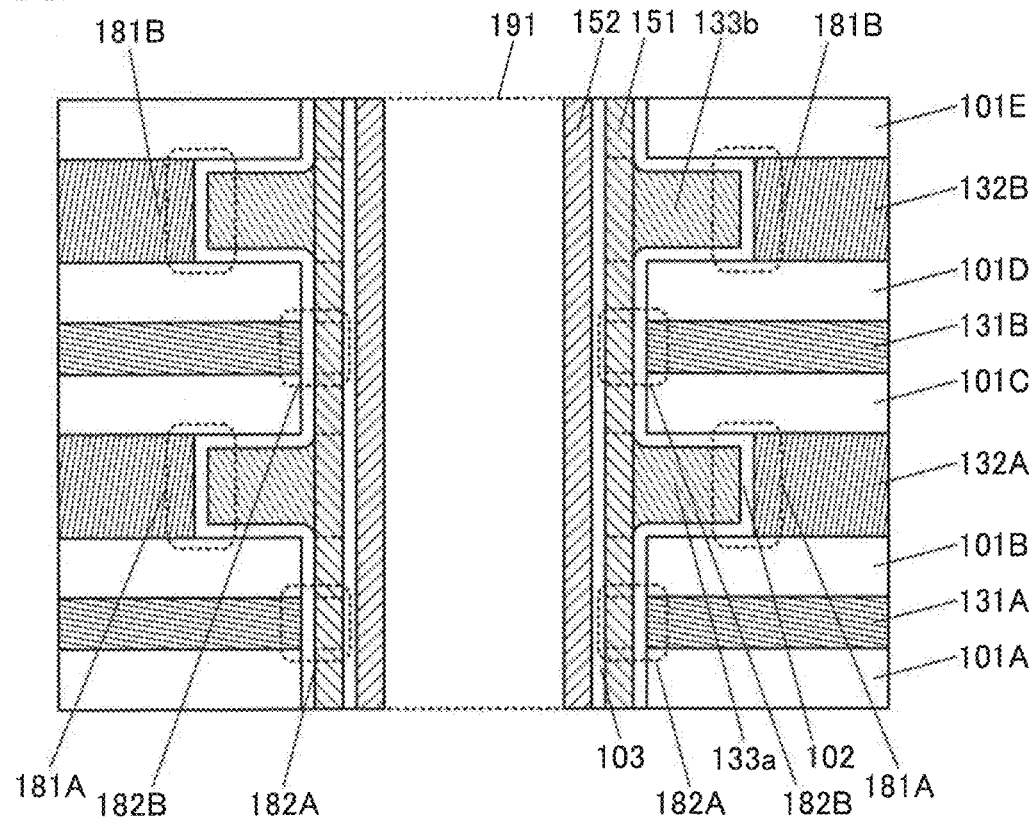

In the subsequent step, as illustrated in FIG. 17B, an insulator 103 and a semiconductor 152 are sequentially deposited on the semiconductor 151 on the side surface of the opening 191.

For the insulator 103, any of the above materials usable for the insulator 102 can be used. Particularly when the semiconductor 151 contains a metal oxide, the insulator 103 is preferably an insulating material having a function of inhibiting the passage of impurities such as water or hydrogen in addition to oxygen.

In a region 182A (a region 182B) illustrated in FIG. 17B, the transistor WTr in FIG. 1C is formed. Specifically, in the region 182A (the region 182B), the region 151a of the semiconductor 151 functions as the channel formation region of the transistor WTr, two regions 151b of the semiconductor 151 function as the source electrode and the drain electrode of the transistor WTr, and the conductor 132A functions as the gate electrode of the transistor WTr. When a material containing a metal oxide is used for the semiconductor 151, the transistor WTr is an oxide semiconductor (OS) transistor.

For the semiconductor 152, a material containing the metal oxide described in Embodiment 3 can be used as in the case of the semiconductor 151. Moreover, the semiconductor 152 can be replaced with a semiconductor material such as polycrystalline silicon or amorphous silicon.

Figure 18A:
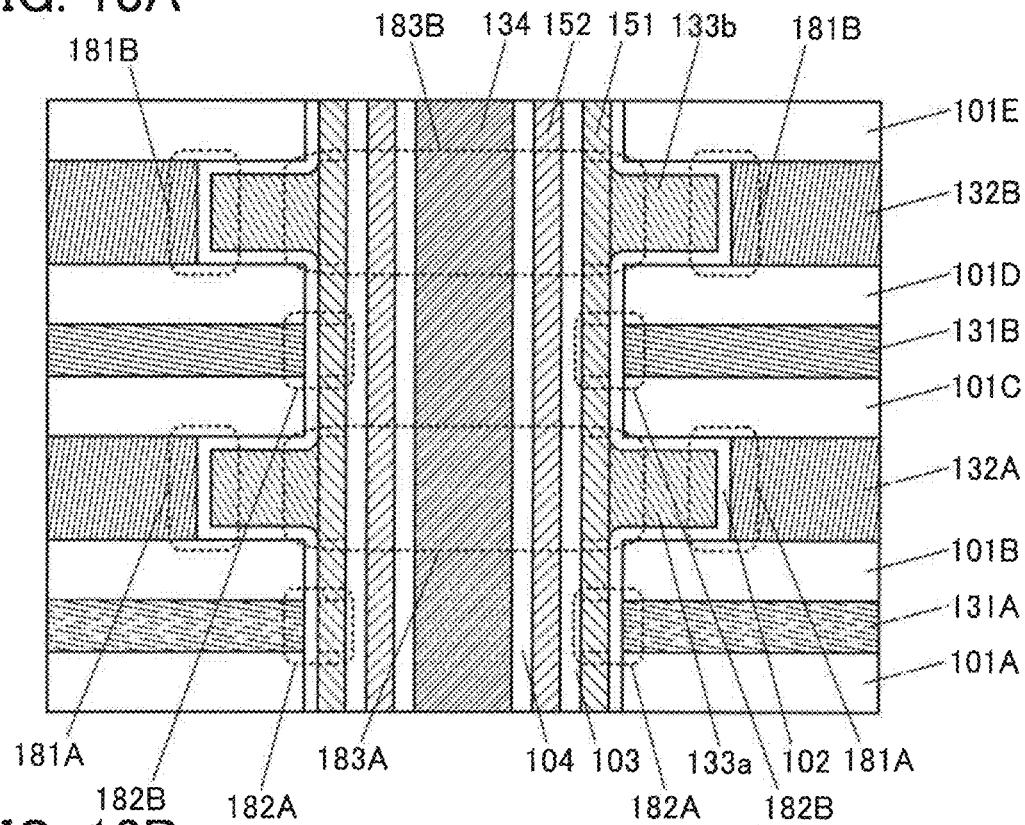
FIGS. 18A and 18B are cross-sectional views illustrating an example of manufacturing a semiconductor device.

In the next step, as illustrated in FIG. 18A, an insulator 104 is deposited on the semiconductor 152, and a conductor 134 is deposited to fill the remaining opening 191.

For the insulator 104, any of the materials usable for the insulator 102 and the insulator 103 can be used.

For the conductor 134, any of the materials usable for the conductors 131A, 131B, 132A, 132B, 133a, and 133b can be used.

In a region 183A (a region 183B) illustrated in FIG. 18A, the transistor RTr in FIG. 1C is formed. Specifically, in the region 183A (the region 183B), the region 151c and two regions 151b of the semiconductor 151 and the conductor 133a (the conductor 133b) function as the gate electrode of the transistor RTr, the semiconductor 152 functions as the channel formation region of the transistor RTr, and the conductor 134 functions as a backgate electrode of the transistor RTr. When the semiconductor 152 is a material containing a metal oxide, the transistor RTr is an OS transistor.

Through the steps from FIG. 14A to FIG. 18A, the semiconductor device illustrated in FIG. 1C can be manufactured.

One embodiment of the present invention is not limited to the structure example of the semiconductor device illustrated in FIG. 18A. In one embodiment of the present invention, the structure of the semiconductor device in FIG. 18A can be appropriately changed depending on the circumstances or conditions or as needed.

Figure 18B:
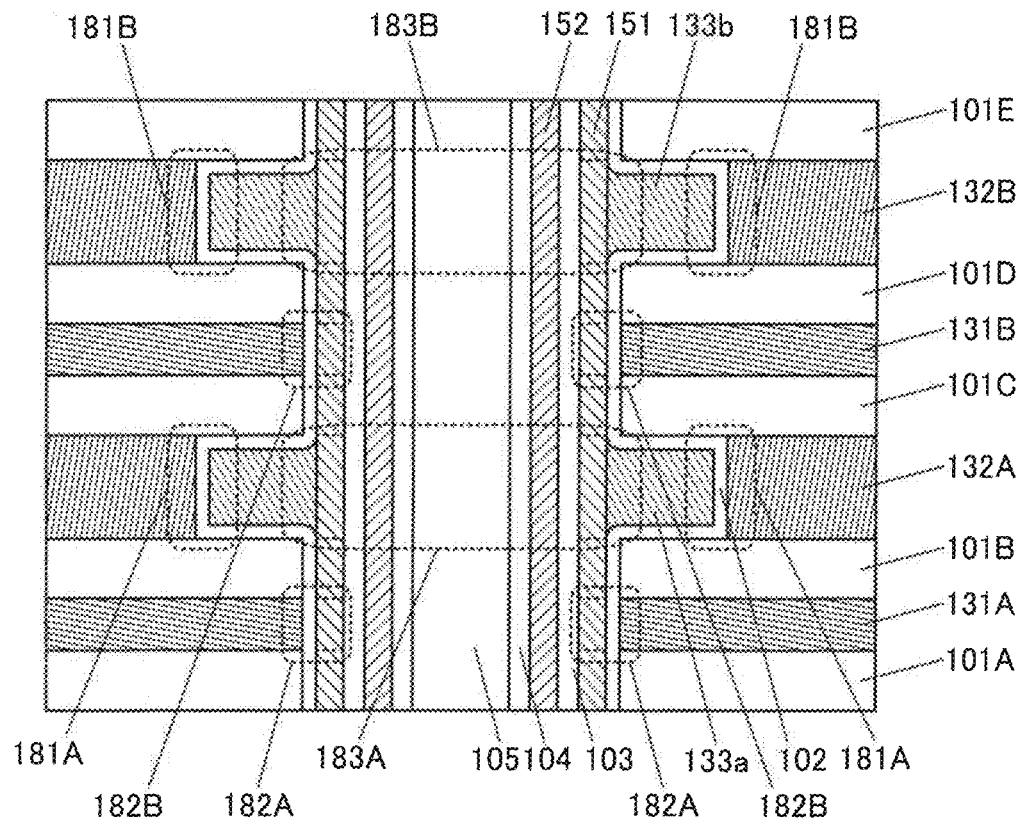

For example, as described above, one embodiment of the present invention can be a semiconductor device in which the transistor WTr and the transistor RTr are not provided with a backgate as illustrated in FIG. 1A. To manufacture the semiconductor device in FIG. 1A, a step shown in FIG. 18B instead of the step shown in FIG. 18A is performed in the process of manufacturing the semiconductor device in FIG. 1C. FIG. 18B illustrates a step for depositing an insulator 105, instead of the conductor 134 in FIG. 18A, to fill the opening 191. For the insulator 105, a material usable for the insulator 104 can be used, for example.

Figure 19A:
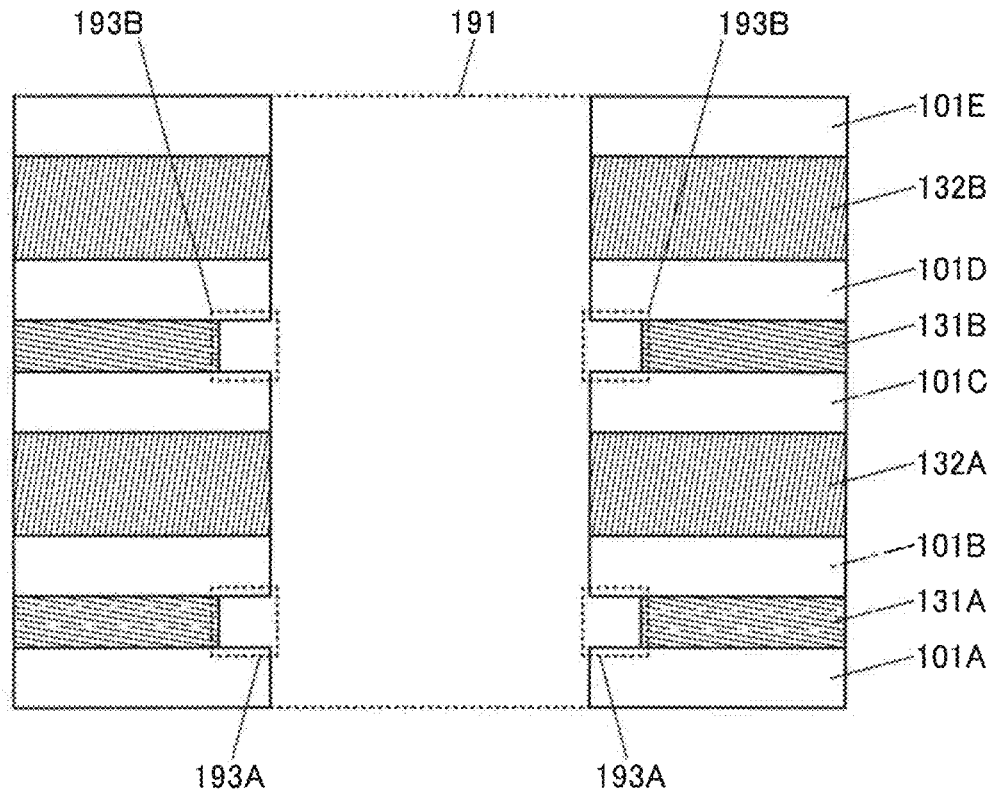
FIGS. 19A and 19B are cross-sectional views illustrating an example of manufacturing a semiconductor device.

As another example, in one embodiment of the present invention, the structure of the gate electrode of the transistor WTr can be changed from that in FIG. 18A in order to improve the switching characteristics of the transistor WTr. FIGS. 19A and 19B and FIGS. 20A and 20B illustrate an example of a method for manufacturing such a semiconductor device. FIG. 19A illustrates a step of removing the conductor 131A (the conductor 131B) on the side surface of the opening 191 in the state of FIG. 14B and forming a recess portion 193A (a recess portion 193B). Here, a material for the conductor 131A (the conductor 131B) is selected such that the conductor 131A (the conductor 131B) is selectively removed in the stack 100, i.e., such that the conductor 131A (the conductor 131B) has a higher etching rate than the insulators 101A to 101E and the conductor 132A (the conductor 132B).

Alternatively, the recess portion 193A (the recess portion 193B) may be formed as follows: in the step of manufacturing the semiconductor device in FIG. 14A, a sacrificial layer is provided in a region where the opening 191 and the recess portion 193A (the recess portion 193B) are to be formed, and then the opening 191 and the recess portion 193A (the recess portion 193B) are formed together in the step of manufacturing the semiconductor device in FIG. 14B. Alternatively, the recess portion 193A (the recess portion 193B) may be formed by itself when the opening 191 is formed without a sacrificial layer.

Figure 19B:
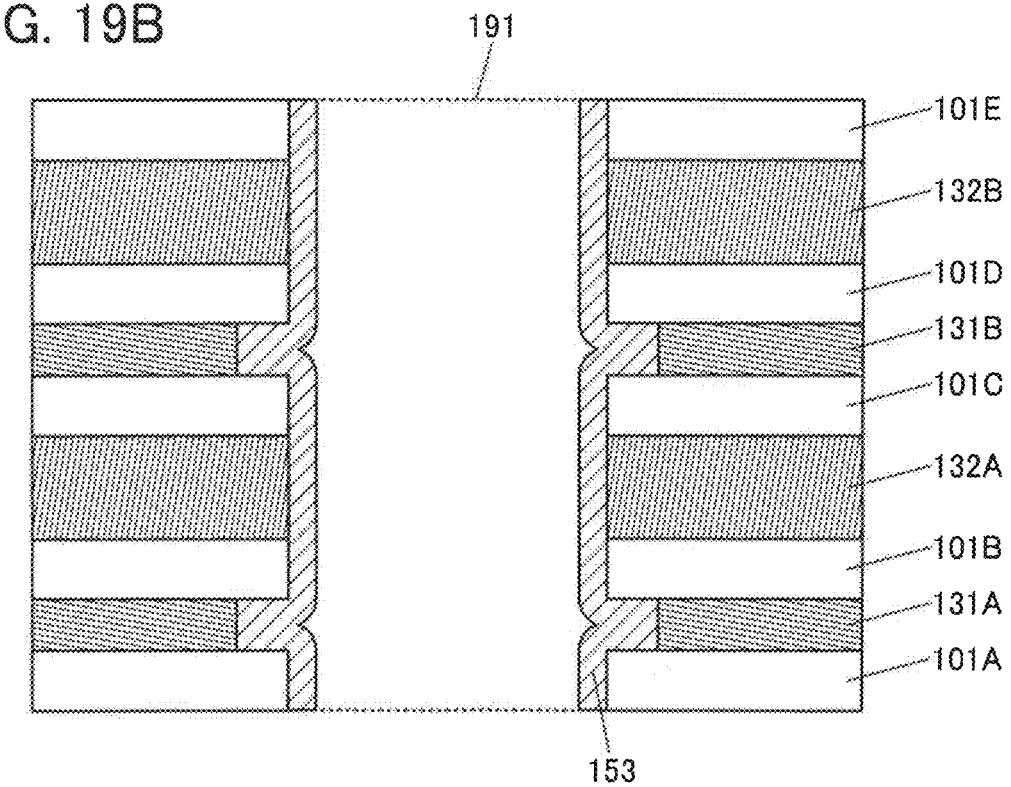

In the subsequent step, as illustrated in FIG. 19B, a semiconductor 153 is deposited in the recess portion 193A (the recess portion 193B) and on the side surface of the opening 191 shown in FIG. 19A.

For the semiconductor 153, a material containing the metal oxide described in Embodiment 3 is used.

Figure 20A:
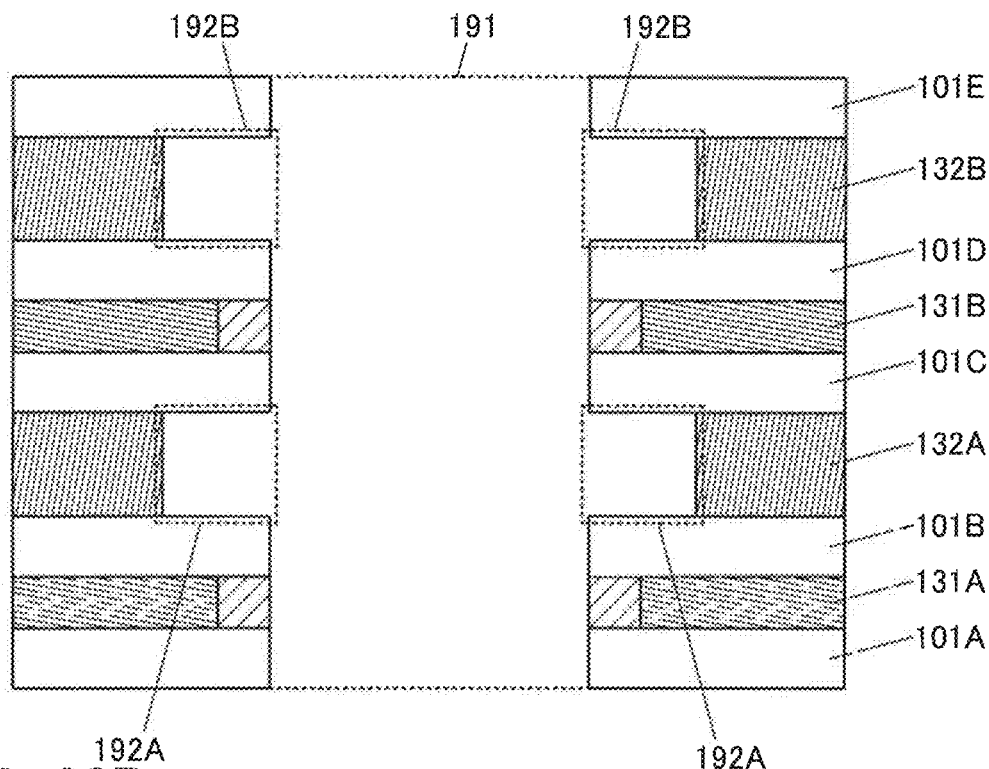
FIGS. 20A and 20B are cross-sectional views illustrating an example of manufacturing a semiconductor device.
Figure 20B:
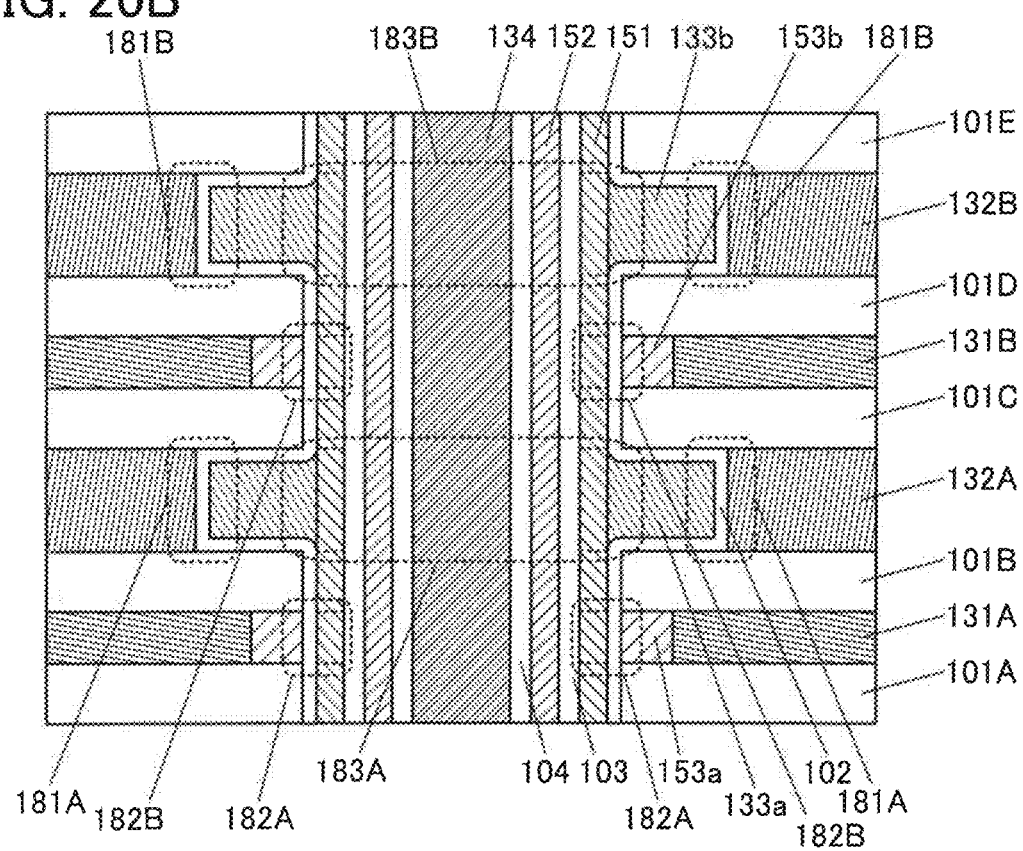

In the subsequent step, as illustrated in FIG. 20A, the semiconductor 153 positioned in the opening 191 is removed by resist mask formation and etching treatment or the like so that only the semiconductor 153 in the recess portion 193A (the recess portion 193B) remains, and the semiconductor 153a (the semiconductor 153b) is formed. At the same time as or after this process, etching treatment is performed so that the conductor 132A (the conductor 132B) is removed to form the recess portion 192A (the recess portion 192B).

Next, as in the step of FIG. 16B, the insulator 102 is formed on the side surface of the opening 191 so as to cover the semiconductor 153a (the semiconductor 153b). When a material containing a metal oxide is used for the semiconductor 153a (the semiconductor 153b), by the contact between the semiconductor 153a (the semiconductor 153b) and the insulator 102, impurities such as hydrogen or water included in the insulator 102 are diffused into the semiconductor 153a (the semiconductor 153b). Moreover, by the contact between the semiconductor 153a and the conductor 133a (between the semiconductor 153b and the conductor 133b), impurities such as hydrogen or water included in the conductor 133a (the conductor 133b) are diffused into the semiconductor 153a (the semiconductor 153b). That is, the semiconductor 153a (the semiconductor 153b) has a function of capturing impurities such as hydrogen or water. Thus, the resistance of the semiconductor 153a (the semiconductor 153b) is lowered, and the semiconductor 153a (the semiconductor 153b) can function as the gate electrode of the transistor WTr. Subsequently, the same steps as in FIGS. 17A, 17B, and 18A are performed, whereby the semiconductor device illustrated in FIG. 20B can be completed.

Figure 21A:
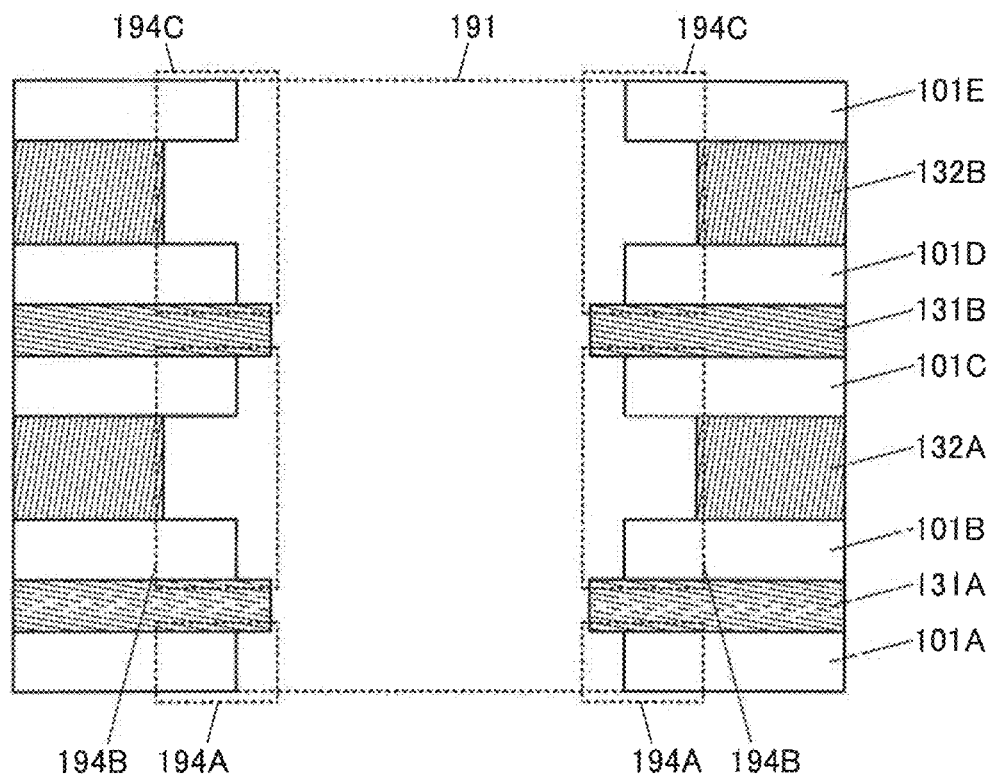
FIGS. 21A and 21B are cross-sectional views illustrating an example of manufacturing a semiconductor device.
Figure 21B:
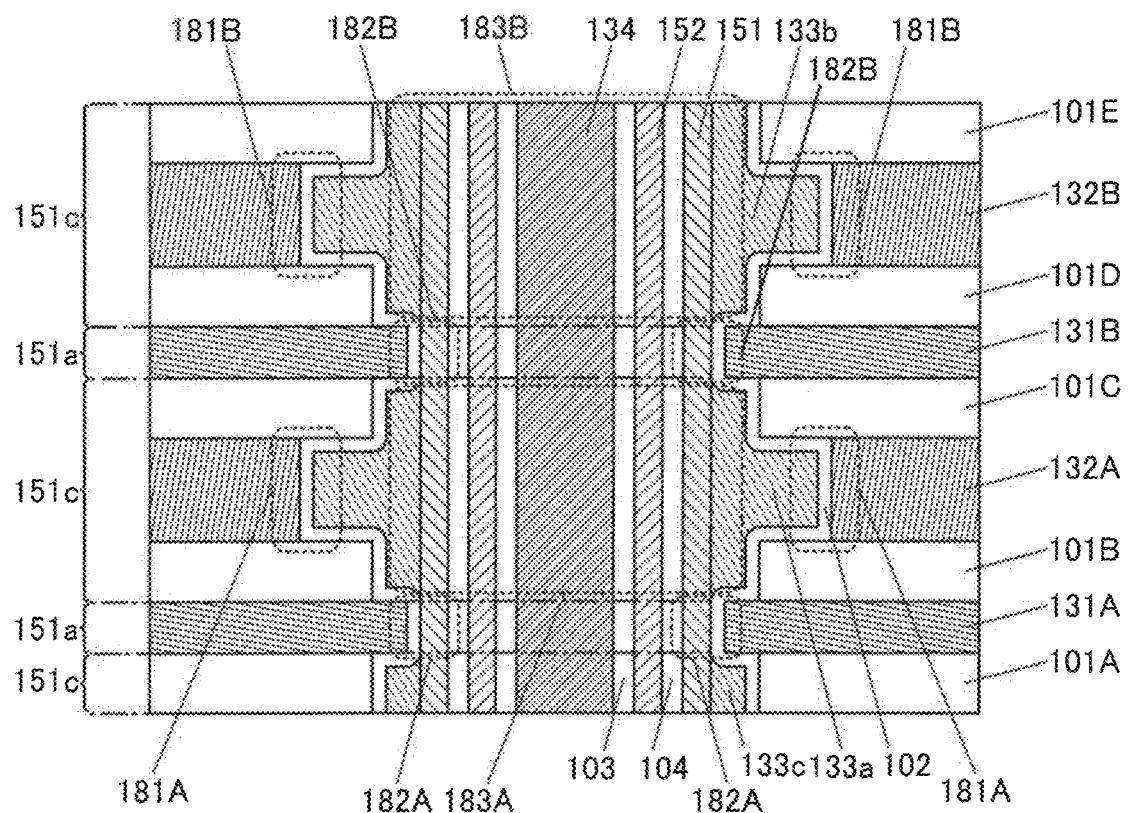

As another example, in one embodiment of the present invention, the structure of the gate electrode of the transistor RTr can be changed from that in FIG. 18A in order to reduce the electrical resistance between the gate electrode of the transistor RTr and the first or second terminal of the transistor WTr in FIG. 1C. FIGS. 21A and 21B illustrate an example of a method for manufacturing such a semiconductor device. FIG. 21A illustrates a step of removing the insulators 101A to 101E as well as the conductor 132A (the conductor 132B) on the side surface of the opening 191 in the state of FIG. 15A and forming a recess portion 194B (recess portions 194A and 194C). Here, materials for the conductor 132A (the conductor 132B) and the insulators 101A to 101E are selected such that the conductor 132A (the conductor 132B) and the insulators 101A to 101E are selectively removed in the stack 100, i.e., such that the conductor 132A (the conductor 132B) and the insulators 101A to 101E have a higher etching rate than the conductor 131A (the conductor 131B).

Alternatively, the recess portion 194B (the recess portions 194A and 194C) may be formed as follows: in the step of manufacturing the semiconductor device in FIG. 14A, a sacrificial layer is provided in a region where the opening 191 and the recess portion 194B (the recess portions 194A and 194C) are to be formed, and then the opening 191 and the recess portion 194B (the recess portions 194A and 194C) are formed together in the step of manufacturing the semiconductor device in FIG. 14B. Alternatively, the recess portion 194B (the recess portions 194A and 194C) may be formed by itself when the opening 191 is formed without a sacrificial layer.

In FIG. 21A, in the recess portion 194B (the recess portions 194A and 194C), the conductor 132A (the conductor 132B) is removed deeper than the insulators 101B and 101C (the insulator 101A, the insulators 101D and 101E); alternatively, the insulators 101B and 101C (the insulator 101A, the insulators 101D and 101E) may be removed deeper than the conductor 132A (the conductor 132B). Moreover, the insulators 101B and 101C (the insulator 101A, the insulators 101D and 101E) and the conductor 132A (the conductor 132B) may be formed to have the same depth.

FIG. 21B illustrates a structure example of the semiconductor device manufactured through the step in FIG. 21A. After the step in FIG. 21A, the conductor 133 is deposited so as to fill the recess portion 194B (the recess portions 194A and 194C), whereby the gate electrode of the transistor RTr is formed. FIG. 21B shows the conductor 133a, the conductor 133b, and a conductor 133c that function as the gate electrode of the transistor RTr. Subsequently, the same steps as in FIGS. 17A, 17B, and 18A are performed, so that the semiconductor device in FIG. 21B can be completed. In this semiconductor device, the contact area between the semiconductor 151 and the conductor 133a (the conductor 133b) is larger than that in the semiconductor device of FIG. 18A. When a material containing a metal oxide is used for the semiconductor 151 in the semiconductor device of FIG. 21B, the electrical resistance between the first or second terminal of the transistor WTr and the gate of the transistor RTr can be reduced because the semiconductor device does not include the region 151b shown in FIG. 18A.

«Manufacturing Method Example 2»

Here, a structure example of the semiconductor device in this embodiment that is different from that in Manufacturing method example 1 will be described with reference to FIGS. 22A and 22B, FIGS. 23A and 23B, and FIGS. 24A and 24B.

Like FIGS. 14A to 18B, FIGS. 22A to 24B are cross-sectional views for illustrating an example of manufacturing the semiconductor device in FIG. 1C, and are specifically cross-sectional views of the transistor WTr and the transistor RTr in the channel length direction. In the cross-sectional views of FIGS. 22A to 24B, some components are not illustrated for simplification, as in FIGS. 14A to 18B.

The description for FIGS. 14A to 15B in Manufacturing method example 1 is referred to for the first steps.

A step illustrated in FIG. 22A is subsequent to the step in FIG. 15B. In FIG. 22A, the semiconductor 151 is deposited in the recess portions and on the side surface of the opening 191 shown in FIG. 15B. That is, the semiconductor 151 is formed on the insulator 102.

For the semiconductor 151, a semiconductor described in Embodiment 3 is preferably used.

In the next step, as illustrated in FIG. 22B, the conductor 133 is deposited in the recess portions and on the side surface of the opening 191 shown in FIG. 22A.

The description of the conductor 133 in Manufacturing method example 1 is referred to for the conductor 133.

Figure 23A:
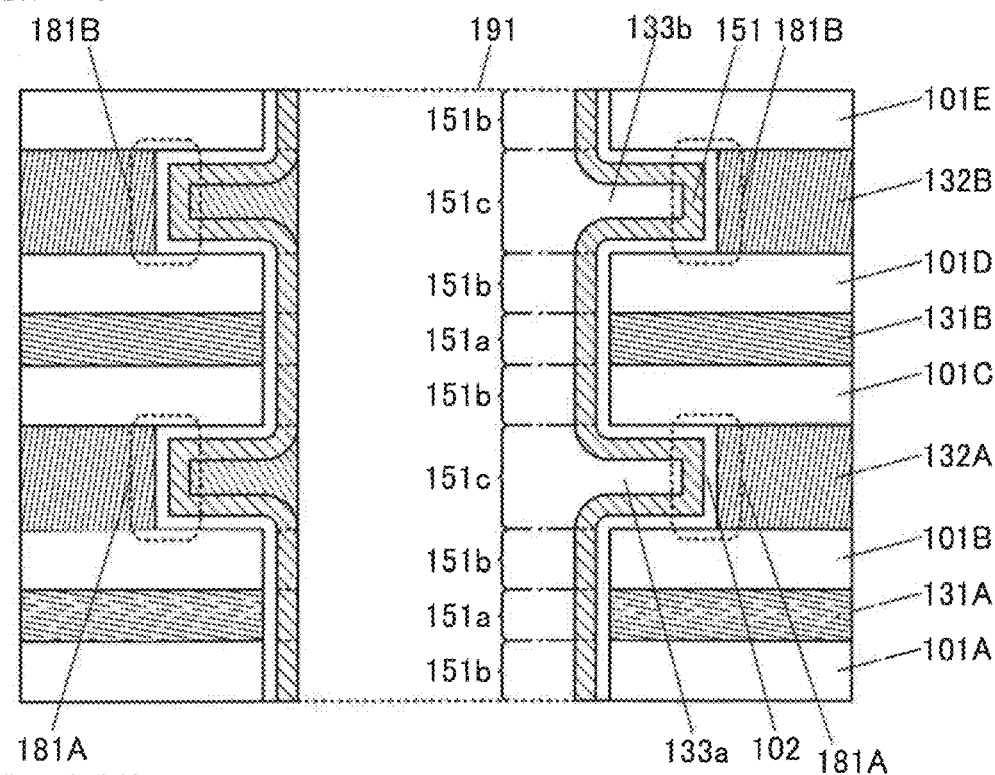
FIGS. 23A and 23B are cross-sectional views illustrating an example of manufacturing a semiconductor device.

In the subsequent step, as illustrated in FIG. 23A, the conductor 133 positioned in the opening 191 is removed by resist mask formation and etching treatment or the like so that only the conductor 133 in the recess portions remains. Thus, the conductor 133a and the conductor 133b are formed. Note that at this time, part of the semiconductor 151 may be removed as long as the insulator 102 is not exposed at the opening 191.

Note that the description of FIG. 14B is referred to for the resist mask formation and etching treatment.

The conductor 133a (the conductor 133b) functions as the other electrode of the capacitor CS in FIG. 1C. That is, the capacitor CS is formed in the region 181A (the region 181B) illustrated in FIG. 23A.

The description of the semiconductor 151 in Manufacturing method example 1 is referred to for the semiconductor 151. When the semiconductor 151 contains a metal oxide, the semiconductor 151 can be divided into the region 151a, the region 151b, and the region 151c. The description of the regions 151a, 151b, and 151c in Manufacturing method example 1 is referred to for the regions 151a, 151b, and 151c.

Figure 23B:
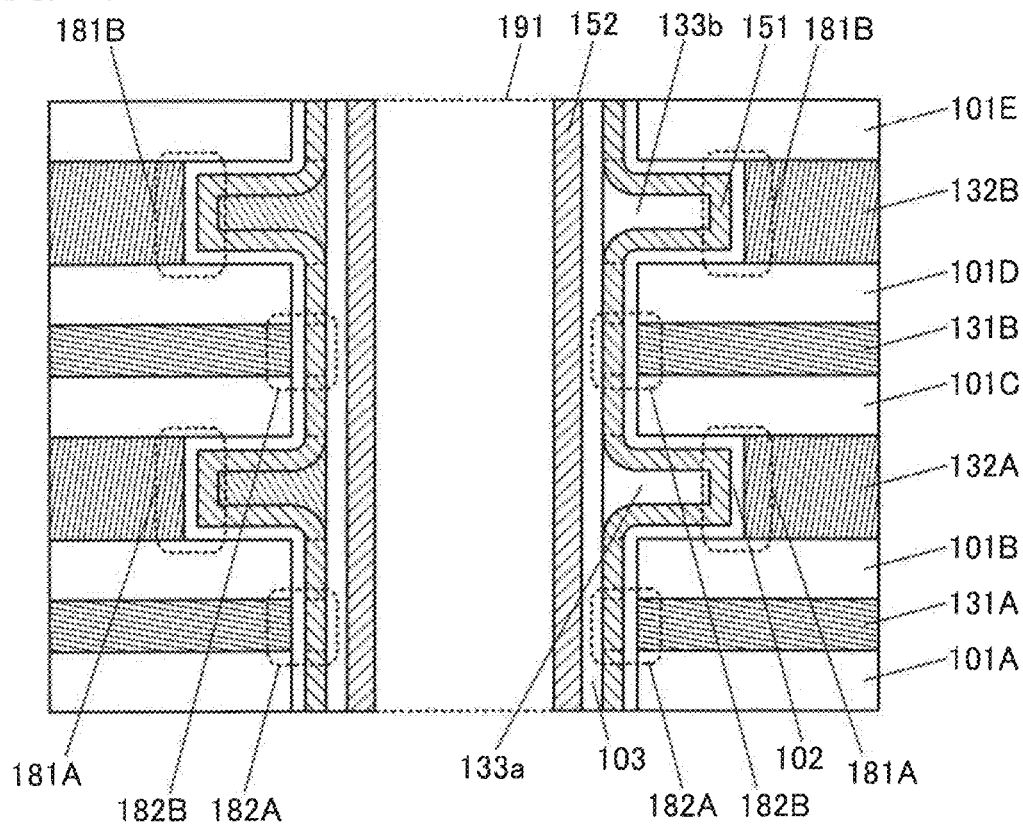

In the next step, as illustrated in FIG. 23B, the insulator 103 is deposited on the conductor 133a, the conductor 133b, and the semiconductor 151 on the side surface of the opening 191, and then the semiconductor 152 is deposited on the insulator 103.

The description of the insulator 103 in Manufacturing method example 1 is referred to for the insulator 103.

The description of the semiconductor 152 in Manufacturing method example 1 is referred to for the semiconductor 152.

In the region 182A (the region 182B) illustrated in FIG. 23B, the transistor WTr in FIG. 1C is formed. Specifically, in the region 182A (the region 182B), the region 151a of the semiconductor 151 functions as the channel formation region of the transistor WTr, two regions 151b of the semiconductor 151 function as the source electrode and the drain electrode of the transistor WTr, and the conductor 132A functions as the gate electrode of the transistor WTr. When a material containing a metal oxide is used for the semiconductor 151, the transistor WTr is an OS transistor.

Figure 24A:
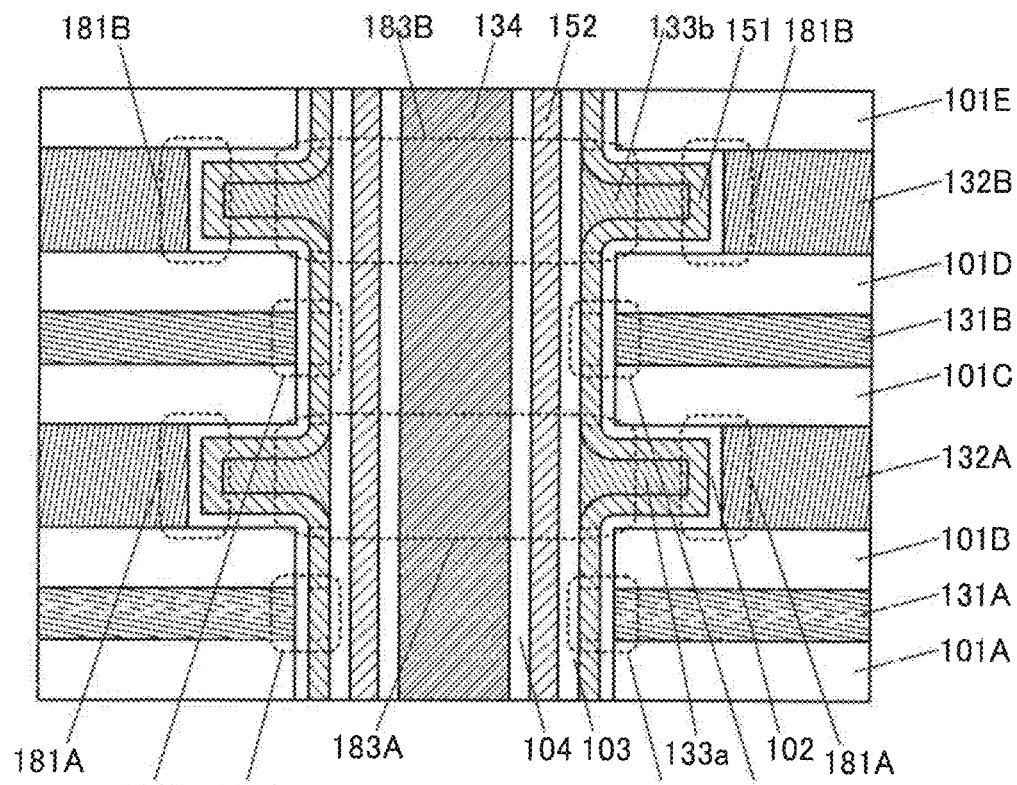
FIGS. 24A and 24B are cross-sectional views illustrating an example of manufacturing a semiconductor device.

In the next step, as illustrated in FIG. 24A, the insulator 104 is deposited on the semiconductor 152, and the conductor 134 is deposited to fill the remaining opening 191.

The description of the insulator 104 in Manufacturing method example 1 is referred to for the insulator 104.

The description of the conductor 134 in Manufacturing method example 1 is referred to for the conductor 134.

In the region 183A (the region 183B) illustrated in FIG. 24A, the transistor RTr in FIG. 1C is formed. Specifically, in the region 183A (the region 183B), the region 151c and two regions 151b of the semiconductor 151 and the conductor 133a (the conductor 133b) function as the gate electrode of the transistor RTr, the semiconductor 152 functions as the channel formation region of the transistor RTr, and the conductor 134 functions as a backgate electrode of the transistor RTr. When the semiconductor 152 is a material containing a metal oxide, the transistor RTr is an OS transistor.

Through the steps from FIG. 14A to FIG. 15B and from FIGS. 22A to 24A, the semiconductor device illustrated in FIG. 1C can be manufactured.

One embodiment of the present invention is not limited to the structure example of the semiconductor device illustrated in FIG. 24A. In one embodiment of the present invention, the structure of the semiconductor device in FIG. 24A can be appropriately changed depending on the circumstances or conditions or as needed.

Figure 24B:
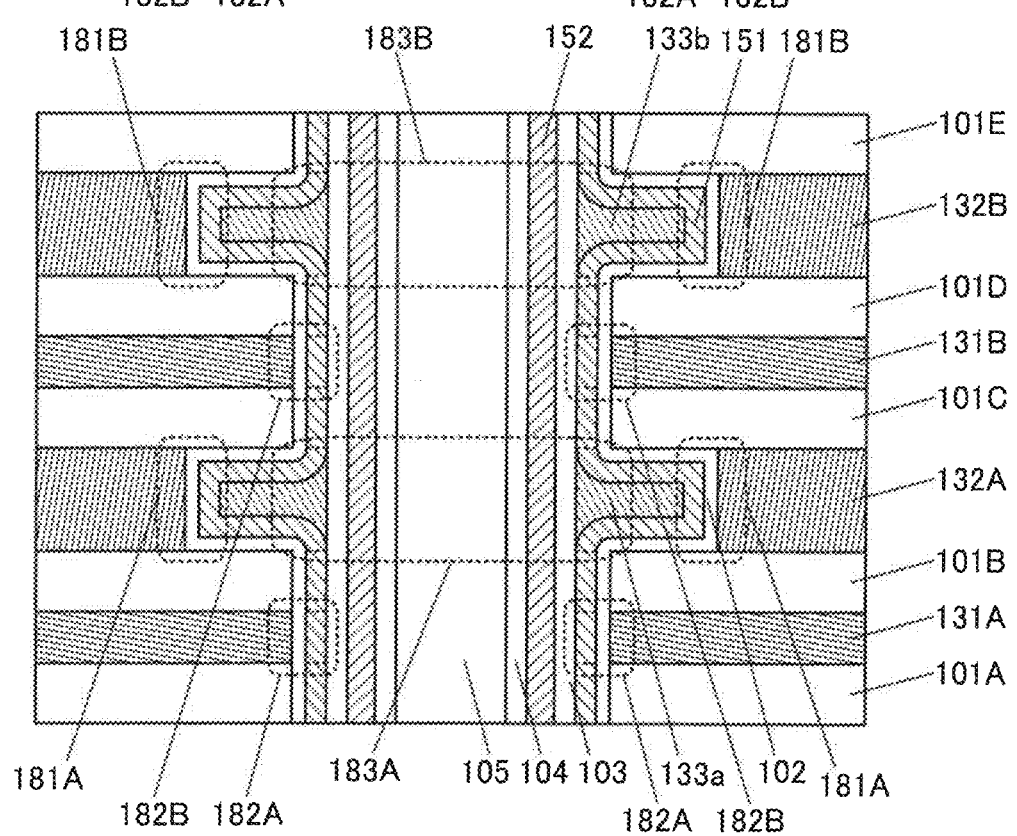

For example, as described above, one embodiment of the present invention can be a semiconductor device in which the transistor WTr and the transistor RTr are not provided with a backgate as illustrated in FIG. 1A. To manufacture the semiconductor device in FIG. 1A, a step shown in FIG. 24B instead of the step shown in FIG. 24A is performed in the process of manufacturing the semiconductor device in FIG. 1C. FIG. 24B illustrates a step for depositing an insulator 105, instead of the conductor 134 in FIG. 24A, to fill the opening 191. For the insulator 105, a material usable for the insulator 104 can be used, for example.

Figure 25:
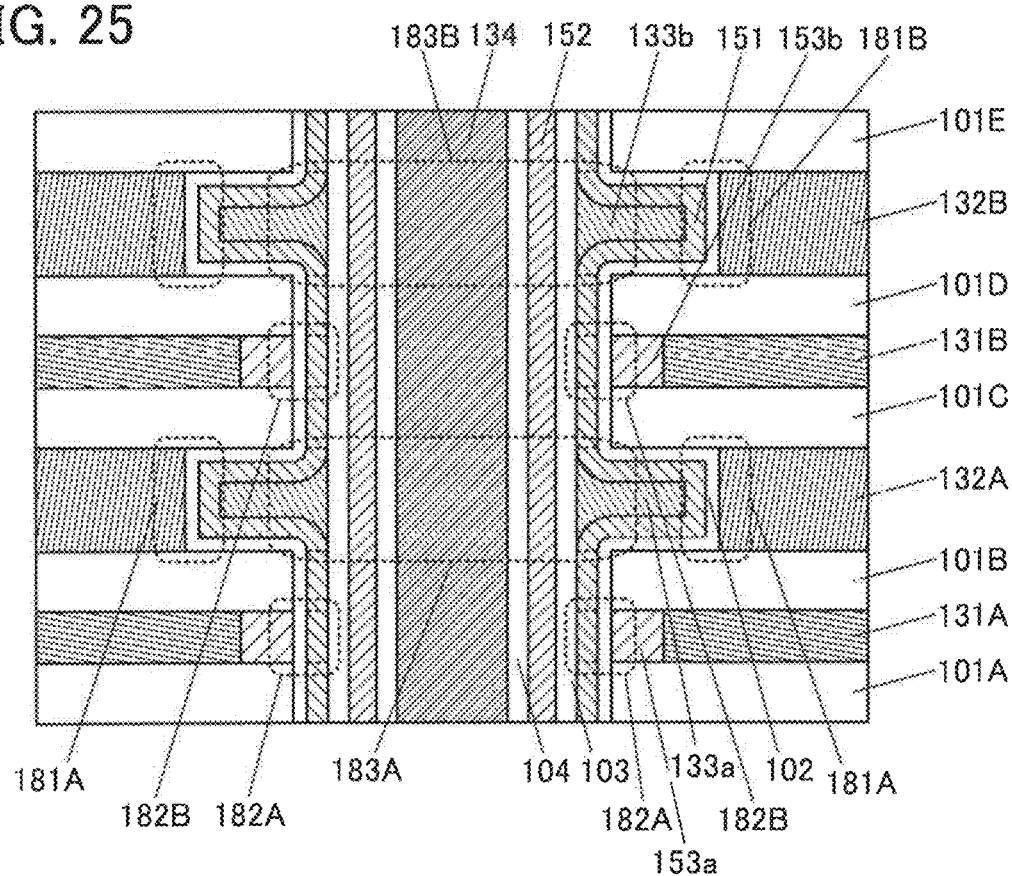
FIG. 25 is a cross-sectional view illustrating an example of manufacturing a semiconductor device.

As another example, in one embodiment of the present invention, the structure of the gate electrode of the transistor WTr can be changed from that in FIG. 24A in order to improve the switching characteristics of the transistor WTr. FIG. 25 illustrates a structure example of the semiconductor device. To manufacture the semiconductor device in FIG. 25, the semiconductor 153a (the semiconductor 153b) is formed so as to fill the recess portion 193A (the recess portion 193B) as in the structure example of FIG. 20B in Manufacturing method example 1. Next, the insulator 102 is formed on the side surface of the opening 191 so as to cover the semiconductor 153a (the semiconductor 153b). Then, the same steps as in FIGS. 22A to 24A are performed, whereby the semiconductor device illustrated in FIG. 25 can be completed. Note that the description for FIGS. 19A to 20B in Manufacturing method example 1 is referred to for the effects of the structure in FIG. 25.

Figure 26:
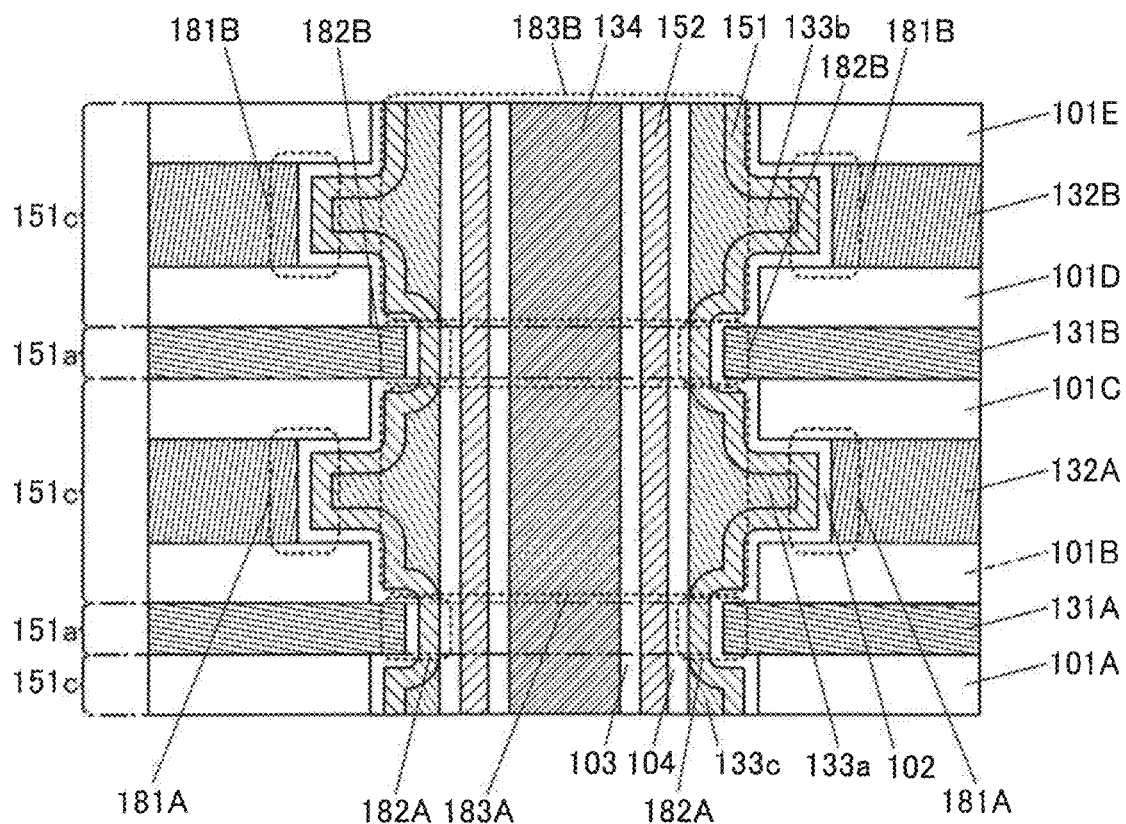
FIG. 26 is a cross-sectional view illustrating an example of manufacturing a semiconductor device.

As another example, in one embodiment of the present invention, the structure of the gate electrode of the transistor RTr can be changed from that in FIG. 24A in order to reduce the electrical resistance between the gate electrode of the transistor RTr and the first or second terminal of the transistor WTr in FIG. 1C. FIG. 26 illustrates a structure example of the semiconductor device. To manufacture the semiconductor device in FIG. 26, the structure illustrated in FIG. 21A of Manufacturing method example 1 is prepared. Subsequently, the same steps as in FIGS. 22A to 24A are performed, whereby the semiconductor device illustrated in FIG. 26 can be completed. Note that the description for FIG. 21B in Manufacturing method example 1 is referred to for the effects of the structure in FIG. 26.

According to Manufacturing method example 1 or 2 described above, a semiconductor device capable of retaining a large amount of data can be manufactured.

Figure 27:
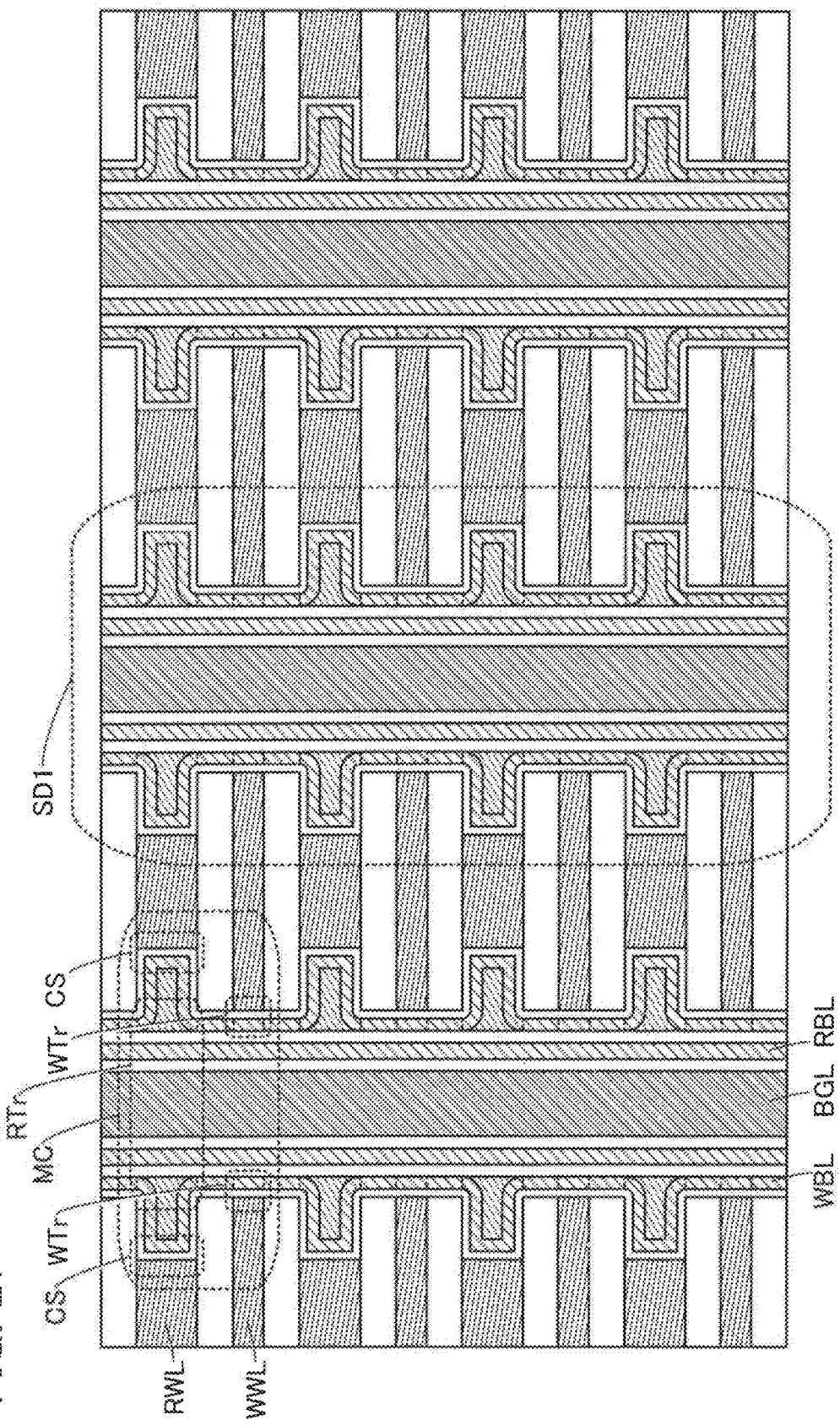
FIG. 27 is a cross-sectional view illustrating a semiconductor device.

Here, FIG. 27 illustrates a structure in which the region SD2 of the semiconductor device in FIG. 13B employs the cross-sectional structure of the semiconductor device in FIG. 18A (having the circuit configuration in FIG. 1C). Note that the region SD1 corresponds to the memory cells MC. As illustrated in FIG. 27, an opening is provided to penetrate the structure body in which the conductors serving as the wiring RWL and the wiring WWL and the insulator are stacked, and the semiconductor device is manufactured according to Manufacturing method example 1 or 2 described above, whereby the circuit configuration in FIG. 1C can be obtained.

<Connection Examples with Peripheral Circuit>

Figure 28A:
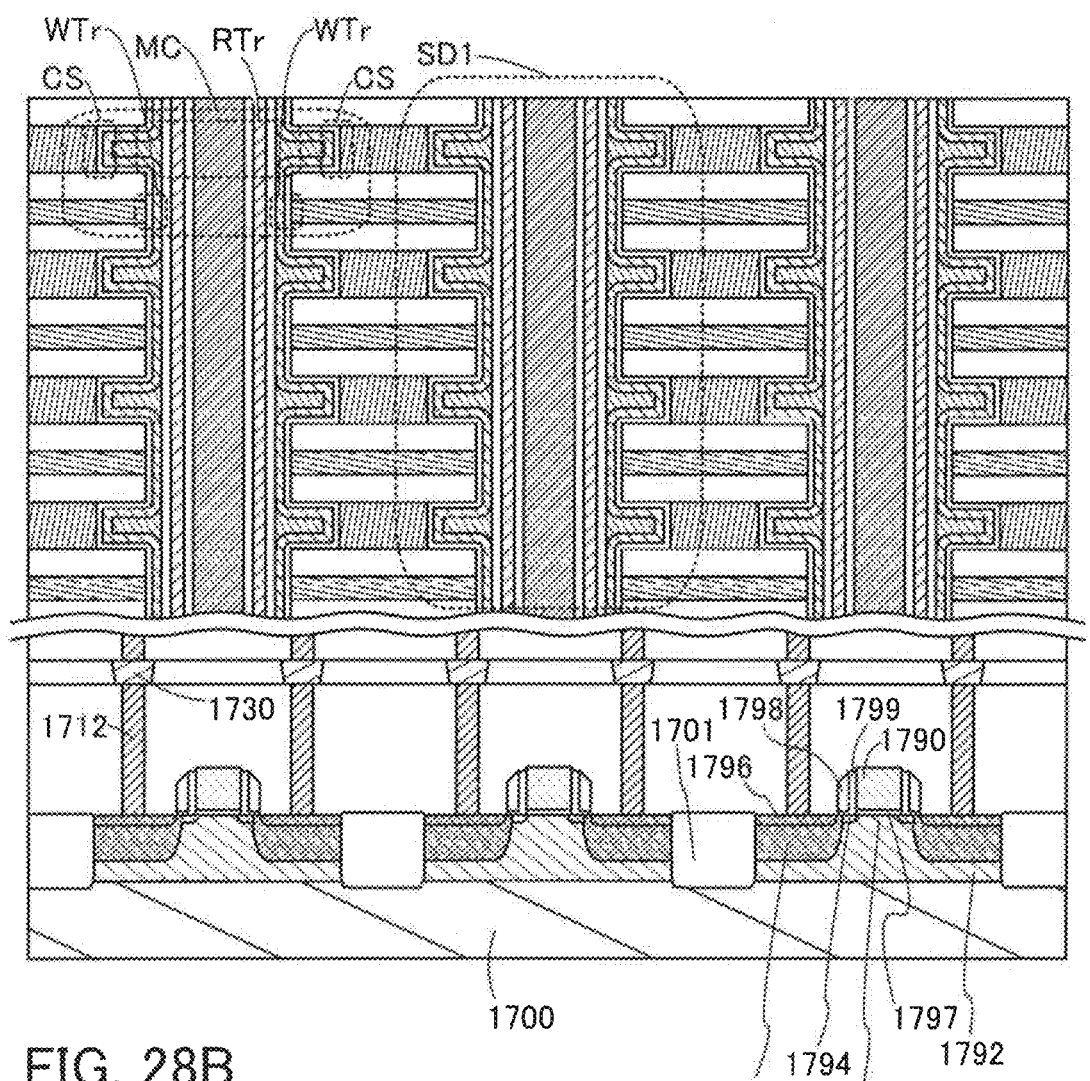
FIGS. 28A and 28B are cross-sectional views illustrating a semiconductor device.
Figure 29A:
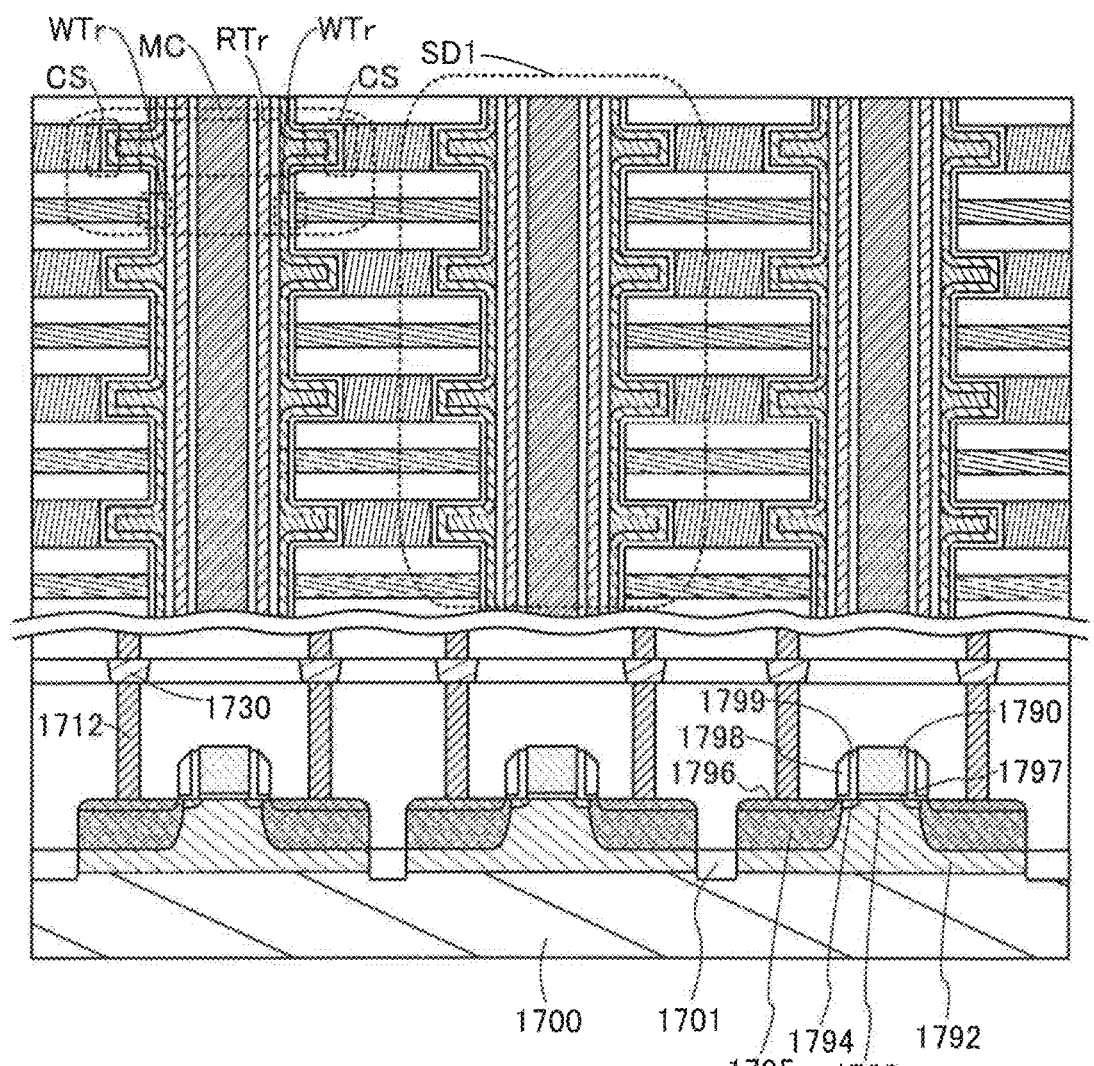
FIGS. 29A and 29B are cross-sectional views illustrating a semiconductor device.

A peripheral circuit for the memory cell array, such as a read circuit or a precharge circuit, may be provided below the semiconductor device shown in Manufacturing method example 1 or 2. In this case, Si transistors are formed on a silicon substrate or the like to configure the peripheral circuit, and then the semiconductor device of one embodiment of the present invention is formed over the peripheral circuit according to Manufacturing method example 1 or 2. FIG. 28A is a cross-sectional view in which the peripheral circuit is formed using planar Si transistors and the semiconductor device of one embodiment of the present invention is formed over the peripheral circuit. FIG. 29A is a cross-sectional view in which the peripheral circuit is formed using FIN-type Si transistors and the semiconductor device of one embodiment of the present invention is formed over the peripheral circuit. As an example, the semiconductor device illustrated in each of FIGS. 28A and 29A has the structure in FIG. 18A.

In FIGS. 28A and 29A, the Si transistors configuring the peripheral circuit are formed on a substrate 1700. An element separation layer 1701 is provided between a plurality of Si transistors. Conductors 1712 are formed as a source and a drain of the Si transistor. Although not shown, a conductor 1730 extends in the channel width direction to be connected to another Si transistor or the conductor 1712.

As the substrate 1700, a single crystal semiconductor substrate or a polycrystalline semiconductor substrate of silicon or silicon carbide, a compound semiconductor substrate of silicon germanium, an SOI substrate, or the like can be used.

Alternatively, a glass substrate, a quartz substrate, a plastic substrate, a metal substrate, a flexible substrate, an attachment film, paper including a fibrous material, or a base film, for example, may be used as the substrate 1700. Alternatively, a semiconductor element may be formed using one substrate and then transferred to another substrate. FIGS. 28A and 29A show examples where a single crystal silicon wafer is used as the substrate 1700.

Figure 28B:
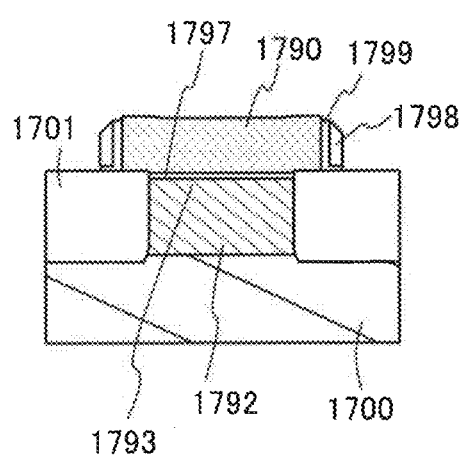

Here, the details of the Si transistors are described. FIG. 28A shows a cross section of the planar Si transistor in the channel length direction, and FIG. 28B shows its cross section in the channel width direction. The Si transistor includes a channel formation region 1793 in a well 1792, low-concentration impurity regions 1794 and high-concentration impurity regions 1795 (also collectively referred to simply as impurity regions), conductive regions 1796 in contact with the impurity regions, a gate insulating film 1797 over the channel formation region 1793, a gate electrode 1790 over the gate insulating film 1797, and sidewall insulating layers 1798 and 1799 on side surfaces of the gate electrode 1790. Note that the conductive region 1796 may be formed using metal silicide or the like.

Figure 29B:
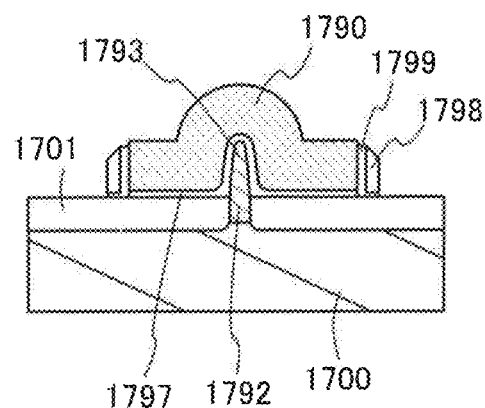

FIG. 29A shows a cross section of the FIN-type Si transistor in the channel length direction, and FIG. 29B shows its cross section in the channel width direction. In the Si transistor illustrated in FIGS. 29A and 29B, the channel formation region 1793 has a projecting portion, and the gate insulating film 1797 and the gate electrode 1790 are provided along side and top surfaces of the channel formation region 1793. Although the projecting portion is formed by processing of part of the semiconductor substrate in this embodiment, a semiconductor layer with a projecting portion may be formed by processing of an SOI substrate. Note that the reference numerals in FIGS. 29A and 29B are the same as those in FIGS. 28A and 28B.

Note that the insulators, conductors, semiconductors, and the like disclosed in this specification and the like can be formed by a physical vapor deposition (PVD) method or a chemical vapor deposition (CVD) method. Examples of a PVD method include a sputtering method, a resistance heating evaporation method, an electron beam evaporation method, and a pulsed laser deposition (PLD) method. Examples of a CVD method include a plasma CVD method and a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer react with each other in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching of corresponding switching valves (also referred to as high-speed valves) such that the source gases are not mixed. For example, a first source gas is introduced, an inert gas (e.g., argon or nitrogen) or the like is introduced at the same time as or after the introduction of the first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as the metal film, the semiconductor film, and the inorganic insulating film disclosed in this embodiment and the foregoing embodiment can be formed by a thermal CVD method such as a MOCVD method or an ALD method. For example, to form an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, when a hafnium oxide film is formed by a deposition apparatus employing ALD, two kinds of gases, i.e., ozone ($O_3$) as an oxidizer and a source gas obtained by vaporization of liquid containing a solvent and a hafnium precursor compound (hafnium alkoxide or hafnium amide such as tetrakis(dimethylamide)hafnium (TDMAH, $Hf[N(CH_3)_2]_4$)) are used. Alternatively, tetrakis(ethylmethylamide)hafnium may be used, for instance.

For example, when an aluminum oxide film is formed by a deposition apparatus employing ALD, two kinds of gases, e.g., $H_2O$ as an oxidizer and a source gas obtained by vaporization of liquid containing a solvent and an aluminum precursor compound (e.g., trimethylaluminum (TMA, $Al(CH_3)_3$)) are used. Alternatively, tris(dimethylamide)aluminum, triisobutylaluminum, aluminum tris(2,2,6,6-tetramethyl-3,5-heptanedionate), or the like may be used.

For example, when a silicon oxide film is formed by a deposition apparatus using ALD, hexachlorodisilane is adsorbed on a surface where the film is to be formed, and radicals of an oxidizing gas (e.g., $O_2$ or dinitrogen monoxide) are supplied to react with the adsorbate.

For example, when a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that a $SiH_4$ gas may be used instead of a $B_2H_6$ gas.

For example, when an oxide semiconductor film, e.g., an In—Ga—Zn—O film is formed by a deposition apparatus employing ALD, an $In(CH_3)_3$ gas and an $O_3$ gas are sequentially introduced to form an In—O layer, a $Ga(CH_3)_3$ gas and an $O_3$ gas are sequentially introduced to form a GaO layer, and then a $Zn(CH_3)_2$ gas and an $O_3$ gas are sequentially introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas that is obtained by bubbling water with an inert gas such as Ar may be used instead of an $O_3$ gas, it is preferable to use an $O_3$ gas, which does not contain H. Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

Note that at least two of the structure examples of the semiconductor device described in this embodiment can be combined as appropriate.

Note that this embodiment can be combined with any of the other embodiments in this specification as appropriate.

Embodiment 3

In this embodiment, a metal oxide contained in a channel formation region of the OS transistor used in the foregoing embodiment will be described.

The metal oxide preferably contains at least indium or zinc, and particularly preferably contains both indium and zinc. In addition, the metal oxide preferably contains aluminum, gallium, yttrium, tin, or the like. Furthermore, the metal oxide may contain one or more elements selected from boron, silicon, titanium, iron, nickel, germanium, zirconium, molybdenum, lanthanum, cerium, neodymium, hafnium, tantalum, tungsten, magnesium, and the like.

Here, the case where the metal oxide is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of the atomic ratio of indium, the element M, and zinc contained in the metal oxide according to the present invention will be described with reference to FIGS. 30A to 30C. Note that the proportion of oxygen atoms is not shown in FIGS. 30A to 30C. The terms of the atomic ratio of indium, the element M, and zinc contained in the metal oxide are denoted by [In], [M], and [Zn], respectively.

Figure 30A:
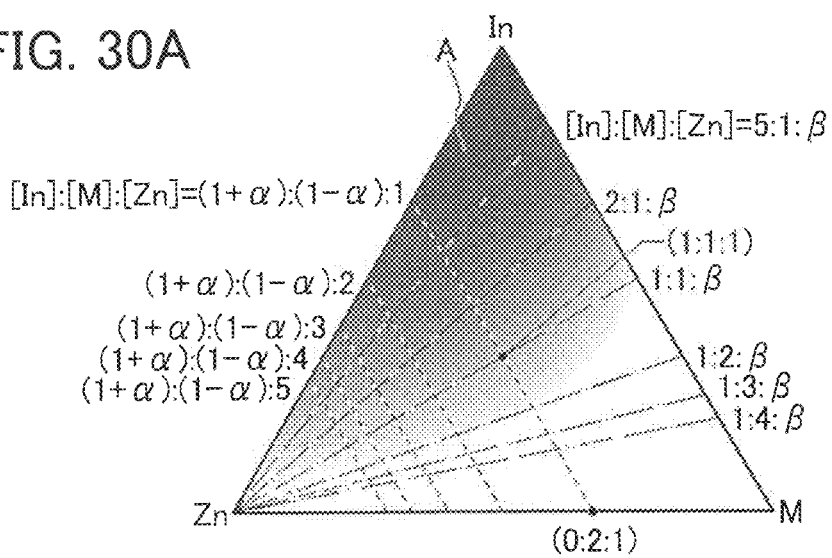
FIGS. 30A to 30C each illustrate an atomic ratio range of a metal oxide.
Figure 30B:
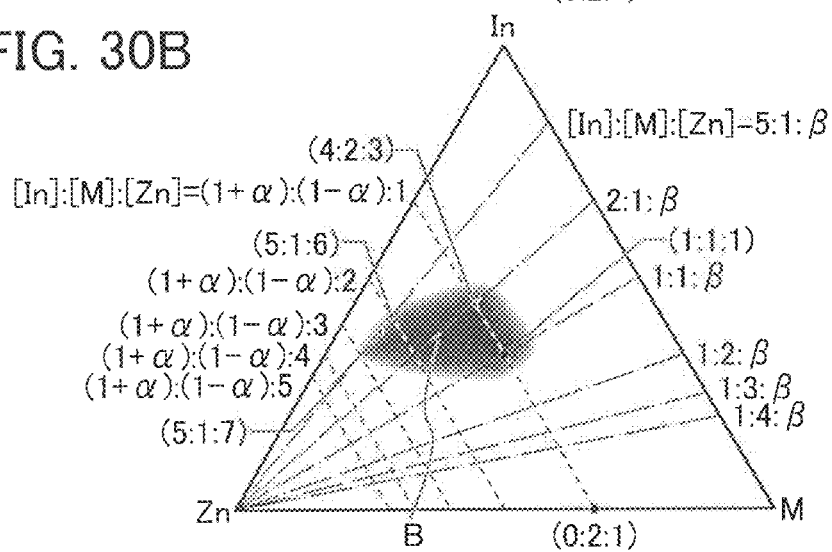
Figure 30C:
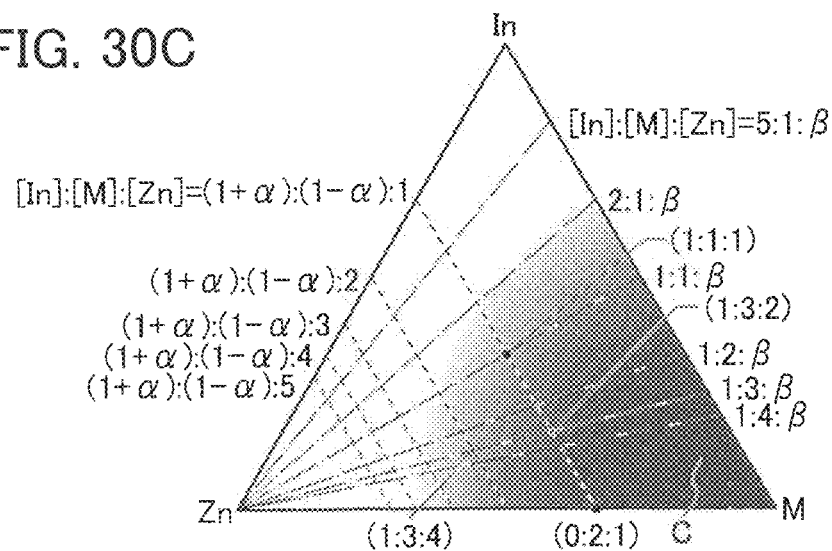

In FIGS. 30A to 30C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A metal oxide having an atomic ratio [In]:[M]:[Zn] of 0:2:1 or around 0:2:1 in FIGS. 30A to 30C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 30A shows an example of the preferred ranges of the atomic ratio of indium to the element M and zinc contained in a metal oxide.

A metal oxide with a higher content of indium can have high carrier mobility (electron mobility). Therefore, a metal oxide with a high indium content has higher carrier mobility than a metal oxide with a low indium content.

In contrast, when the indium content and the zinc content in a metal oxide become lower, the carrier mobility becomes lower. Thus, with an atomic ratio [In]:[M]:[Zn] of 0:1:0 or around 0:1:0 (e.g., a region C in FIG. 30C), insulation performance becomes better.

Accordingly, a metal oxide of one embodiment of the present invention preferably has an atomic ratio represented by the region A in FIG. 30A. With such an atomic ratio, a layered structure with high carrier mobility and a few grain boundaries is easily obtained.

A metal oxide with an atomic ratio in the region A, particularly in a region B in FIG. 30B, is excellent because it easily becomes a c-axis-aligned crystalline oxide semiconductor (CAAC-OS) and has high carrier mobility.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region where nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are sometimes included in the distortion. Note that a clear grain boundary cannot be observed even in the vicinity of distortion in the CAAC-OS. That is, formation of a grain boundary is inhibited by the distortion of a lattice arrangement. This is probably because the CAAC-OS can tolerate distortion owing to a low-density arrangement of oxygen atoms in the a-b plane direction, an interatomic bond distance changed by substitution of a metal element, and the like.

The CAAC-OS is a metal oxide with high crystallinity. In the CAAC-OS, a reduction in electron mobility due to the grain boundary is less likely to occur because a clear grain boundary cannot be observed. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

Note that the region B includes an atomic ratio [In]:[M]:[Zn] of 4:2:3 to 4:2:4.1 and in the neighborhood thereof. The neighborhood includes an atomic ratio [In]:[M]:[Zn] of 5:3:4, for example. The region B also includes an atomic ratio [In]:[M]:[Zn] of 5:1:6 and in the neighborhood thereof and an atomic ratio [In]:[M]:[Zn] of 5:1:7 and in the neighborhood thereof.

Note that the properties of a metal oxide are not uniquely determined by the atomic ratio. Even with the same atomic ratio, the properties of a metal oxide might differ depending on a formation condition. For example, when the metal oxide is formed with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific properties, and boundaries of the regions A to C are not clear.

Note that this embodiment can be combined with any of the other embodiments in this specification as appropriate.

Embodiment 4

In this embodiment, a CPU that can include the semiconductor device of the foregoing embodiment will be described.

Figure 31:
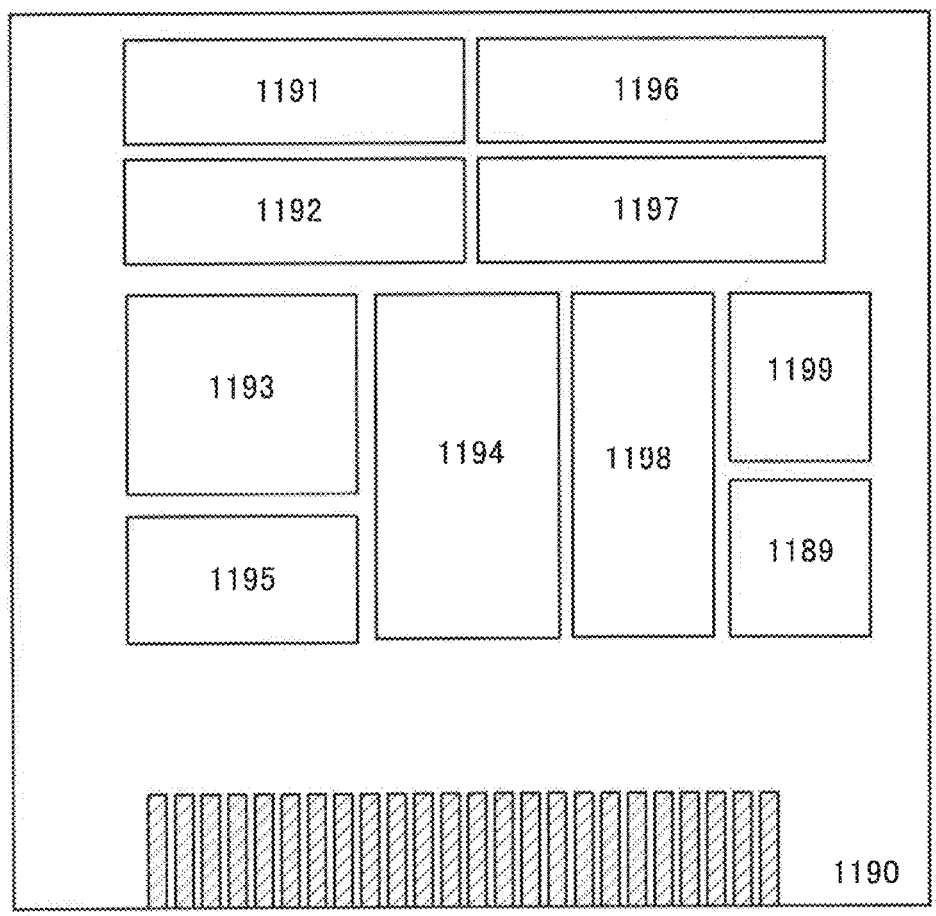
FIG. 31 is a block diagram of a CPU.

FIG. 31 is a block diagram illustrating a configuration example of a CPU including the semiconductor device described in Embodiment 1.

The CPU illustrated in FIG. 31 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 31 is just an example with a simplified configuration, and an actual CPU has a variety of configurations depending on the application. For example, a CPU may have a GPU-like configuration where a plurality of cores each including the CPU in FIG. 31 or an arithmetic circuit operate in parallel. The number of bits that the CPU can handle with an internal arithmetic circuit or a data bus can be 8, 16, 32, or 64, for example.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 31, memory cells are provided in the register 1196. The transistor described in the foregoing embodiment can be used in the memory cell of the register 1196.

In the CPU in FIG. 31, the register controller 1197 selects the type of retention operation in the register 1196 in accordance with an instruction from the ALU 1191. That is, the register controller 1197 selects whether data is held by a flip-flop or by a capacitor in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 5

The memory device of the foregoing embodiment can be used for removable memory devices such as memory cards (e.g., SD cards), universal serial bus (USB) memories, and solid state drives (SSD). In this embodiment, some structure examples of removable memory devices will be described with reference to FIGS. 32A to 32E.

Figure 32A:
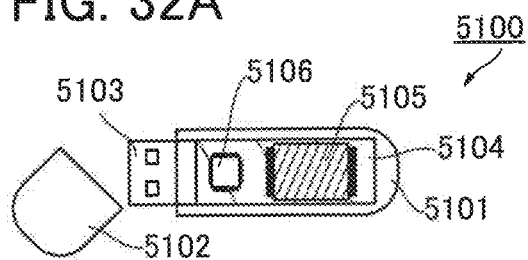
FIGS. 32A to 32E are perspective views illustrating examples of electronic devices.

FIG. 32A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5105. A processor, a work memory, an ECC circuit, and the like are specifically incorporated into the controller chip 5106. Note that the circuit configurations of the memory chip 5105 and the controller chip 5106 are not limited to those described above and can be changed as appropriate depending on circumstances or conditions. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 32B:
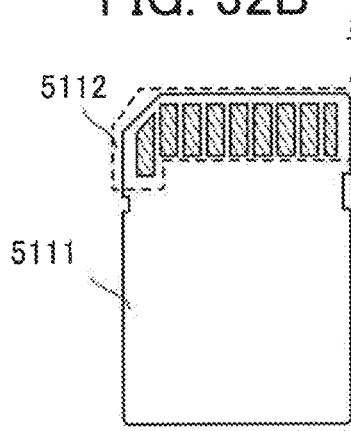
Figure 32C:
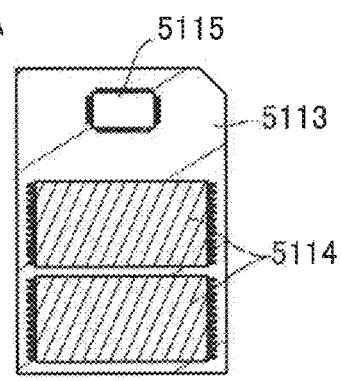

FIG. 32B is a schematic external diagram of an SD card, and FIG. 32C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5114. A processor, a work memory, an ECC circuit, and the like are incorporated into the controller chip 5115. Note that the circuit configurations of the memory chip 5114 and the controller chip 5115 are not limited to those described above and can be changed as appropriate depending on circumstances or conditions. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on the back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 32D:
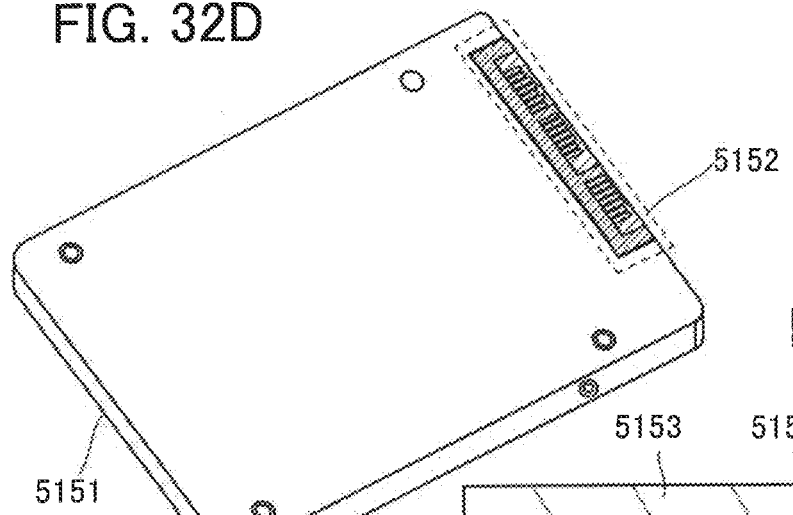
Figure 32E:
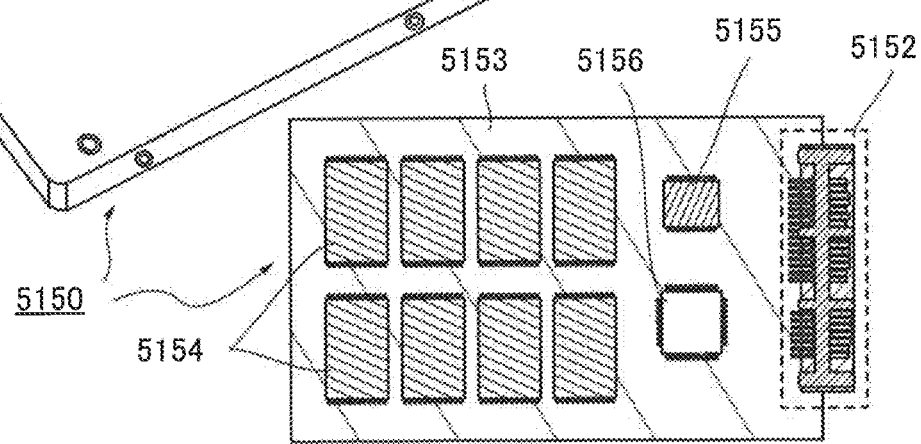

FIG. 32D is a schematic external diagram of an SSD, and FIG. 32E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, which are described in Embodiment 2, are incorporated into the memory chip 5154. When the memory chip 5154 is also provided on the back side of the substrate 5153, the capacity of the SSD 5150 can be increased. A work memory is incorporated into the memory chip 5155. For example, a DRAM chip can be used as the memory chip 5155. A processor, an ECC circuit, and the like are incorporated into the controller chip 5156. Note that the circuit configurations of the memory chip 5154, the memory chip 5155, and the controller chip 5115 are not limited to those described above and can be changed as appropriate depending on circumstances or conditions. For example, a memory functioning as a work memory may also be provided in the controller chip 5156.

Note that this embodiment can be combined with any of the other embodiments in this specification as appropriate.

Embodiment 6

In this embodiment, examples of electronic devices in which the memory device of the foregoing embodiment can be used will be described.

<Laptop Personal Computer>

Figure 33A:
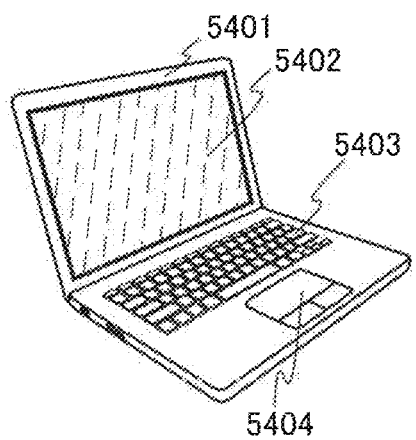
FIGS. 33A to 33F are perspective views illustrating examples of electronic devices.

FIG. 33A illustrates a laptop personal computer including a housing 5401, a display portion 5402, a keyboard 5403, a pointing device 5404, and the like. The memory device of one embodiment of the present invention can be provided in the laptop personal computer.

<Smart Watch>

Figure 33B:
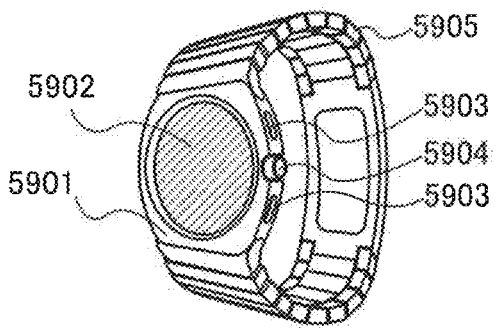

FIG. 33B illustrates a smart watch that is one of wearable terminals. The smart watch includes a housing 5901, a display portion 5902, operation buttons 5903, an operator 5904, a band 5905, and the like. The memory device of one embodiment of the present invention can be provided in the smart watch. A display device with a position input function may be used for the display portion 5902. The position input function can be added by provision of a touch panel in a display device. Alternatively, the position input function can be added by provision of a photoelectric conversion element called a photosensor in a pixel area of a display device. As the operation buttons 5903, any of a power switch for activating the smart watch, a button for operating an application of the smart watch, a volume control button, a switch for turning on or off the display portion 5902, and the like can be provided. Although the smart watch illustrated in FIG. 33B includes two operation buttons 5903, the number of operation buttons included in the smart watch is not limited to two. The operator 5904 functions as a crown used for setting the time on the smart watch. The operator 5904 may be used as an input interface for operating an application of the smart watch as well as the crown for time adjustment. Although the smart watch in FIG. 33B includes the operator 5904, one embodiment of the present invention is not limited thereto and does not necessarily include the operator 5904.

<Video Camera>

Figure 33C:
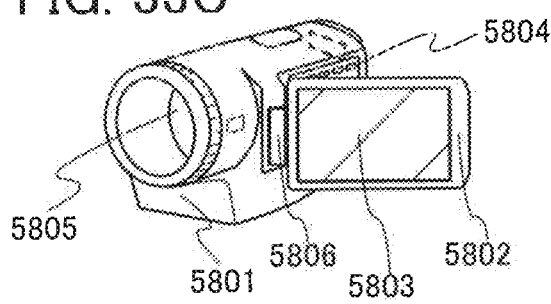

FIG. 33C illustrates a video camera including a first housing 5801, a second housing 5802, a display portion 5803, operation keys 5804, a lens 5805, a joint 5806, and the like. The memory device of one embodiment of the present invention can be provided in the video camera. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

<Mobile Phone>

Figure 33D:
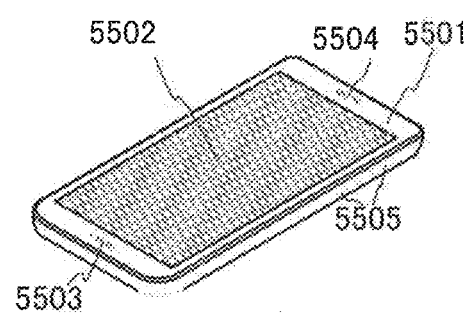

FIG. 33D illustrates a mobile phone having a function of an information terminal. The mobile phone includes a housing 5501, a display portion 5502, a microphone 5503, a speaker 5504, and operation buttons 5505. The memory device of one embodiment of the present invention can be provided in the mobile phone. A display device with a position input function may be used for the display portion 5502. The position input function can be added by provision of a touch panel in a display device. Alternatively, the position input function can be added by provision of a photoelectric conversion element called a photosensor in a pixel area of a display device. As the operation buttons 5505, any of a power switch for activating the mobile phone, a button for operating an application of the mobile phone, a volume control button, a switch for turning on or off the display portion 5502, and the like can be provided.

Although the mobile phone illustrated in FIG. 33D includes two operation buttons 5505, the number of operation buttons included in the mobile phone is not limited to two. Although not illustrated, the mobile phone in FIG. 33D may include a light-emitting device used for a flashlight or a lighting purpose.

<Television Device>

Figure 33E:
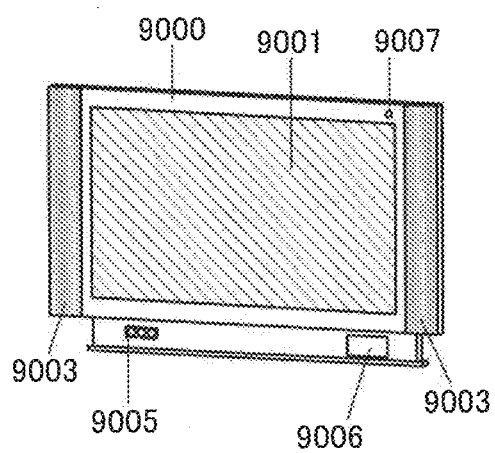

FIG. 33E is a perspective view illustrating a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), and the like. The memory device of one embodiment of the present invention can be provided in the television device. The television device can include the display portion 9001 with a large screen of, for example, 50 inches or more or 100 inches or more.

<Vehicle>

The memory device described above can also be used around a driver's seat in a car, which is a vehicle.

Figure 33F:
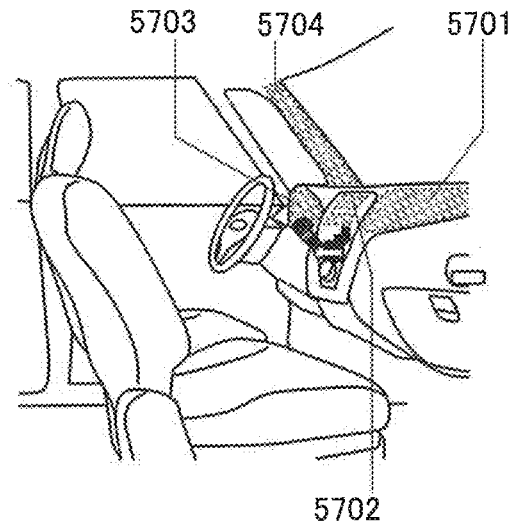

As an example, FIG. 33F illustrates a front glass and its vicinity inside a car. FIG. 33F shows a display panel 5701, a display panel 5702, and a display panel 5703 that are attached to a dashboard and a display panel 5704 that is attached to a pillar.

The display panels 5701 to 5703 can provide a variety of kinds of information such as navigation information, a speedometer, a tachometer, a mileage, a fuel meter, a gear-shift indicator, and air-condition setting. Items shown on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Moreover, showing an image to compensate for the area that a driver cannot see makes it possible for the driver to confirm safety more easily and comfortably. The display panel 5704 can also be used as a lighting device.

The memory device of one embodiment of the present invention can be provided in the vehicle. The memory device of one embodiment of the present invention can be used, for example, for a frame memory that temporarily stores image data used to display images on the display panels 5701 to 5704, or a memory device that stores a program for driving a system included in the vehicle.

Although not shown, each of the electronic devices illustrated in FIGS. 33A, 33B, 33C, 33E, and 33F may include a microphone and a speaker. The electronic device with this structure can have an audio input function, for example.

Although not shown, each of the electronic devices illustrated in FIGS. 33A, 33B, 33D, 33E, and 33F may include a camera.

Although not illustrated, each of the electronic devices in FIGS. 33A to 33F may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing. In particular, when the mobile phone in FIG. 33D is provided with a sensing device that includes a sensor for sensing inclination, such as a gyroscope sensor or an acceleration sensor, the orientation of the mobile phone (with respect to the vertical direction) can be determined to change the display on the screen of the display portion 5502 automatically in accordance with the orientation of the mobile phone.

Although not illustrated, each of the electronic devices in FIGS. 33A to 33F may include a device for obtaining biological information such as fingerprints, veins, iris, or voice prints. The electronic device with this structure can have a biometric identification function.

A flexible base may be used for the display portion of each of the electronic devices in FIGS. 33A to 33F. Specifically, the display portion may have a structure in which a transistor, a capacitor, a display element, and the like are provided over a flexible base. With such a structure, in addition to the electronic device having the housing with a flat surface as illustrated in FIGS. 33A to 33F, an electronic device having a housing with a curved surface can be achieved.

Note that this embodiment can be combined with any of the other embodiments in this specification as appropriate.

(Notes on Description of this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text disclosed in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Ordinal Numbers>

In this specification and the like, ordinal numbers such as first, second, and third are used in order to avoid confusion among components. Thus, the terms do not limit the number or order of components. In this specification and the like, for example, a "first" component in one embodiment can be referred to as a "second" component or omitted in other embodiments or claims.

<Notes on Description for Drawings>

The embodiments are described with reference to the drawings. Note that the embodiments can be implemented in many different modes, and it will be readily appreciated by those skilled in the art that modes and details can be changed in various ways without departing from the spirit and scope of the present invention. Thus, the present invention should not be interpreted as being limited to the description of the embodiments. Note that in the structures of the invention described in Embodiments, the same portions or portions having similar functions are denoted by the same reference numerals in different drawings, and the description of such portions is not repeated.

In this specification and the like, terms for explaining arrangement (e.g., over, above, under, and below) are used for convenience to indicate a positional relation between components with reference to drawings. The positional relation between components is changed as appropriate in accordance with a direction in which the components are described. Therefore, the terms for explaining arrangement are not limited to those used in the specification and can be changed to other terms as appropriate depending on the situation.

The term such as "over," "above, "under," and "below" does not necessarily mean that a component is placed directly on or under and directly in contact with another component. For example, the expression "electrode B over insulating layer A" does not necessarily mean that the electrode B is on and in direct contact with the insulating layer A and can also mean the case where another component is provided between the insulating layer A and the electrode B.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed at the same time are sometimes denoted by the same reference numerals, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, a channel formation region refers to a region where a channel is formed by application of a potential to the gate, and the formation of this region enables current to flow between the source and the drain.

Functions of a source and a drain are sometimes switched when a transistor of different polarity is employed or when a direction of current flow is changed in circuit operation, for example. Therefore, the terms "source" and "drain" can be used interchangeably in this specification and the like.

In this specification and the like, in the case where a transistor has two or more gates (such a structure is sometimes referred to as a dual-gate structure), these gates are referred to as a first gate and a second gate or as a front gate and a backgate in some cases. In particular, the term "front gate" can be replaced with a simple term "gate." The term "backgate" can be replaced with a simple term "gate." Note that a bottom gate is a terminal that is formed before a channel formation region in manufacture of a transistor, and a top gate is a terminal that is formed after a channel formation region in manufacture of a transistor.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term "conductive film" can be used instead of "conductive layer," and the term "insulating layer" can be used instead of "insulating film." Moreover, such terms can be replaced with a word not including the term "film" or "layer" depending on the case or circumstances. For example, in some cases, the term "conductor" can be used instead of "conductive layer" or "conductive film," and the term "insulator" can be used instead of "insulating layer" or "insulating film."

In this specification and the like, the terms "wiring," "signal line," "power supply line," and the like can be replaced with each other depending on the case or circumstances. For example, in some cases, the term "signal line" or "power supply line" can be used instead of "wiring," and vice versa. In some cases, the term "signal line" can be used instead of "power supply line," and vice versa. As another example, the term "signal" can be used instead of "potential" that is supplied to a wiring and vice versa, depending on the case or circumstances.

<Notes on Definitions of Terms>

The following are definitions of the terms mentioned in the above embodiments.

«Impurities in Semiconductor»

Impurities in a semiconductor refer to, for example, elements other than the main components of a semiconductor layer. For instance, an element with a concentration of lower than 0.1 atomic % is an impurity. If impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change characteristics of the semiconductor include Group 1 elements, Group 2 elements, Group 13 elements, Group 14 elements, Group 15 elements, and transition metals other than the main components of the semiconductor. Specific examples are hydrogen (included also in water), lithium, sodium, silicon, boron, phosphorus, carbon, and nitrogen. When the semiconductor is an oxide semiconductor, oxygen vacancies may be formed by entry of impurities such as hydrogen, for instance. When the semiconductor is silicon, examples of impurities that change the characteristics of the semiconductor include oxygen, Group 1 elements except hydrogen, Group 2 elements, Group 13 elements, and Group 15 elements.

«Switch»

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology, such as a digital micromirror device (DMD). Such a switch includes an electrode that can be moved mechanically, and its conduction and non-conduction is controlled with movement of the electrode.

«Connection»

In this specification and the like, the description "X and Y are connected" means that X and Y are electrically connected, X and Y are functionally connected, and X and Y are directly connected. Accordingly, without being limited to a predetermined connection relation (e.g., a connection relation shown in drawings and texts), another connection relation is regarded as being included in the drawings and the texts.

Here, X and Y each denote an object (e.g., a device, an element, a circuit, a wiring, an electrode, a terminal, a conductive film, or a layer).

For example, in the case where X and Y are electrically connected, at least element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not.

For example, in the case where X and Y are functionally connected, at least one circuit that enables functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another circuit provided therebetween), and X and Y are directly connected (i.e., X and Y are connected without another element or circuit provided therebetween). That is, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also functions as an electrode, one conductive film functions as the wiring and the electrode. Thus, the term "electrical connection" in this specification also means such a case where one conductive film has functions of a plurality of components.

«Parallel and Perpendicular»

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

This application is based on Japanese Patent Application Serial No. 2017-124314 filed with Japan Patent Office on Jun. 26, 2017, the entire contents of which are hereby incorporated by reference.

What is claimed is:

1. A semiconductor device comprising:
   a first insulator;
   a first conductor over the first insulator;
   a second insulator over the first conductor;
   a second conductor over the second insulator;
   a third insulator over the second conductor;
   a fourth insulator along a side surface of the first insulator, a side surface of the first conductor, a side surface of the second insulator, part of a top surface of the second insulator, a side surface of the second conductor, part of a bottom surface of the third insulator, and a side surface of the third insulator;
   a third conductor adjacent to the second conductor with the fourth insulator therebetween;
   a first semiconductor including a first region, a second region, a third region, a fourth region, and a fifth region;
   a fifth insulator along the first semiconductor; and
   a second semiconductor along the fifth insulator,
   wherein:
   the first region of the first semiconductor is adjacent to the first insulator with the fourth insulator therebetween,
   the second region of the first semiconductor is adjacent to the first conductor with the fourth insulator therebetween,
   the third region of the first semiconductor is adjacent to the second insulator with the fourth insulator therebetween,
   the fourth region of the first semiconductor is adjacent to the third conductor, and
   the fifth region of the first semiconductor is adjacent to the third insulator with the fourth insulator therebetween.

2. A semiconductor device comprising:
   a first insulator;
   a first conductor over the first insulator;
   a second insulator over the first conductor;
   a second conductor over the second insulator;
   a third insulator over the second conductor;
   a first semiconductor whose sides are along part of a top surface of the first insulator, a side surface of the first conductor, and part of a bottom surface of the second insulator;
   a fourth insulator along a side surface of the first insulator, a surface of the first semiconductor, a side surface of the second insulator, part of a top surface of the second insulator, a side surface of the second conductor, part of a bottom surface of the third insulator, and a side surface of the third insulator;
   a third conductor adjacent to the second conductor with the fourth insulator therebetween;
   a second semiconductor including a first region, a second region, a third region, a fourth region, and a fifth region;
   a fifth insulator along the second semiconductor; and
   a third semiconductor along the fifth insulator,
   wherein:
   the first region of the second semiconductor is adjacent to the first insulator with the fourth insulator therebetween,
   the second region of the second semiconductor is adjacent to the first semiconductor with the fourth insulator therebetween,
   the third region of the second semiconductor is adjacent to the second insulator with the fourth insulator therebetween,
   the fourth region of the second semiconductor is adjacent to the third conductor, and
   the fifth region of the second semiconductor is adjacent to the third insulator with the fourth insulator therebetween.

3. A semiconductor device comprising:
   a first conductor;
   a first insulator over the first conductor;
   a second conductor over the first insulator;
   a second insulator over the second conductor;
   a third conductor over the second insulator;
   a third insulator along a side surface of the first conductor, part of a top surface of the first conductor, a side surface of the first insulator, part of a top surface of the first insulator, a side surface of the second conductor, part of a bottom surface of the second insulator, a side surface of the second insulator, part of a bottom surface of the third conductor, and a side surface of the third conductor;

a fourth conductor adjacent to the first insulator, the second conductor, and the second insulator with the third insulator therebetween;

a first semiconductor including a first region, a second region, and a third region;

a fourth insulator along the first semiconductor; and a second semiconductor along the fourth insulator, wherein:

the first region of the first semiconductor is adjacent to the first conductor with the third insulator therebetween, the second region of the first semiconductor is adjacent to the fourth conductor, and the third region of the first semiconductor is adjacent to the third conductor with the third insulator therebetween.

4. The semiconductor device according to claim 1, wherein the first semiconductor includes a metal oxide.

5. The semiconductor device according to claim 1, wherein the second semiconductor includes a metal oxide.

6. The semiconductor device according to claim 4, wherein the second semiconductor includes a metal oxide.

7. The semiconductor device according to claim 1, wherein the second semiconductor includes silicon.

8. The semiconductor device according to claim 4, wherein the second semiconductor includes silicon.

9. A memory device comprising:
the semiconductor device according to claim 1, and
a peripheral circuit.

10. An electronic device comprising:
the memory device according to claim 9, and
a housing.

11. The semiconductor device according to claim 2, wherein the first semiconductor includes a metal oxide.

12. The semiconductor device according to claim 2, wherein the second semiconductor includes a metal oxide.

13. The semiconductor device according to claim 11, wherein the second semiconductor includes a metal oxide.

14. The semiconductor device according to claim 2, wherein the second semiconductor includes silicon.

15. The semiconductor device according to claim 11, wherein the second semiconductor includes silicon.

16. A memory device comprising:
the semiconductor device according to claim 2, and
a peripheral circuit.

17. An electronic device comprising:
the memory device according to claim 16, and
a housing.

18. The semiconductor device according to claim 3, wherein the first semiconductor includes a metal oxide.

19. The semiconductor device according to claim 3, wherein the second semiconductor includes a metal oxide.

20. The semiconductor device according to claim 18, wherein the second semiconductor includes a metal oxide.

21. The semiconductor device according to claim 3, wherein the second semiconductor includes silicon.

22. The semiconductor device according to claim 18, wherein the second semiconductor includes silicon.

23. A memory device comprising:
the semiconductor device according to claim 3, and
a peripheral circuit.

24. An electronic device comprising:
the memory device according to claim 23, and
a housing.

25. The semiconductor device according to claim 1, further comprising:
a sixth insulator; and
a fourth conductor,
wherein:
the sixth insulator is along the second semiconductor, and
the fourth conductor is along the sixth insulator.

26. The semiconductor device according to claim 2, further comprising:
a sixth insulator; and
a fourth conductor,
wherein:
the sixth insulator is along the third semiconductor, and
the fourth conductor is along the sixth insulator.

27. The semiconductor device according to claim 3, further comprising:
a fifth insulator; and
a fifth conductor,
wherein:
the fifth insulator is along the second semiconductor, and
the fifth conductor is along the fifth insulator.

* * * * *